United States Patent
Zhang et al.

(10) Patent No.: US 12,136,932 B2
(45) Date of Patent: Nov. 5, 2024

(54) ENCODING METHOD AND APPARATUS, DECODING METHOD AND APPARATUS, AND DEVICE

(71) Applicant: HUAWEI TECHNOLOGIES CO., LTD., Shenzhen (CN)

(72) Inventors: Huazi Zhang, Hangzhou (CN); Jiajie Tong, Hangzhou (CN); Xianbin Wang, Hangzhou (CN); Shengchen Dai, Hangzhou (CN); Rong Li, Hangzhou (CN); Jun Wang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/969,736

(22) Filed: Oct. 20, 2022

(65) Prior Publication Data
US 2023/0058149 A1 Feb. 23, 2023

Related U.S. Application Data

(63) Continuation of application No. PCT/CN2021/086960, filed on Apr. 13, 2021.

(30) Foreign Application Priority Data

Apr. 22, 2020 (CN) .......................... 202010323605.X

(51) Int. Cl.
H03M 13/11 (2006.01)

(52) U.S. Cl.
CPC ...... *H03M 13/118* (2013.01); *H03M 13/1125* (2013.01); *H03M 13/1137* (2013.01)

(58) Field of Classification Search
CPC .......... H03M 13/118; H03M 13/1125; H03M 13/1137; H03M 13/033; H03M 13/2906; H03M 13/13; H03M 13/09
(Continued)

(56) References Cited

U.S. PATENT DOCUMENTS

2016/0182187 A1* 6/2016 Kim .................. H03M 13/6525
714/807
2017/0364399 A1* 12/2017 Shi ...................... G06F 11/1482
(Continued)

FOREIGN PATENT DOCUMENTS

| EP | 4156579 A1 | 3/2023 |
|---|---|---|
| WO | 2018229064 A1 | 12/2018 |
| WO | 2019026981 A3 | 3/2019 |

OTHER PUBLICATIONS

Wu Xiaowei et al: "Partially Information Coupled Polar Codes", IEEE Access, vol. 6, Sep. 24, 2018 (Sep. 24, 2018),—Nov. 19, 2018.*

(Continued)

*Primary Examiner* — Albert Decady
*Assistant Examiner* — Osman M Alshack
(74) *Attorney, Agent, or Firm* — HAUPTMAN HAM, LLP

(57) ABSTRACT

An encoding method and apparatus, a decoding method and apparatus, and a device are provided. The encoding method includes obtaining K to-be-encoded bits (S301), where K is a positive integer; determining a first generator matrix, where the first generator matrix includes at least two sub-blocks distributed based on a preset position relationship, and the sub-block includes a plurality of first generator matrix cores (S302); generating a second generator matrix based on the first generator matrix, where the second generator matrix includes T sub-blocks, and a position relationship between two adjacent sub-blocks of the T sub-blocks is determined based on the preset position relationship (S303), where T is a positive integer; and polar encoding the K to-be-encoded bits based on the second generator matrix (S304), to obtain encoded bits. This reduces encoding/decoding complexity.

17 Claims, 29 Drawing Sheets

(58) Field of Classification Search
USPC .................................................. 714/758, 776
See application file for complete search history.

(56) References Cited

U.S. PATENT DOCUMENTS

| | | | | |
|---|---|---|---|---|
| 2018/0026663 | A1* | 1/2018 | Wu ..................... | H03M 13/618 |
| | | | | 714/776 |
| 2019/0068316 | A1* | 2/2019 | Zhang ................... | H04L 1/0009 |
| 2019/0199480 | A1* | 6/2019 | Kim ....................... | H03M 13/13 |
| 2019/0245650 | A1* | 8/2019 | Hui ....................... | H03M 13/23 |
| 2020/0220559 | A1* | 7/2020 | Maunder .............. | H03M 13/611 |
| 2021/0099213 | A1* | 4/2021 | Chen ..................... | H04L 1/0009 |
| 2021/0281279 | A1* | 9/2021 | Jang ................. | H03M 13/6362 |

OTHER PUBLICATIONS

Xiaowei Wu et al.,"Partially Information Coupled Polar Codes", Received Aug. 1, 2018, accepted Sep. 5, 2018, date of publication Sep. 24, 2018,total:14pages.*
Kai-Hsin Wang et al.,"Improving Polar Codes by Spatial Coupling",ISITA2018, Singapore, Oct. 28-31, 2018, total:5pages.
Chulong Liang et al.,Spatial Coupling of Generator Matrices:A General,Approach to Design Good Codes at a Target BER,total:9pages.
Extended European Search Report issued in corresponding European Application No. 21791667.5, dated May 26, 2023, pp. 1-17.
Japanese Office Action issued in corresponding Japanese Application No. 2022-564458, dated Mar. 4, 2024, pp. 1-9.

* cited by examiner

Second generator matrix

Third generator matrix

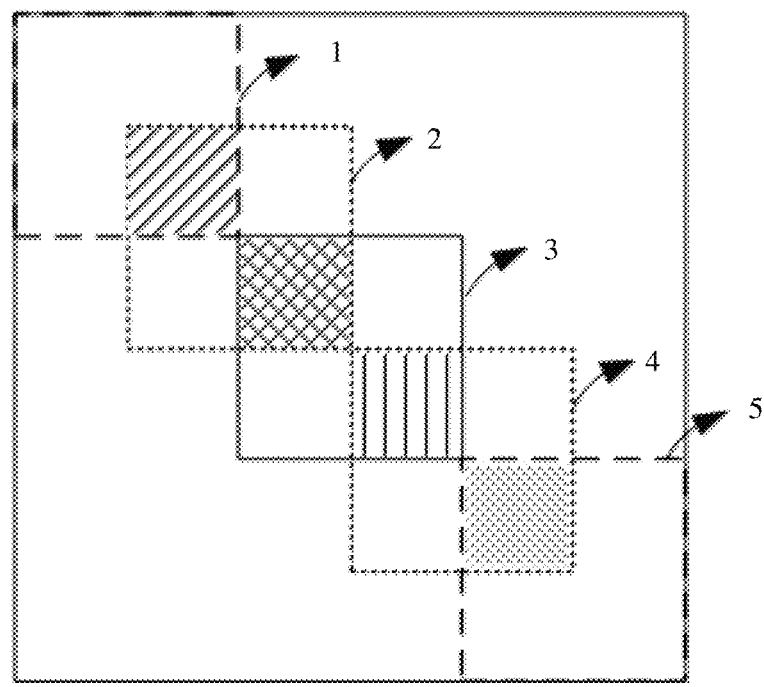

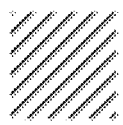 Second matrix block of the 1st first generator matrix
First matrix block of the 2nd first generator matrix

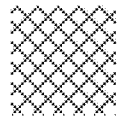 Second matrix block of the 2nd first generator matrix
First matrix block of the 3rd first generator matrix

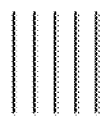 Second matrix block of the 3rd first generator matrix
First matrix block of the 4th first generator matrix

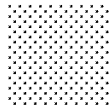 Second matrix block of the 4th first generator matrix
First matrix block of the 5th first generator matrix

FIG. 13

ENCODING METHOD AND APPARATUS, DECODING METHOD AND APPARATUS, AND DEVICE

CROSS-REFERENCE TO RELATED APPLICATIONS

This application is a continuation of International Application No. PCT/CN2021/086960, filed on Apr. 13, 2021, which claims priority to Chinese Patent Application No. 202010323605.X, filed on Apr. 22, 2020. The disclosures of the aforementioned applications are hereby incorporated in entirety by reference.

BACKGROUND

In the field of communication technologies, a communication device (for example, a terminal device or a base station) performs channel encoding and decoding by using a polar code (Polar code).

In response to decoding being performed by using a polar code, encoding/decoding (encoding and/or decoding) complexity is usually related to a code length. A larger code length indicates higher encoding/decoding complexity. In response to the code length being very large (for example, the code length is greater than 16384), complexity of performing encoding/decoding by using the polar code is very high, resulting in poor encoding/decoding performance.

SUMMARY

Some embodiments provide an encoding method and apparatus, a decoding method and apparatus, and a device, to reduce encoding/decoding complexity.

Some embodiments provide an encoding method. The method includes: obtaining K to-be-encoded bits, where K is a positive integer; determining a first generator matrix, where the first generator matrix includes at least two sub-blocks distributed based on a preset position relationship, and the sub-block includes a plurality of first generator matrix cores; generating a second generator matrix based on the first generator matrix, where the second generator matrix includes T sub-blocks, and a position relationship between two adjacent sub-blocks of the T sub-blocks is determined based on the preset position relationship, where T is a positive integer; and polar encoding the K to-be-encoded bits based on the second generator matrix, to obtain encoded bits.

In some embodiments, in response to the K to-be-encoded bits to be encoded, the first generator matrix is first determined, then the second generator matrix is generated based on the first generator matrix, and the K to-be-encoded bits are polar encoded based on the second generator matrix. The first generator matrix includes the at least two sub-blocks distributed based on the preset position relationship, each sub-block includes a plurality of first generator matrix cores, the second generator matrix includes the T sub-blocks, and the position relationship between two adjacent sub-blocks of the T sub-blocks is determined based on the preset position relationship. Therefore, in some embodiments, the second generator matrix includes a plurality of sub-blocks arranged according to the foregoing preset position relationship, and each sub-block includes a plurality of first generator matrix cores. Therefore, polar encoding the K to-be-encoded bits based on the second generator matrix is equivalent to: polar encoding a plurality of short codes, and coupling the plurality of short codes to obtain an encoding result. This reduces encoding complexity.

In some embodiments, the position relationship between two adjacent sub-blocks of the T sub-blocks is the same as the preset position relationship.

In some embodiments, the position relationship between two adjacent sub-blocks of the T sub-blocks in the second generator matrix is the same as the preset position relationship, so that short codes have a same coupling manner, and encoding complexity is low.

In some embodiments, an overlapping portion exists in the at least two sub-blocks.

In some embodiments, because an overlapping portion exists between two sub-blocks, different short codes are coupled.

In some embodiments, first generator matrix cores are included on a first diagonal of the sub-block.

In some embodiments, the plurality of first generator matrix cores in the sub-block are distributed in a lower triangular form.

In some embodiments, distribution of the first generator matrix cores in the sub-block is the same as distribution of first elements in a second generator matrix core, a quantity of elements included in the second generator matrix core is the same as a quantity of sub-matrices included in the sub-block, and a sub-matrix included in the sub-block is the first generator matrix core or a zero matrix.

In some embodiments, because distribution of the first generator matrix cores in the sub-block is the same as distribution of the first elements in the second generator matrix core, a coupling manner of short codes is similar to that in an existing encoding scheme, and therefore encoding complexity is low.

In some embodiments, the first generator matrix includes two sub-blocks.

In some embodiments, the second generator matrix includes a small quantity of sub-blocks, and the second generator matrix is easy to construct.

In some embodiments, the quantity of sub-matrices included in the sub-block is 2*2, and the sub-matrix included in the sub-block is the first generator matrix core or the zero matrix.

In some embodiments, the first generator matrix includes a first sub-block and a second sub-block, and a first sub-matrix in the first sub-block overlaps a second sub-matrix in the second sub-block; and coordinates of the first sub-matrix in the first sub-block are (2, 2), and coordinates of the second sub-matrix in the second sub-block are (1, 1).

In some embodiments, the second generator matrix is symmetrical in a direction of a secondary diagonal of the second generator matrix, and therefore encoding complexity is low, and decoding complexity is also low.

In some embodiments, the quantity of sub-matrices included in the sub-block is 4*4, and the sub-matrix included in the sub-block is the first generator matrix core or the zero matrix.

In some embodiments, the first generator matrix includes a first sub-block and a second sub-block, and four first sub-matrices in the first sub-block overlap four second sub-matrices in the second sub-block. Coordinates of the four first sub-matrices in the first sub-block are (3, 3), (3, 4), (4, 3), and (4, 4); and coordinates of the four second sub-matrices in the second sub-block are (1, 1), (1, 2), (2, 1), and (2, 2).

In some embodiments, the second generator matrix is symmetrical in a direction of a secondary diagonal of the second generator matrix, and therefore encoding complexity is low, and decoding complexity is also low.

In some embodiments, the K to-be-encoded bits are information bits. The polar encoding the K to-be-encoded bits based on the second generator matrix, to obtain encoded bits includes: determining K sub-channels with highest reliability in a plurality of sub-channels corresponding to the K to-be-encoded bits; determining positions of the K to-be-encoded bits based on the K sub-channels with the highest reliability; determining a to-be-encoded sequence based on the positions of the K to-be-encoded bits, where the to-be-encoded sequence includes the K to-be-encoded bits and frozen bits; and polar encoding the to-be-encoded sequence based on the second generator matrix, to obtain the encoded bits.

In some embodiments, a sub-channel with highest reliability is selected to transmit information bits, and therefore encoding performance is high.

In some embodiments, the plurality of sub-channels include P groups of sub-channels, where P is a positive integer. The determining K sub-channels with highest reliability in a plurality of sub-channels corresponding to the K to-be-encoded bits includes: determining $X_i$ first sub-channels from an $i^{th}$ group of sub-channels based on reliability of the $i^{th}$ group of sub-channels, where the $X_i$ first sub-channels are $X_i$ sub-channels with highest reliability in the $i^{th}$ group of sub-channels, i is an integer, $1 \le i \le P$, $X_i$ is a positive integer, and $\Sigma_{i=1}^{i=P} X_i = K$. The K sub-channels with the highest reliability include the first sub-channels.

Some embodiments provide a decoding method. The method includes: receiving polar encoded bit information; and polar decoding the bit information based on a second generator matrix, to obtain polar decoded bits. The second generator matrix is generated based on a first generator matrix, the first generator matrix includes at least two sub-blocks distributed based on a preset position relationship, the sub-block includes a plurality of first generator matrix cores, the second generator matrix includes T sub-blocks, and a position relationship between two adjacent sub-blocks of the T sub-blocks is determined based on the preset position relationship, where T is a positive integer.

In the foregoing decoding process, the first generator matrix includes the at least two sub-blocks distributed based on the preset position relationship, each sub-block includes a plurality of first generator matrix cores, the second generator matrix includes the T sub-blocks, and the position relationship between two adjacent sub-blocks of the T sub-blocks is determined based on the preset position relationship. Therefore, in some embodiments the second generator matrix includes a plurality of sub-blocks arranged according to the foregoing preset position relationship, and each sub-block includes a plurality of first generator matrix cores. Therefore, polar decoding the bit information based on the second generator matrix is equivalent to: decoupling a plurality of short codes, and decoding the decoupled short codes. Because complexity of decoding the short codes, decoding complexity is low.

In some embodiments, the position relationship between two adjacent sub-blocks of the T sub-blocks is the same as the preset position relationship.

In some embodiments, the position relationship between two adjacent sub-blocks of the T sub-blocks in the second generator matrix is the same as the preset position relationship, so that short codes have a same coupling manner, and decoding complexity is low.

In some embodiments, an overlapping portion exists in the at least two sub-blocks.

In some embodiments, because an overlapping portion exists between two sub-blocks, different short codes are coupled.

In some embodiments, first generator matrix cores are included on a first diagonal of the sub-block.

In some embodiments, the plurality of first generator matrix cores in the sub-block are distributed in a lower triangular form.

In some embodiments, distribution of the first generator matrix cores in the sub-block is the same as distribution of first elements in a second generator matrix core, a quantity of elements included in the second generator matrix core is the same as a quantity of sub-matrices included in the sub-block, and a sub-matrix included in the sub-block is the first generator matrix core or a zero matrix.

In some embodiments, because distribution of the first generator matrix cores in the sub-block is the same as distribution of the first elements in the second generator matrix core, a coupling manner of short codes is similar to that in an existing decoding scheme, and therefore decoding complexity is low.

In some embodiments, the first generator matrix includes two sub-blocks.

In some embodiments, the second generator matrix includes a small quantity of sub-blocks, and the second generator matrix is easy to construct.

In some embodiments, the quantity of sub-matrices included in the sub-block is 2*2, and the sub-matrix included in the sub-block is the first generator matrix core or the zero matrix.

In some embodiments, the first generator matrix includes a first sub-block and a second sub-block, and a first sub-matrix in the first sub-block overlaps a second sub-matrix in the second sub-block; and coordinates of the first sub-matrix in the first sub-block are (2, 2), and coordinates of the second sub-matrix in the second sub-block are (1, 1).

In some embodiments, the second generator matrix is symmetrical in a direction of a secondary diagonal of the second generator matrix, and therefore decoding complexity is low.

In some embodiments, the quantity of sub-matrices included in the sub-block is 4*4, and the sub-matrix included in the sub-block is the first generator matrix core or the zero matrix.

In some embodiments, the first generator matrix includes a first sub-block and a second sub-block, and four first sub-matrices in the first sub-block overlap four second sub-matrices in the second sub-block. Coordinates of the four first sub-matrices in the first sub-block are (3, 3), (3, 4), (4, 3), and (4, 4); and coordinates of the four second sub-matrices in the second sub-block are (1, 1), (1, 2), (2, 1), and (2, 2).

In some embodiments, the second generator matrix is symmetrical in a direction of a secondary diagonal of the second generator matrix, and therefore decoding complexity is low.

In some embodiments, the bit information includes N' first log-likelihood ratio LLR sequences, where N' is a positive integer.

In some embodiments, the N' first LLRs include T first LLR sequences, and the first LLR sequence includes at least two first LLRs. Polar decoding includes: determining T second LLR sequences corresponding to the T first LLR sequences, where one of the first LLR sequences corresponds to one or more groups of unencoded bits, and one of the second LLR sequences corresponds to one group of unencoded bits; and performing polar decoding based on the T second LLR sequences.

In some embodiments, the T coupled first LLR sequences are first decoupled to obtain the T decoupled second LLR sequences, and then the T decoupled second LLR sequences are decoded. Because a length of the second LLR sequence is small, complexity of decoding the second LLR sequence is low, and decoding complexity is low.

In some embodiments, the determining T second LLR sequences corresponding to the T first LLR sequences includes: determining an $i^{th}$ second LLR sequence based on an $i^{th}$ first LLR sequence and at least one of first (i−1) second LLR sequences, where i is an integer between 2 and T.

In some embodiments, in response to the $i^{th}$ second LLR sequence being determined, the first LLR sequences are decoupled based on the $i^{th}$ first LLR sequence and the at least one of the decoupled first (i−1) second LLR sequences, to obtain the $i^{th}$ second LLR sequence.

In some embodiments, a coupling degree of a code block is 2. The determining an $i^{th}$ second LLR sequence based on an $i^{th}$ first LLR sequence and at least one of first (i−1) second LLR sequences includes: determining the $i^{th}$ second LLR sequence based on the $i^{th}$ first LLR sequence and an $(i-1)^{th}$ second LLR sequence.

In some embodiments, a $1^{st}$ second LLR sequence is the same as a $1^{st}$ first LLR sequence.

In some embodiments, a coupling degree of a code block is 4. The determining an $i^{th}$ second LLR sequence based on an $i^{th}$ first LLR sequence and at least one of first (i−1) second LLR sequences includes: determining the $i^{th}$ second LLR sequence based on the $i^{th}$ first LLR sequence and an $(i-2)^{th}$ second LLR sequence, where i is an integer between 3 and T.

In some embodiments, a $1^{st}$ second LLR sequence is the same as a $1^{st}$ first LLR sequence, and a $2^{nd}$ second LLR sequence is the same as a $2^{nd}$ first LLR sequence.

In some embodiments, polar decoding is performed based on the T second LLR sequences in the following manner determining to obtain a $T^{th}$ decoding result based on a $T^{th}$ second LLR sequence; and determining an $i^{th}$ decoding result based on the $i^{th}$ second LLR sequence and at least one of an $(i+1)^{th}$ decoding result to the $T^{th}$ decoding result, where i is an integer between 1 and T−1.

In some embodiments, the second LLR sequence (short code) is decoded to obtain a decoding result, and therefore decoding complexity is low.

In some embodiments, a coupling degree of a code block is 2. The determining an $i^{th}$ decoding result based on the $i^{th}$ second LLR sequence and at least one of an $(i+1)^{th}$ decoding result to the $T^{th}$ decoding result includes: determining the $i^{th}$ decoding result based on the $(i+1)^{th}$ decoding result, an $(i+1)^{th}$ first LLR sequence, and the $i^{th}$ second LLR sequence.

Some embodiments provide an encoding method. The method includes: obtaining K to-be-encoded bits, where K is a positive integer; determining a first generator matrix, where the first generator matrix includes a first matrix block and a second matrix block, the first matrix block is located at the top-left corner of the first generator matrix, the second matrix block is located at the bottom-right corner of the first generator matrix, the first matrix block is the same as the second matrix block, and a distance between a first element in the first matrix block and a second element in the second matrix block is u in a diagonal direction of the first generator matrix, where u is an integer greater than or equal to 1; determining a second generator matrix based on an encoding length and the first generator matrix, where the second generator matrix includes T first generator matrices, the T first generator matrices are distributed along a diagonal of the second generator matrix, and a first matrix block of an $(a+1)^{th}$ first generator matrix in the T first generator matrices overlaps a second matrix block of an $a^{th}$ first generator matrix, where a is an integer greater than or equal to 1, and T is an integer greater than or equal to 2; and polar encoding the K to-be-encoded bits based on the second generator matrix, to obtain encoded bits.

In some embodiments, in response to the K to-be-encoded bits to be encoded, the first generator matrix is first determined, then the second generator matrix is generated based on the first generator matrix, and the K to-be-encoded bits are polar encoded based on the second generator matrix. Because the first generator matrix has self-similarity, and the second generator matrix includes a plurality of first matrix blocks, polar encoding the K to-be-encoded bits based on the second generator matrix is equivalent to: polar encoding a plurality of short codes, and coupling the plurality of short codes, to obtain an encoding result. This reduces encoding complexity.

In some embodiments, no overlapping element exists in the first matrix block and the second matrix block.

In some embodiments, a size of the first generator matrix is v*v, and an element in the first generator matrix satisfies $\alpha_{i,j}=\alpha_{i+u,j+u}$, where i is an integer, j is an integer, v is a positive integer, u is an integer, $1 \le i < v$, $1 \le j < v$, $1 < i+u \le v$, and $1 < j+u \le v$.

In some embodiments, in response to the first generator matrix satisfies $\alpha_{i,j}=\alpha_{i+u,j+u}$, the first generator matrix satisfies the self-similarity. Polar encoding the K to-be-encoded bits based on the second generator matrix is equivalent to: polar encoding a plurality of short codes, and coupling the plurality of short codes, to obtain an encoding result. This reduces encoding complexity.

In some embodiments, elements in the first generator matrix are symmetrical along a secondary diagonal of the first generator matrix.

In some embodiments, because the elements in the first generator matrix are symmetrical along the secondary diagonal of the first generator matrix, encoding complexity is low.

In some embodiments, T is a minimum integer that enables a first condition to be satisfied, and the first condition is that a size of the second generator matrix is greater than or equal to the encoding length.

In some embodiments, T satisfies the following relationship: $v+(T-1)*u<N' \le v+T*u$, where v is the size of the first generator matrix, N' is the encoding length, and N' is an integer greater than 1.

In some embodiments, an excessively large or small size of the second generator matrix is avoided, and therefore encoding complexity is low.

Some embodiments provide a decoding method. The method includes: receiving polar encoded bit information; and polar decoding the bit information based on a second generator matrix, to obtain polar decoded bits. The second generator matrix is generated based on a first generator matrix, the first generator matrix includes a first matrix block and a second matrix block, the first matrix block is located at the top-left corner of the first generator matrix, the second matrix block is located at the bottom-right corner of the first generator matrix, the first matrix block is the same as the second matrix block, and a distance between a first element in the first matrix block and a second element in the second matrix block is u in a diagonal direction of the first generator matrix, where u is an integer greater than or equal to 1. The second generator matrix includes T first generator matrices, the T first generator matrices are distributed along a diagonal of the second generator matrix, and a first matrix block of an $(a+1)^{th}$ first generator matrix in the T first generator matrices overlaps a second matrix block of an $a^{th}$ first generator matrix, where a is an integer greater than or equal to 1, and T is an integer greater than or equal to 2.

In some embodiments, because the first generator matrix has self-similarity, and the second generator matrix includes a plurality first matrix blocks. Therefore, polar decoding the bit information based on the second generator matrix is equivalent to: decoupling a plurality of short codes, and decoding the decoupled short codes. Because complexity of decoding the short codes, decoding complexity is low.

In some embodiments, no overlapping element exists in the first matrix block and the second matrix block.

In some embodiments, a size of the first generator matrix is v*v, and an element in the first generator matrix satisfies $\alpha_{i,j}=\alpha_{i+u,j+u}$, where i is an integer, j is an integer, v is a positive integer, u is an integer, $1 \le i < v$, $1 \le j < v$, $1 < i+u \le v$, and $1 < j+u \le v$.

In some embodiments, in response to the first generator matrix satisfies $\alpha_{i,j}=\alpha_{i+u,j+u}$, the first generator matrix satisfies the self-similarity. Polar decoding the K to-be-decoded bits based on the second generator matrix is equivalent to: polar decoding a plurality of short codes, and coupling the plurality of short codes, to obtain a decoding result. This reduces decoding complexity.

In some embodiments, elements in the first generator matrix are symmetrical along a secondary diagonal of the first generator matrix.

In some embodiments, because the elements in the first generator matrix are symmetrical along the secondary diagonal of the first generator matrix, decoding complexity is low.

In some embodiments, T is a minimum integer that enables a first condition to be satisfied, and the first condition is that a size of the second generator matrix is greater than or equal to a decoding length.

In some embodiments, T satisfies the following relationship: $v+(T-1)*u<N' \le v+T*u$, v is the size of the first generator matrix, N' is the decoding length, and N' is an integer greater than 1.

In some embodiments, an excessively large or small size of the second generator matrix is avoided, and therefore decoding complexity is low.

In some embodiments, the bit information includes N' first log-likelihood ratio LLR sequences, where N' is a positive integer.

In some embodiments, the N' first LLRs include T first LLR sequences, and the first LLR sequence includes at least two first LLRs. Polar decoding includes: determining T second LLR sequences corresponding to the T first LLR sequences, where one of the first LLR sequences corresponds to one or more groups of unencoded bits, and one of the second LLR sequences corresponds to one group of unencoded bits; and performing polar decoding based on the T second LLR sequences.

In some embodiments, the T coupled first LLR sequences are first decoupled to obtain the T decoupled second LLR sequences, and then the T decoupled second LLR sequences are decoded. Because a length of the second LLR sequence is small, complexity of decoding the second LLR sequence is low, and decoding complexity is low.

In some embodiments, the determining T second LLR sequences corresponding to the T first LLR sequences includes: determining an $i^{th}$ second LLR sequence based on an $i^{th}$ first LLR sequence and at least one of first (i-1) second LLR sequences, where i is an integer between 2 and T.

In some embodiments, in response to the $i^{th}$ second LLR sequence being determined, the first LLR sequences are decoupled based on the $i^{th}$ first LLR sequence and the at least one of the decoupled first (i-1) second LLR sequences, to obtain the $i^{th}$ second LLR sequence.

In some embodiments, a coupling degree of a code block is 2. The determining an $i^{th}$ second LLR sequence based on an $i^{th}$ first LLR sequence and at least one of first (i-1) second LLR sequences includes: determining the $i^{th}$ second LLR sequence based on the $i^{th}$ first LLR sequence and an $(i-1)^{th}$ second LLR sequence.

In some embodiments, a $1^{st}$ second LLR sequence is the same as a $1^{st}$ first LLR sequence.

In some embodiments, a coupling degree of a code block is 4. The determining an $i^{th}$ second LLR sequence based on an $i^{th}$ first LLR sequence and at least one of first (i-1) second LLR sequences includes: determining the $i^{th}$ second LLR sequence based on the $i^{th}$ first LLR sequence and an $(i-2)^{th}$ second LLR sequence, where i is an integer between 3 and T.

In some embodiments, a $1^{st}$ second LLR sequence is the same as a $1^{st}$ first LLR sequence, and a $2^{nd}$ second LLR sequence is the same as a $2^{nd}$ first LLR sequence.

In some embodiments, polar decoding is performed based on the T second LLR sequences in the following manner determining to obtain a $T^{th}$ decoding result based on a $T^{th}$ second LLR sequence; and determining an $i^{th}$ decoding result based on the $i^{th}$ second LLR sequence and at least one of an $(i+1)^{th}$ decoding result to the $T^{th}$ decoding result, where i is an integer between 1 and T-1.

In some embodiments, the second LLR sequence (short code) is decoded to obtain a decoding result, and therefore decoding complexity is low.

In some embodiments, a coupling degree of a code block is 2. The determining an $i^{th}$ decoding result based on the $i^{th}$ second LLR sequence and at least one of an $(i+1)^{th}$ decoding result to the $T^{th}$ decoding result includes: determining the $i^{th}$ decoding result based on the $(i+1)^{th}$ decoding result, an $(i+1)^{th}$ first LLR sequence, and the $i^{th}$ second LLR sequence.

Some embodiments provide an encoding apparatus, including an obtaining module, a determining module, a generation module, and an encoding module.

The obtaining module is configured to obtain K to-be-encoded bits, where K is a positive integer.

The determining module is configured to determine a first generator matrix. The first generator matrix includes at least two sub-blocks distributed based on a preset position relationship, and the sub-block includes a plurality of first generator matrix cores.

The generation module is configured to generate a second generator matrix based on the first generator matrix. The second generator matrix includes T sub-blocks, and a position relationship between two adjacent sub-blocks of the T sub-blocks is determined based on the preset position relationship, where T is a positive integer.

The encoding module is configured to polar encode the K to-be-encoded bits based on the second generator matrix, to obtain encoded bits.

In some embodiments, the position relationship between two adjacent sub-blocks of the T sub-blocks is the same as the preset position relationship.

In some embodiments, an overlapping portion exists in the at least two sub-blocks.

In some embodiments, a first diagonal of the sub-block includes the first generator matrix cores.

In some embodiments, the plurality of first generator matrix cores in the sub-block are distributed in a lower triangular form.

In some embodiments, distribution of the first generator matrix cores in the sub-block is the same as distribution of first elements in a second generator matrix core, a quantity of elements included in the second generator matrix core is the same as a quantity of sub-matrices included in the sub-block, and a sub-matrix included in the sub-block is the first generator matrix core or a zero matrix.

In some embodiments, the first generator matrix includes two sub-blocks.

In some embodiments, the quantity of sub-matrices included in the sub-block is 2*2, and the sub-matrix included in the sub-block is the first generator matrix core or the zero matrix.

In some embodiments, the first generator matrix includes a first sub-block and a second sub-block, and a first sub-matrix in the first sub-block overlaps a second sub-matrix in the second sub-block; and coordinates of the first sub-matrix in the first sub-block are (2, 2), and coordinates of the second sub-matrix in the second sub-block are (1, 1).

In some embodiments, the quantity of sub-matrices included in the sub-block is 4*4, and the sub-matrix included in the sub-block is the first generator matrix core or the zero matrix.

In some embodiments, the first generator matrix includes a first sub-block and a second sub-block, and four first sub-matrices in the first sub-block overlap four second sub-matrices in the second sub-block.

Coordinates of the four first sub-matrices in the first sub-block are (3, 3), (3, 4), (4, 3), and (4, 4); and coordinates of the four second sub-matrices in the second sub-block are (1, 1), (1, 2), (2, 1), and (2, 2).

In some embodiments, the K to-be-encoded bits are information bits. The encoding module is configured to:
  determine K sub-channels with highest reliability in a plurality of sub-channels corresponding to the K to-be-encoded bits;
  determine positions of the K to-be-encoded bits based on the K sub-channels with the highest reliability;
  determine a to-be-encoded sequence based on the positions of the K to-be-encoded bits, where the to-be-encoded sequence comprises the K to-be-encoded bits and frozen bits; and
  polar encode the to-be-encoded sequence based on the second generator matrix, to obtain the encoded bits.

In some embodiments, the plurality of sub-channels include P groups of sub-channels, where P is a positive integer. The encoding module is configured to:
  determine $X_i$ first sub-channels from an $i^{th}$ group of sub-channels based on reliability of the $i^{th}$ group of sub-channels, where the $X_i$ first sub-channels are $X_i$ sub-channels with highest reliability in the $i^{th}$ group of sub-channels, i is an integer, $1 \leq i \leq P$, $X_i$ is a positive integer, and $\Sigma_{i=1}^{i=P} X_i = K$.

The K sub-channels with the highest reliability include the first sub-channels.

Some embodiments provide a decoding apparatus, including a receiving module and a decoding module.

The receiving module is configured to receive polar encoded bit information.

The decoding module is configured to polar decode the bit information based on a second generator matrix, to obtain polar decoded bits.

The second generator matrix is generated based on a first generator matrix, the first generator matrix includes at least two sub-blocks distributed based on a preset position relationship, the sub-block includes a plurality of first generator matrix cores, the second generator matrix includes T sub-blocks, and a position relationship between two adjacent sub-blocks of the T sub-blocks is determined based on the preset position relationship, where T is a positive integer.

In some embodiments, the position relationship between two adjacent sub-blocks of the T sub-blocks is the same as the preset position relationship.

In some embodiments, an overlapping portion exists in the at least two sub-blocks.

In some embodiments, a first diagonal of the sub-block includes the first generator matrix cores.

In some embodiments, the plurality of first generator matrix cores in the sub-block are distributed in a lower triangular form.

In some embodiments, distribution of the first generator matrix cores in the sub-block is the same as distribution of first elements in a second generator matrix core, a quantity of elements included in the second generator matrix core is the same as a quantity of elements included in the sub-block, and an element included in the sub-block is the first generator matrix core or a zero matrix.

In some embodiments, the first generator matrix includes two sub-blocks.

In some embodiments, the quantity of elements included in the sub-block is 2*2, and the element included in the sub-block is the first generator matrix core or the zero matrix.

In some embodiments, the first generator matrix includes a first sub-block and a second sub-block, and a first element in the first sub-block overlaps a second element in the second sub-block; and
  coordinates of the first element in the first sub-block are (2, 2), and coordinates of the second element in the second sub-block are (1, 1).

In some embodiments, the quantity of elements included in the sub-block is 4*4, and the element included in the sub-block is the first generator matrix core or the zero matrix.

In some embodiments, the first generator matrix includes a first sub-block and a second sub-block, and four first elements in the first sub-block overlap four second elements in the second sub-block.

Coordinates of the four first elements in the first sub-block are (3, 3), (3, 4), (4, 3), and (4, 4); and coordinates of the four second elements in the second sub-block are (1, 1), (1, 2), (2, 1), and (2, 2).

In some embodiments, the bit information includes N' first log-likelihood ratio LLR sequences, where N' is a positive integer.

In some embodiments, the N' first LLRs include T first LLR sequences, and the first LLR sequence includes at least two first LLRs. The decoding module is configured to:
  determine T second LLR sequences corresponding to the T first LLR sequences, where one of the first LLR sequences corresponds to one or more groups of unencoded bits, and one of the second LLR sequences corresponds to one group of unencoded bits; and
  perform polar decoding based on the T second LLR sequences.

In some embodiments, the decoding module is configured to:
  determine an $i^{th}$ second LLR sequence based on an $i^{th}$ first LLR sequence and at least one of first (i−1) second LLR sequences, where i is an integer between 2 and T.

In some embodiments, a coupling degree of a code block is 2. The decoding module is configured to:
determine the $i^{th}$ second LLR sequence based on the $i^{th}$ first LLR sequence and an $(i-1)^{th}$ second LLR sequence.

In some embodiments, a $1^{st}$ second LLR sequence is the same as a $1^{st}$ first LLR sequence.

In some embodiments, a coupling degree of a code block is 4. The decoding module is configured to:
determine the $i^{th}$ second LLR sequence based on the $i^{th}$ first LLR sequence and an $(i-2)^{th}$ second LLR sequence, where i is an integer between 3 and T.

In some embodiments, a $1^{st}$ second LLR sequence is the same as a $1^{st}$ first LLR sequence; and a $2^{nd}$ second LLR sequence is the same as a $2^{nd}$ first LLR sequence.

In some embodiments, the decoding module is configured to:
determine to obtain a $T^{th}$ decoding result based on a $T^{th}$ second LLR sequence; and
determine an $i^{th}$ decoding result based on the $i^{th}$ second LLR sequence and at least one of an $(i+1)^{th}$ decoding result to the $T^{th}$ decoding result, where i is an integer between 1 and T-1.

In some embodiments, a coupling degree of a code block is 2. The decoding module is configured to:
determine the $i^{th}$ decoding result based on the $(i+1)^{th}$ decoding result, an $(i+1)^{th}$ first LLR sequence, and the $i^{th}$ second LLR sequence.

Some embodiments provide an encoding apparatus, including an obtaining module, a determining module, a generation module, and an encoding module.

The obtaining module is configured to obtain K to-be-encoded bits, where K is a positive integer.

The determining module is configured to determine a first generator matrix. The first generator matrix includes a first matrix block and a second matrix block, the first matrix block is located at the top-left corner of the first generator matrix, the second matrix block is located at the bottom-right corner of the first generator matrix, the first matrix block is the same as the second matrix block, and a distance between a first element in the first matrix block and a second element in the second matrix block is u in a diagonal direction of the first generator matrix, where u is an integer greater than or equal to 1.

The generation module is configured to generate a second generator matrix based on an encoding length and the first generator matrix. The second generator matrix includes T first generator matrices, the T first generator matrices are distributed along a diagonal of the second generator matrix, and a first matrix block of an $(a+1)^{th}$ first generator matrix in the T first generator matrices overlaps a second matrix block of an $a^{th}$ first generator matrix, where a is an integer greater than or equal to 1, and T is an integer greater than or equal to 2.

The encoding module is configured to polar encode the K to-be-encoded bits based on the second generator matrix, to obtain encoded bits.

In some embodiments, no overlapping element exists in the first matrix block and the second matrix block.

In some embodiments, a size of the first generator matrix is v*v, and an element in the first generator matrix satisfies $\alpha_{i,j}=\alpha_{i+u,j+u}$, where i is an integer, j is an integer, v is a positive integer, u is an integer, $1 \le i < v$, $1 \le j < v$, $1 < i+u \le v$, and $1 < j+u \le v$.

In some embodiments, elements in the first generator matrix are symmetrical along a secondary diagonal of the first generator matrix.

In some embodiments, T is a minimum integer that enables a first condition to be satisfied, and the first condition is that a size of the second generator matrix is greater than or equal to the encoding length.

In some embodiments, T satisfies the following relationship:

$$v+(T-1)*u<N'\le v+T*u, \text{ where}$$

v is the size of the first generator matrix, N' is the encoding length, and N' is an integer greater than 1.

Some embodiments provide a decoding apparatus, including a receiving module and a decoding module.

The receiving module is configured to receive polar encoded bit information.

The decoding module is configured to polar decode the bit information based on a second generator matrix, to obtain polar decoded bits. The second generator matrix is generated based on a first generator matrix.

The first generator matrix includes a first matrix block and a second matrix block, the first matrix block is located at the top-left corner of the first generator matrix, the second matrix block is located at the bottom-right corner of the first generator matrix, the first matrix block is the same as the second matrix block, and a distance between a first element in the first matrix block and a second element in the second matrix block is u in a diagonal direction of the first generator matrix, where u is an integer greater than or equal to 1.

The second generator matrix includes T first generator matrices, the T first generator matrices are distributed along a diagonal of the second generator matrix, and a first matrix block of an $(a+1)^{th}$ first generator matrix in the T first generator matrices overlaps a second matrix block of an $a^{th}$ first generator matrix, where a is an integer greater than or equal to 1, and T is an integer greater than or equal to 2.

In some embodiments, no overlapping element exists in the first matrix block and the second matrix block.

In some embodiments, a size of the first generator matrix is v*v, and an element in the first generator matrix satisfies $\alpha_{i,j}=\alpha_{i+u,j+u}$, where i is an integer, j is an integer, v is a positive integer, u is an integer, $1 \le i < v$, $1 \le j < v$, $1 < i+u \le v$, and $1 < j+u \le v$.

In some embodiments, elements in the first generator matrix are symmetrical along a secondary diagonal of the first generator matrix.

In some embodiments, T is a minimum integer that enables a first condition to be satisfied, and the first condition is that a size of the second generator matrix is greater than or equal to the encoding length.

In some embodiments, T satisfies the following relationship:

$$v+(T-1)*u<N'\le v+T*u, \text{ where}$$

v is the size of the first generator matrix, N' is the encoding length, and N' is an integer greater than 1.

In some embodiments, the bit information includes N' first log-likelihood ratio LLR sequences, where N' is a positive integer.

In some embodiments, the N' first LLRs include T first LLR sequences, and the first LLR sequence includes at least two first LLRs. The decoding module is configured to:
determine T second LLR sequences corresponding to the T first LLR sequences, where one of the first LLR sequences corresponds to one or more groups of unencoded bits, and one of the second LLR sequences corresponds to one group of unencoded bits; and
perform polar decoding based on the T second LLR sequences.

In some embodiments, the decoding module is configured to:

determine an $i^{th}$ second LLR sequence based on an $i^{th}$ first LLR sequence and at least one of first (i−1) second LLR sequences, where i is an integer between 2 and T.

In some embodiments, a coupling degree of a code block is 2. The decoding module is configured to:

determine the $i^{th}$ second LLR sequence based on the $i^{th}$ first LLR sequence and an $(i-1)^{th}$ second LLR sequence.

In some embodiments, a $1^{st}$ second LLR sequence is the same as a $1^{st}$ first LLR sequence.

In some embodiments, a coupling degree of a code block is 4. The decoding module is configured to:

determine the $i^{th}$ second LLR sequence based on the $i^{th}$ first LLR sequence and an $(i-2)^{th}$ second LLR sequence, where i is an integer between 3 and T.

In some embodiments, a $1^{st}$ second LLR sequence is the same as a $1^{st}$ first LLR sequence; and a $2^{nd}$ second LLR sequence is the same as a $2^{nd}$ first LLR sequence.

In some embodiments, the decoding module is configured to:

determine to obtain a $T^{th}$ decoding result based on a $T^{th}$ second LLR sequence; and determine an $i^{th}$ decoding result based on the $i^{th}$ second LLR sequence and at least one of an $(i+1)^{th}$ decoding result to the $T^{th}$ decoding result, where i is an integer between 1 and T−1.

In some embodiments, a coupling degree of a code block is 2. The decoding module is configured to:

determine the $i^{th}$ decoding result based on the $(i+1)^{th}$ decoding result, an $(i+1)^{th}$ first LLR sequence, and the $i^{th}$ second LLR sequence.

Some embodiments provide an encoding apparatus, including a memory, a processor, and a computer program. The computer program is stored in the memory, and the processor runs the computer program to perform the encoding method according to any implementation of the embodiments.

Some embodiments provide an encoding apparatus, including a memory, a processor, and a computer program. The computer program is stored in the memory, and the processor runs the computer program to perform the decoding method according to any implementation of the embodiments.

Some embodiments provide an encoding apparatus, including a memory, a processor, and a computer program. The computer program is stored in the memory, and the processor runs the computer program to perform the encoding method according to any implementation of the embodiments.

Some embodiments provide an encoding apparatus, including a memory, a processor, and a computer program. The computer program is stored in the memory, and the processor runs the computer program to perform the decoding method according to any implementation of the embodiments.

Some embodiments provide a storage medium. The storage medium includes a computer program, and the computer program is used to perform the encoding method according to any implementation of the embodiments.

Some embodiments provide a storage medium. The storage medium includes a computer program, and the computer program is used to perform the decoding method according to any implementation of the embodiments.

Some embodiments provide a storage medium. The storage medium includes a computer program, and the computer program is used to perform the encoding method according to any implementation of the embodiments.

Some embodiments provide a storage medium. The storage medium includes a computer program, and the computer program is used to perform the decoding method according to any implementation of the embodiments.

Some embodiments provide an encoding apparatus. The encoding apparatus includes an input interface and a logic circuit.

The input interface is configured to obtain K to-be-encoded bits, where K is a positive integer.

The logic circuit is configured to: determine a first generator matrix, where the first generator matrix includes at least two sub-blocks distributed based on a preset position relationship, and the sub-block includes a plurality of first generator matrix cores; generate a second generator matrix based on the first generator matrix, where the second generator matrix includes T sub-blocks, and a position relationship between two adjacent sub-blocks of the T sub-blocks is determined based on the preset position relationship, where T is a positive integer; and polar encode the K to-be-encoded bits based on the second generator matrix, to obtain encoded bits.

In some embodiments, the logic circuit further performs the encoding method according to any implementation of the embodiments.

Some embodiments provide a decoding apparatus. The decoding apparatus includes an input interface and a logic circuit.

The input interface is configured to receive polar encoded bit information.

The logic circuit is configured to polar decode the bit information based on a second generator matrix, to obtain polar decoded bits. The second generator matrix is generated based on a first generator matrix, the first generator matrix includes at least two sub-blocks distributed based on a preset position relationship, the sub-block includes a plurality of first generator matrix cores, the second generator matrix includes T sub-blocks, and a position relationship between two adjacent sub-blocks of the T sub-blocks is determined based on the preset position relationship, where T is a positive integer.

In some embodiments, the logic circuit further performs the decoding method according to any implementation of the embodiments.

Some embodiments provide a schematic diagram of a structure of an encoding apparatus. The encoding apparatus includes an input interface and a logic circuit.

The input interface is configured to obtain K to-be-encoded bits, where K is a positive integer.

The logic circuit is configured to: determine a first generator matrix, where the first generator matrix includes a first matrix block and a second matrix block, the first matrix block is located at the top-left corner of the first generator matrix, the second matrix block is located at the bottom-right corner of the first generator matrix, the first matrix block is the same as the second matrix block, and a distance between a first element in the first matrix block and a second element in the second matrix block is u in a diagonal direction of the first generator matrix, where u is an integer greater than or equal to 1; determine a second generator matrix based on an encoding length and the first generator matrix, where the second generator matrix includes T first generator matrices, the T first generator matrices are distributed along a diagonal of the second generator matrix, and a first matrix block of an $(a+1)^{th}$ first generator matrix in the T first generator matrices overlaps a second matrix block of an $a^{th}$ first generator matrix, where a is an integer greater than or equal to 1, and T is an integer greater than or equal to 2; and polar encode the K to-be-encoded bits based on the second generator matrix, to obtain encoded bits.

In some embodiments, the logic circuit further performs the encoding method according to any implementation of the embodiments.

Some embodiments provide a decoding apparatus. The decoding apparatus includes an input interface and a logic circuit.

The input interface is configured to receive polar encoded bit information.

The logic circuit is configured to polar decode the bit information based on a second generator matrix, to obtain polar decoded bit. The second generator matrix is generated based on a first generator matrix, the first generator matrix includes a first matrix block and a second matrix block, the first matrix block is located at the top-left corner of the first generator matrix, the second matrix block is located at the bottom-right corner of the first generator matrix, the first matrix block is the same as the second matrix block, and a distance between a first element in the first matrix block and a second element in the second matrix block is u in a diagonal direction of the first generator matrix, where u is an integer greater than or equal to 1. The second generator matrix includes T first generator matrices, the T first generator matrices are distributed along a diagonal of the second generator matrix, and a first matrix block of an $(a+1)^{th}$ first generator matrix in the T first generator matrices overlaps a second matrix block of an $a^{th}$ first generator matrix, where a is an integer greater than or equal to 1, and T is an integer greater than or equal to 2.

In some embodiments, the logic circuit further performs the decoding method according to any implementation of the embodiments.

Some embodiments provide the encoding method and apparatus, the decoding method and apparatus, and the device. In response to the K to-be-encoded bits to be encoded, the first generator matrix is first determined, then the second generator matrix is generated based on the first generator matrix, and the K to-be-encoded bits are polar encoded based on the second generator matrix. The first generator matrix includes the at least two sub-blocks distributed based on the preset position relationship, each sub-block includes a plurality of first generator matrix cores, the second generator matrix includes the T sub-blocks, and the position relationship between two adjacent sub-blocks of the T sub-blocks is determined based on the preset position relationship. Therefore, in some embodiments the second generator matrix includes a plurality of sub-blocks arranged according to the foregoing preset position relationship, and each sub-block includes a plurality of first generator matrix cores. Therefore, polar encoding the K to-be-encoded bits based on the second generator matrix is equivalent to: polar encoding a plurality of short codes, and coupling the plurality of short codes to obtain an encoding result. This reduces encoding complexity. In response to a codeword obtained encoding based on the foregoing encoding method being decoded, decoding complexity is reduced.

BRIEF DESCRIPTION OF DRAWINGS

FIG. 7B is a schematic diagram of another third generator matrix in accordance with some embodiments;

FIG. 13 is a schematic diagram of yet another second generator matrix in accordance with some embodiments;

DESCRIPTION OF EMBODIMENTS

Some embodiments are used in various fields in which polar coding is used, for example, a data storage field, an optical network communication field, and a wireless communication field. A wireless communication system mentioned in some embodiments includes but is not limited to a narrowband internet of things (NB-IoT) system, a WiMAX system, a long term evolution (LTE) system, and three application scenarios of a next-generation 5G mobile communication system new radio (NR): enhanced mobile broadband (eMBB), ultra-reliable and low-latency communication (URLLC), and massive machine-to-machine communications (mMTC). Certainly, there is another field in which polar coding is used. This is not limited in this application. Some embodiments are applicable to a communication scenario with a long code length, for example, including but not limited to a service scenario with a large throughput, a high-definition video service scenario, a large file transfer service scenario, and a multimedia service such as virtual reality (VR)/augmented reality (AR for short), and hybrid automatic repeat request (HARQ) for wireless communication.

Figure 1:
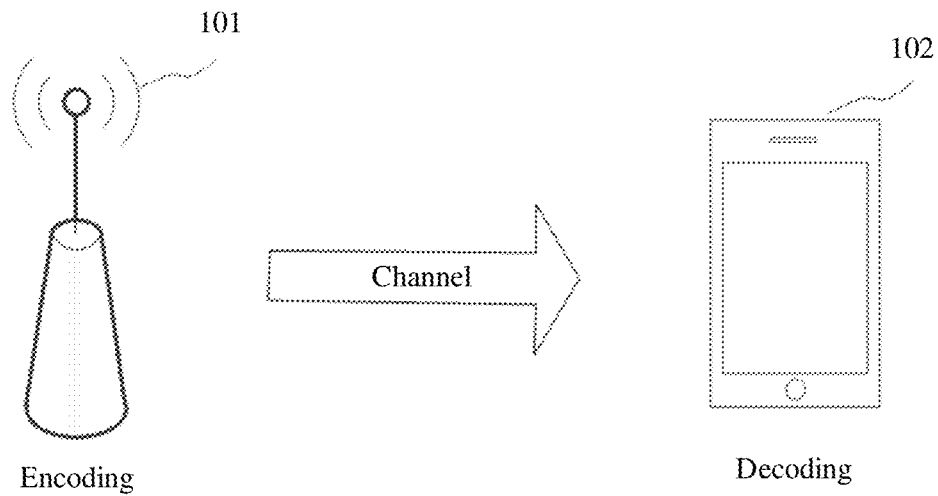
FIG. 1 is an architectural diagram of a communication system in accordance with some embodiments.

For ease of understanding, the following describes, with reference to FIG. 1, an architectural diagram of a communication system to which some embodiments are applicable.

FIG. 1 is an architectural diagram of a communication system in accordance with some embodiments. Refer to FIG. 1. A sending device 101 and a receiving device 102 are included.

Optionally, in response to the sending device 101 being a terminal device, the receiving device 102 is a network device. In response to the sending device 101 being a network device, the receiving device 102 is a terminal device.

Refer to FIG. 1. The sending device 101 includes an encoder, so that the sending device 101 performs polar encoding and output an encoded sequence. After being rate matched, interleaved, and modulated, the encoded sequence is transmitted to the receiving device 102 through a channel. The receiving device 102 includes a decoder. The receiving device 102 receives a signal sent by the sending device 101, and decode the received signal.

FIG. 1 is an example of an architectural diagram of a communication system, and does not limit the architectural diagram of the communication system.

For ease of understanding, the following describes concepts in some embodiments.

A terminal device includes but is not limited to a mobile station (MS), a mobile terminal (MT), a mobile phone (handset), portable equipment (portable equipment), and the like. The terminal device communicates with one or more core networks through a radio access network (RAN). For example, the terminal device is a mobile phone (or referred to as a "cellular" phone), a computer having a wireless communication function, or the like. Alternatively, the terminal device is a portable, pocket-sized, handheld, computer built-in, or in-vehicle mobile apparatus or device.

A network device is an evolved NodeB (eNB or eNodeB) in an LTE system; a network device is a gNB, a transmission reception point (TRP), a micro base station, or the like in a 5G communication system; a network device is a relay station, an access point, an in-vehicle device, a wearable device, or a network device in a future evolved public land mobile network (PLMN), a base station in another network integrating a plurality of technologies, a base station in various other evolved networks, or the like.

Polar coding: Polar coding alternatively is polar encoding/decoding, and polar coding is described in the following two manners:

In a manner, an encoding process is expressed by using a generator matrix, that is, $x_1^N = u_1^N G_N$.

$u_1^N$ is a row vector, $u_1^N = (u_1, u_2, \ldots, u_N)$, N is a code length, N is an integer greater than or equal to 1, $u_i$ is an unencoded bit, i is an integer between 1 and N, $u_1^N$ includes information bits and/or frozen bits, that is, $u_i$ is the information bit or the frozen bit. The information bit is a bit used to carry information, and the information bit includes a cyclic redundancy check (CRC) bit and/or a parity check (PC) bit. The frozen bit is a padding bit, and the frozen bit is usually 0.

$G_N$ is a generator matrix, $G_N$ is an N*N matrix, and $G_N = B_N F_2^{\otimes (\log_2(N))}$, where $B_N$ is an N*N reversal matrix, for example, $B_N$ is a bit reversal (bit reversal) matrix, $$F_2 = \begin{bmatrix} 1 & 0 \\ 1 & 1 \end{bmatrix}, F_2^{\otimes (\log_2(N))}$$

is a Kronecker (Kronecker) product of $\log_2$ (N) matrices $F_2$. Both addition and multiplication above are operations in the binary Galois field (Galois field). $G_N$ further is referred to as a generator matrix core.

In another manner, the encoding process is expressed by using a diagram of encoding.

Figure 2:
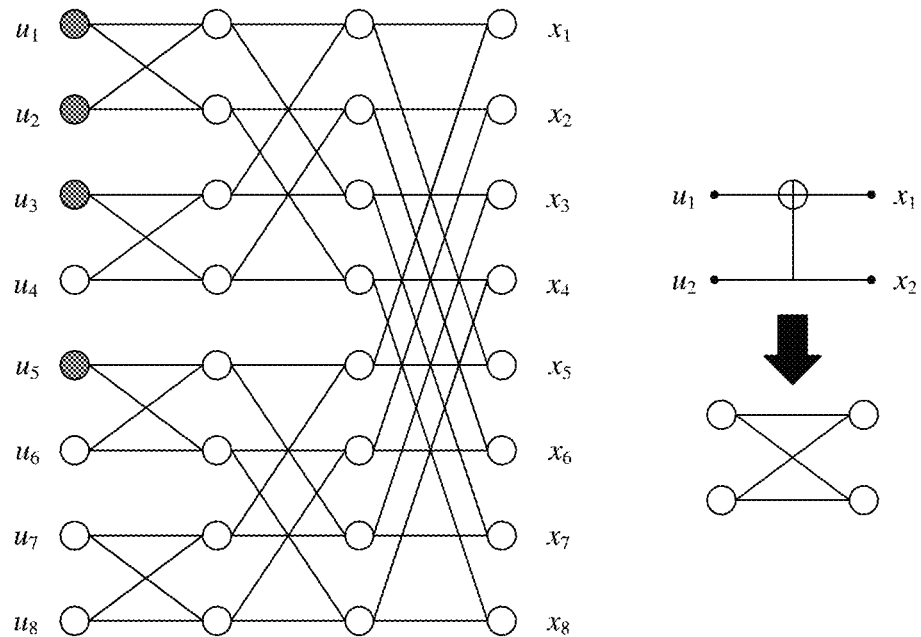
FIG. 2 is a diagram of encoding in accordance with some embodiments.

The following describes the diagram of encoding with reference to FIG. 2.

FIG. 2 is a diagram of encoding in accordance with some embodiments. Refer to FIG. 2. An encoding length corresponding to the diagram of encoding is 8, each circle in a first column represents one information bit or frozen bit, and $u_1, u_2, \ldots, u_8$ shown in the first column are unencoded bits (information bits or frozen bits), where $u_4, u_6, u_7, u_8$ are information bits, and $u_1, u_2, u_3, u_5$ are frozen bits. Each circle in columns other than the first column represents one partial sum (partial sum) bit. $x_1, x_2, \ldots, x_8$ in a last column are encoded bits. Each butterfly diagram (shown on the right side of the figure) represents one polarization of two bits, that is, $x_1{}^2 = u_1{}^2 G_2$.

In a polar encoding process, a larger code length indicates higher encoding complexity. For example, complexity of polar encoding in a current technology is $O(N*\log_2(N))$. To resolve this technical problem, an embodiment of this application provides an encoding method. In an encoding process, a generator matrix corresponding to short codes are processed to obtain a final generator matrix, and polar encoding is performed based on the final generator matrix. This is equivalent to: polar encoding the plurality of short codes, and coupling the plurality of short codes, to obtain an encoding result. This reduces encoding complexity.

In response to encoding being performed based on the final generator matrix, the encoding complexity is reduced.

In some embodiments, an example in which start coordinates (the coordinates at the topmost-left corner) in the matrix are (1, 1) is used for description. Certainly, the start coordinates in the matrix alternatively is (0, 0). This is not limited in this embodiment of this application.

Figure 3:
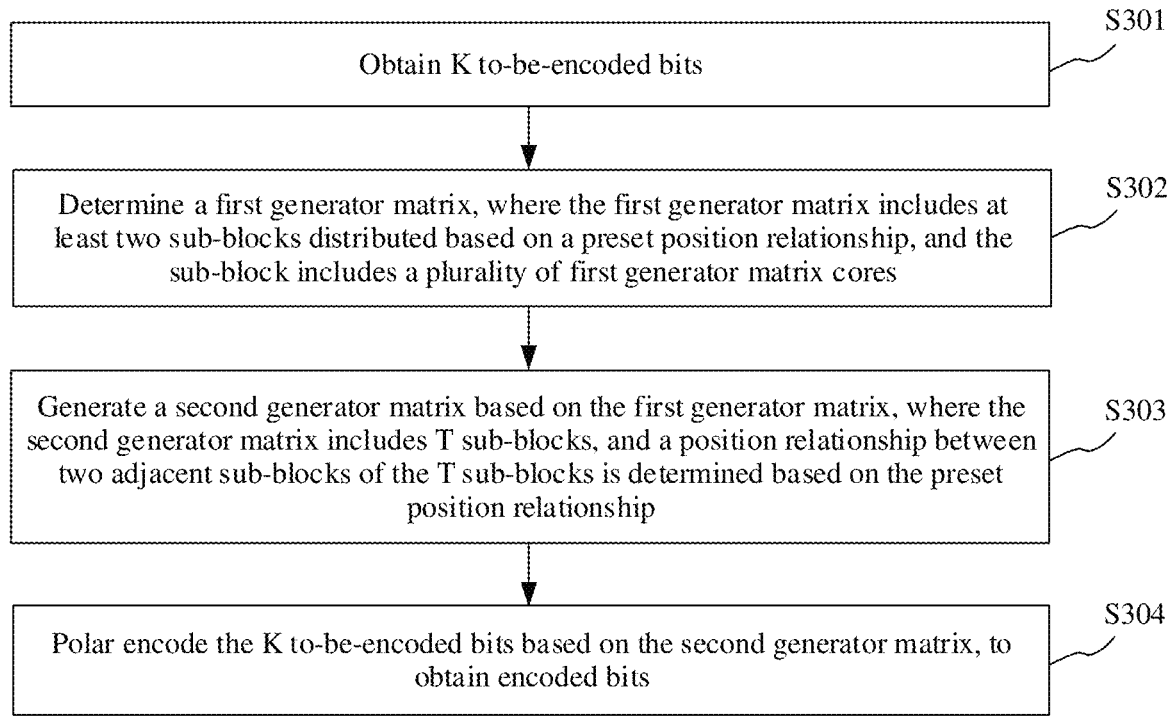
FIG. 3 is a schematic flowchart of an encoding method in accordance with some embodiments.

FIG. 3 is a schematic flowchart of an encoding method in accordance with some embodiments. Refer to FIG. 3. The method includes the following steps.

S301: Obtain K to-be-encoded bits.

K is a positive integer.

Optionally, the K to-be-encoded bits include information bits and frozen bits. Alternatively, the K to-be-encoded bits are information bits.

S302: Determine a first generator matrix.

The first generator matrix includes at least two sub-blocks distributed based on a preset position relationship, and the sub-block includes a plurality of first generator matrix cores.

The first generator matrix core is $G_N$, where $N=2^n$, and n is a positive integer. In an application process, a value of N is set according to a condition. For example, N is a preset value.

The sub-block includes the first generator matrix cores and zero matrices (which is expressed as $0_N$). A size of the first generator matrix core is the same as a size of the zero matrix. For example, in response to the size of the first generator matrix core being N*N, the size of the zero matrix is also N*N. For ease of description, in the following, the first generator matrix core or the zero matrix is referred to as a sub-matrix.

In some embodiments, a size of a matrix means that the matrix includes a row quantity and a column quantity, and the size of the matrix is expressed by M*N (M is the row quantity of the matrix, and N is the column quantity of the matrix). In response to the matrix being a square matrix (square matrix), the size of the matrix is expressed by the row quantity or the column quantity. For example, in response to the matrix including N rows and N columns, the size of the matrix is expressed by N*N, or the size of the matrix is expressed by N.

Figure 4:
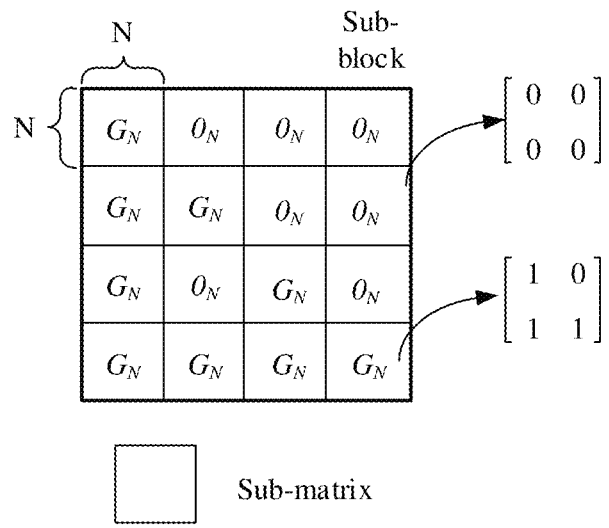
FIG. 4 is a schematic diagram of a sub-block in accordance with some embodiments.

The following describes the sub-block with reference to FIG. 4.

FIG. 4 is a schematic diagram of the sub-block according to this embodiment of this application. Refer to FIG. 4. The sub-block includes a plurality of sub-matrices. In FIG. 4, an example in which a quantity of sub-matrices is 16 is used for description. Each sub-matrix includes N*N elements. For example, the element is 0 or 1. The sub-matrix is $G_N$ or $0_N$.

In response to N being equal to 2, $$G_N = \begin{bmatrix} 1 & 0 \\ 1 & 1 \end{bmatrix}, \text{ and } 0_N = \begin{bmatrix} 0 & 0 \\ 0 & 0 \end{bmatrix}.$$

Optionally, first generator matrix cores ($G_N$) are included on a first diagonal of the sub-block. The first diagonal is a main diagonal of the sub-block. For example, refer to FIG. 4. Sub-matrices located on the main diagonal of the sub-block are $G_N$, for example, sub-matrices at coordinates (1, 1), (2, 2), (3, 3), and (4, 4) are $G_N$.

Optionally, the plurality of first generator matrix cores in the sub-block are distributed in a lower triangular form. For example, refer to FIG. 4. A plurality of $G_N$ in the sub-block are distributed in a lower triangular form.

Optionally, distribution of the first generator matrix cores in the sub-block is the same as distribution of first elements in a second generator matrix core. The first element is 1. Distribution of elements in the second generator matrix core satisfies $B_N F_2^{\otimes(\log_2(N))}$, and a quantity of elements in the second generator matrix core is the same as or different from a quantity of elements in the first generator matrix core. For example, in response to the second generator matrix core being $$\begin{bmatrix} 1 & 0 & 0 & 0 \\ 1 & 1 & 0 & 0 \\ 1 & 0 & 1 & 0 \\ 1 & 1 & 1 & 1 \end{bmatrix},$$

and the sub-block is shown in FIG. 4, distribution of $G_N$ in the sub-blocks is the same as distribution of is in the second generator matrix core, and distribution of $0_N$ in the sub-block is correspondingly the same as distribution of 0s in the second generator matrix core.

The following describes the sub-block by using an example.

Example 1: In response to the second generator matrix core being $$\begin{bmatrix} 1 & 0 \\ 1 & 1 \end{bmatrix},$$

the sub-block is $$\begin{bmatrix} G_N & 0_N \\ G_N & G_N \end{bmatrix},$$

and a quantity of sub-matrices included in the sub-block is 2*2. Distribution of $G_N$ in the sub-blocks is the same as distribution of elements 1 in the second generator matrix core.

In response to N=2, $$G_N = \begin{bmatrix} 1 & 0 \\ 1 & 1 \end{bmatrix} \begin{bmatrix} 1 & 0 \\ 1 & 1 \end{bmatrix}$$

is substituted into $G_N$ in the sub-block, to obtain the sub-block as $$\begin{bmatrix} 1 & 0 & 0 & 0 \\ 1 & 1 & 0 & 0 \\ 1 & 0 & 1 & 0 \\ 1 & 1 & 1 & 1 \end{bmatrix}.$$

In response to N=4, $$G_N = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

is substituted into $G_N$ in the sub-block, to obtain the sub-block as $$\begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

Example 2: In response to the second generator matrix core being $$\begin{bmatrix} 1 & 0 & 0 & 0 \\ 1 & 1 & 0 & 0 \\ 1 & 0 & 1 & 0 \\ 1 & 1 & 1 & 1 \end{bmatrix},$$

the sub-block is $$\begin{bmatrix} G_N & 0_N & 0_N & 0_N \\ G_N & G_N & 0_N & 0_N \\ G_N & 0_N & G_N & 0_N \\ G_N & G_N & G_N & G_N \end{bmatrix},$$

and distribution of $G_N$ in the sub-block is the same as distribution of elements 1 in the second generator matrix core.

In response to N=2, $$G_N = \begin{bmatrix} 1 & 0 \\ 1 & 1 \end{bmatrix} \begin{bmatrix} 1 & 0 \\ 1 & 1 \end{bmatrix}$$

is substituted into $G_N$ in the sub-block, to obtain the sub-block as $$\begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

The first generator matrix includes the at least two sub-blocks distributed based on the preset position relationship. Optionally, a quantity of sub-blocks included in the first generator matrix is 2.

Optionally, an overlapping portion exists in the at least two sub-blocks in the first generator matrix. For example, an overlapping portion exists in each two adjacent sub-blocks in the first generator matrix. In response to the two adjacent sub-blocks being a sub-block 1 and a sub-block 2, an element in the bottom-right corner area of the sub-block 1 overlaps an element in the top-left corner area of the sub-block 2.

For example, in response to the first generator matrix including two sub-blocks (denoted as the sub-block 1 and the sub-block 2), the preset position relationship is: The sub-block 1 is located on the top-left portion of the first generator matrix, the sub-block 2 is located on the bottom-right port of the first generator matrix, and the bottom-right corner area of the sub-block 1 overlaps the top-left corner area of the sub-block 2.

Figure 5A:
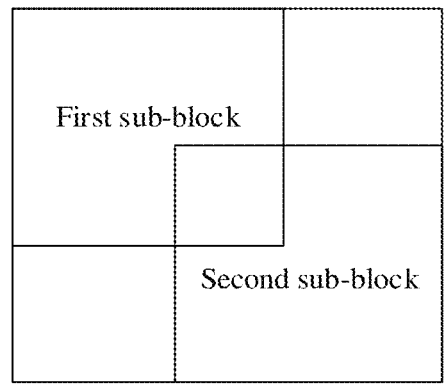
FIG. 5A is a schematic diagram of a first generator matrix in accordance with some embodiments.
Figure 5B:
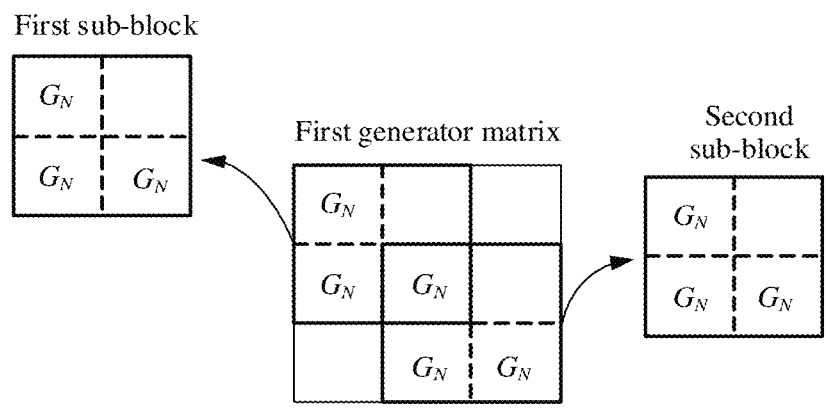
FIG. 5B is a schematic diagram of another first generator matrix in accordance with some embodiments.
Figure 5C:
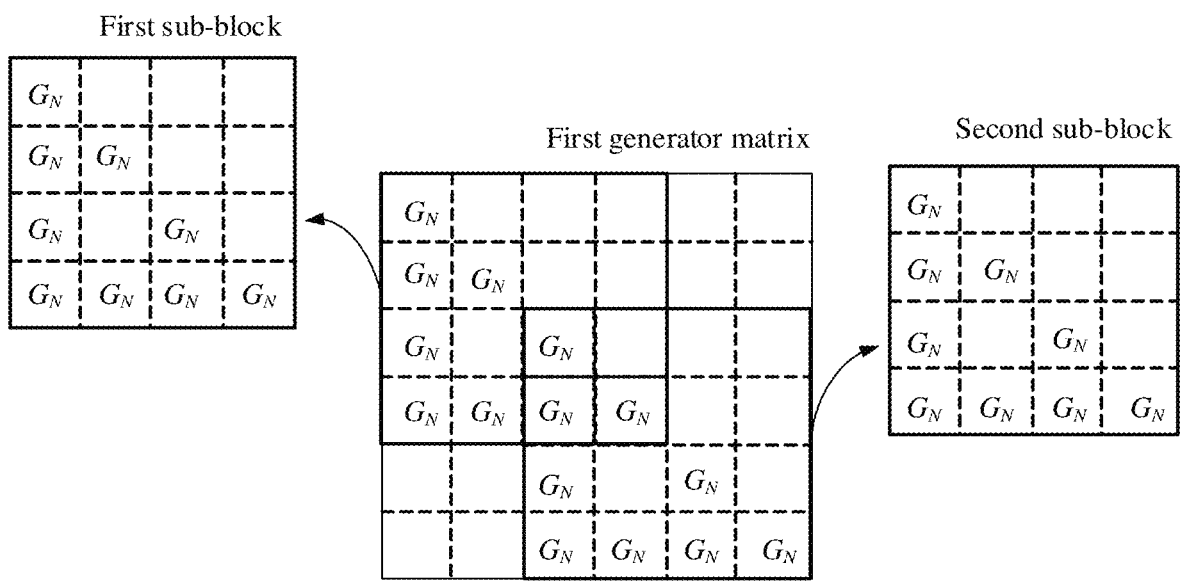
FIG. 5C is a schematic diagram of still another first generator matrix in accordance with some embodiments.

The following describes a first generator matrix with reference to FIG. 5A to FIG. 5C.

FIG. 5A is a schematic diagram of a first generator matrix according to this embodiment of this application. FIG. 5B is a schematic diagram of another first generator matrix according to this embodiment of this application. FIG. 5C is a schematic diagram of still another first generator matrix according to this embodiment of this application.

Refer to FIG. 5A. The first generator matrix includes two sub-blocks, which are denoted as a first sub-block and a second sub-block. The first sub-block is the same as the second sub-block. The first sub-block is located on the top-left portion of the first generator matrix, and the second sub-block is located on the bottom-right portion of the first generator matrix. The bottom-right corner area of the first sub-block overlaps the top-left corner area of the second sub-block, and distribution of elements in the bottom-right corner area of the first sub-block is the same as distribution of elements in the top-left corner area of the second sub-block.

Refer to FIG. 5B. The first generator matrix includes a first sub-block and a second sub-block, and each of the first sub-block and the second sub-block is $$\begin{bmatrix} G_N & 0_N \\ G_N & G_N \end{bmatrix}.$$

In this case, the first generator matrix is $$\begin{bmatrix} G_N & 0_N & 0_N \\ G_N & G_N & 0_N \\ 0_N & G_N & G_N \end{bmatrix}.$$

The first sub-block is located on the top-left portion of the first generator matrix, and the second sub-block is located on the bottom-right portion of the first generator matrix. A first sub-matrix in the first sub-block overlaps a second sub-matrix in the second sub-block. Coordinates of the first sub-matrix in the first sub-block are (2, 2), and coordinates of the second sub-matrix in the second sub-block are (1, 1).

Refer to FIG. 5C. The first generator matrix includes a first sub-block and a second sub-block, and each of the first sub-block and the second sub-block is $$\begin{bmatrix} G_N & 0_N & 0_N & 0_N \\ G_N & G_N & 0_N & 0_N \\ G_N & 0_N & G_N & 0_N \\ G_N & G_N & G_N & G_N \end{bmatrix}.$$

In this case, the first generator matrix is $$\begin{bmatrix} G_N & 0_N & 0_N & 0_N & 0_N & 0_N \\ G_N & G_N & 0_N & 0_N & 0_N & 0_N \\ G_N & 0_N & G_N & 0_N & 0_N & 0_N \\ G_N & G_N & G_N & G_N & 0_N & 0_N \\ 0_N & 0_N & G_N & 0_N & G_N & 0_N \\ 0_N & 0_N & G_N & G_N & G_N & G_N \end{bmatrix}$$

The first sub-block is located on the top-left portion of the first generator matrix, and the second sub-block is located on the bottom-right portion of the first generator matrix. Four first sub-matrices in the first sub-block overlap four second sub-matrices in the second sub-block. Coordinates of the four first sub-matrices in the first sub-block are (3, 3), (3, 4), (4, 3), and (4, 4); and coordinates of the four second sub-matrices in the second sub-block are (1, 1), (1, 2), (2, 1), and (2, 2).

For ease of description and viewing, in FIG. 5B and FIG. 5C, marks of $0_N$ are omitted in the figures, that is, blank sub-matrices in FIG. 5B to FIG. 5C are $0_N$.

S303: Generate a second generator matrix based on the first generator matrix.

The second generator matrix includes T sub-blocks, and a position relationship between two adjacent sub-blocks of the T sub-blocks is determined based on the preset position relationship, where T is a positive integer. Optionally, the position relationship between two adjacent sub-blocks of the T sub-blocks is the same as the preset position relationship.

The quantity T of sub-blocks included in the second generator matrix is determined based on the first generator matrix, a size of the sub-block, and an encoding length N', and the second generator matrix is generated based on the first generator matrix and the quantity T.

Optionally, T is a minimum integer that enables a first condition to be satisfied, and the first condition is that a size of the second generator matrix is greater than or equal to the encoding length. The second generator matrix is a square matrix, and the size of the second generator matrix is expressed by a quantity of rows or columns included in the second generator matrix, that is, the size of the second generator matrix is the quantity of rows or columns included in the second generator matrix.

For example, T satisfies the following relationship:

$v+(T-2)*u < N' \leq v+(T-1)*u$, where v is the size of the sub-block (the sub-block is a square matrix, and v represents a quantity of rows or columns of elements included in the sub-block), N' is the encoding length, N' is an integer greater than 1, and u is a distance between two adjacent sub-blocks. The distance between two adjacent sub-blocks are expressed by a distance (a difference between row numbers or a difference between column numbers) between first elements (for example, the first element is an element with coordinates (1, 1) in the sub-block) in the two adjacent sub-blocks.

For example, in response to the size v of the sub-block being 512, the encoding length N' is 2048, and the distance u between two adjacent sub-blocks is 256, T is 7.

For example, in response to the size v of the sub-block being 512, the encoding length N' is 1500, and the distance u between two adjacent sub-blocks is 256, T is 5.

Figure 6A:
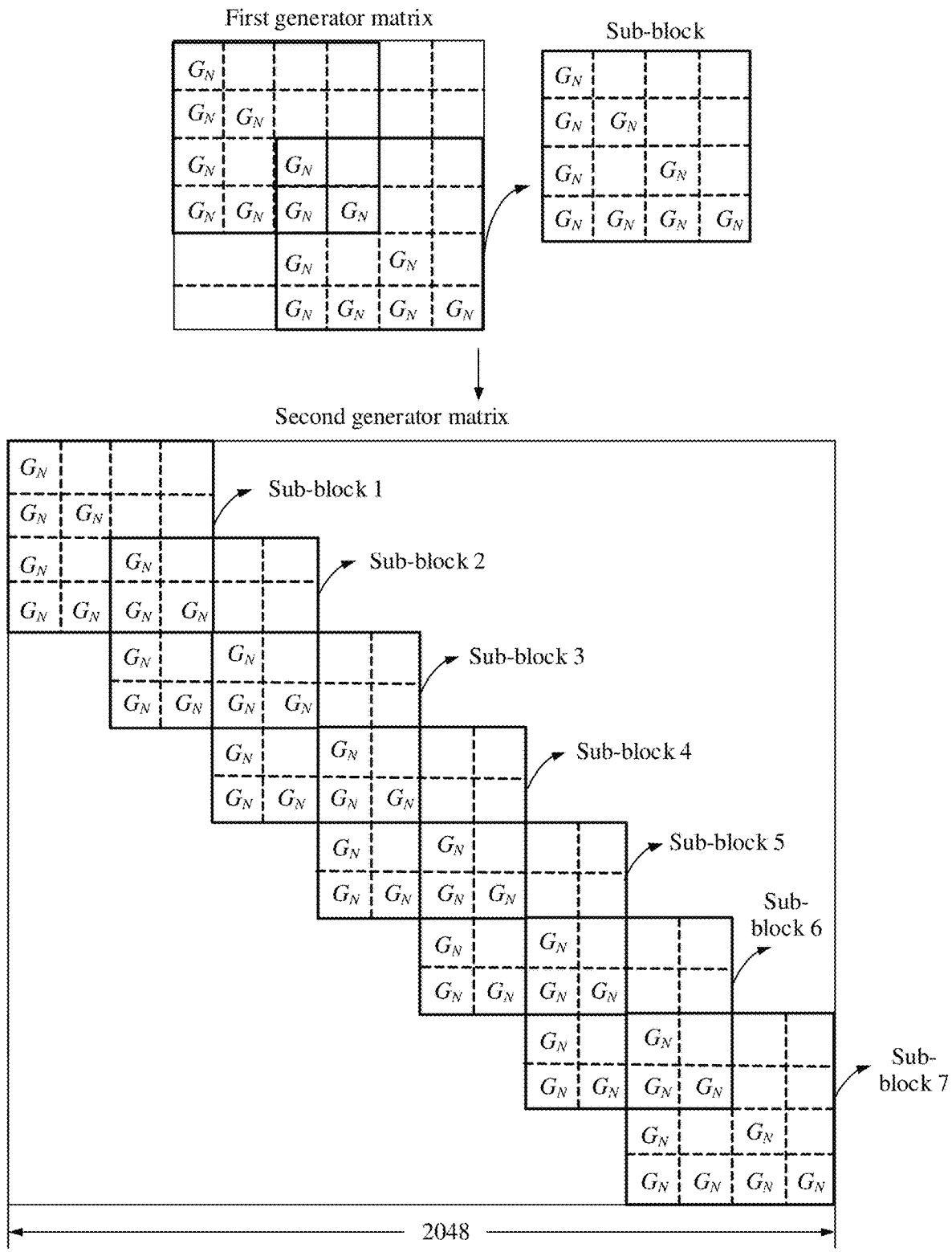
FIG. 6A is a schematic diagram of a second generator matrix in accordance with some embodiments.
Figure 6B:
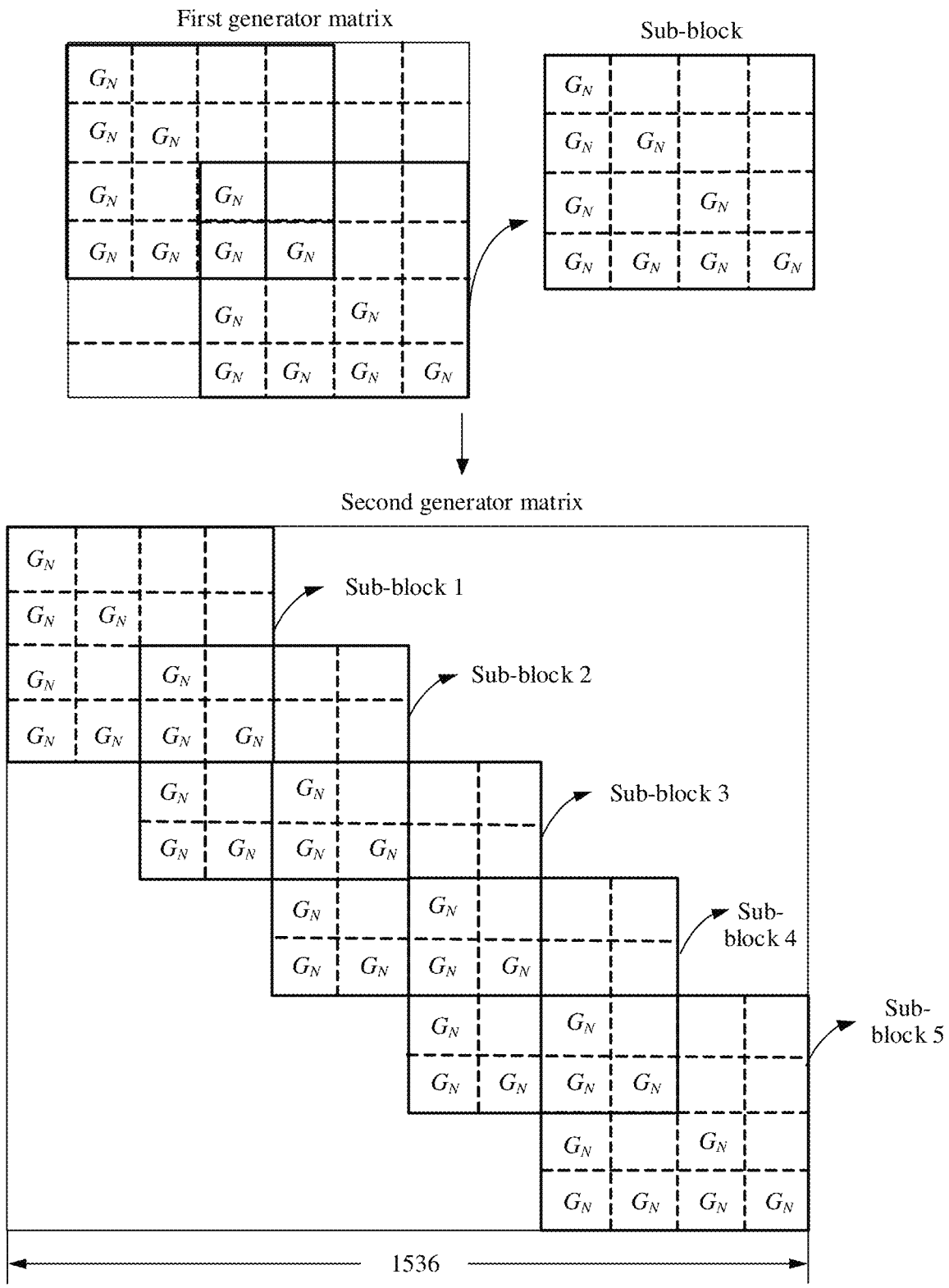
FIG. 6B is a schematic diagram of another second generator matrix in accordance with some embodiments.
Figure 6C:
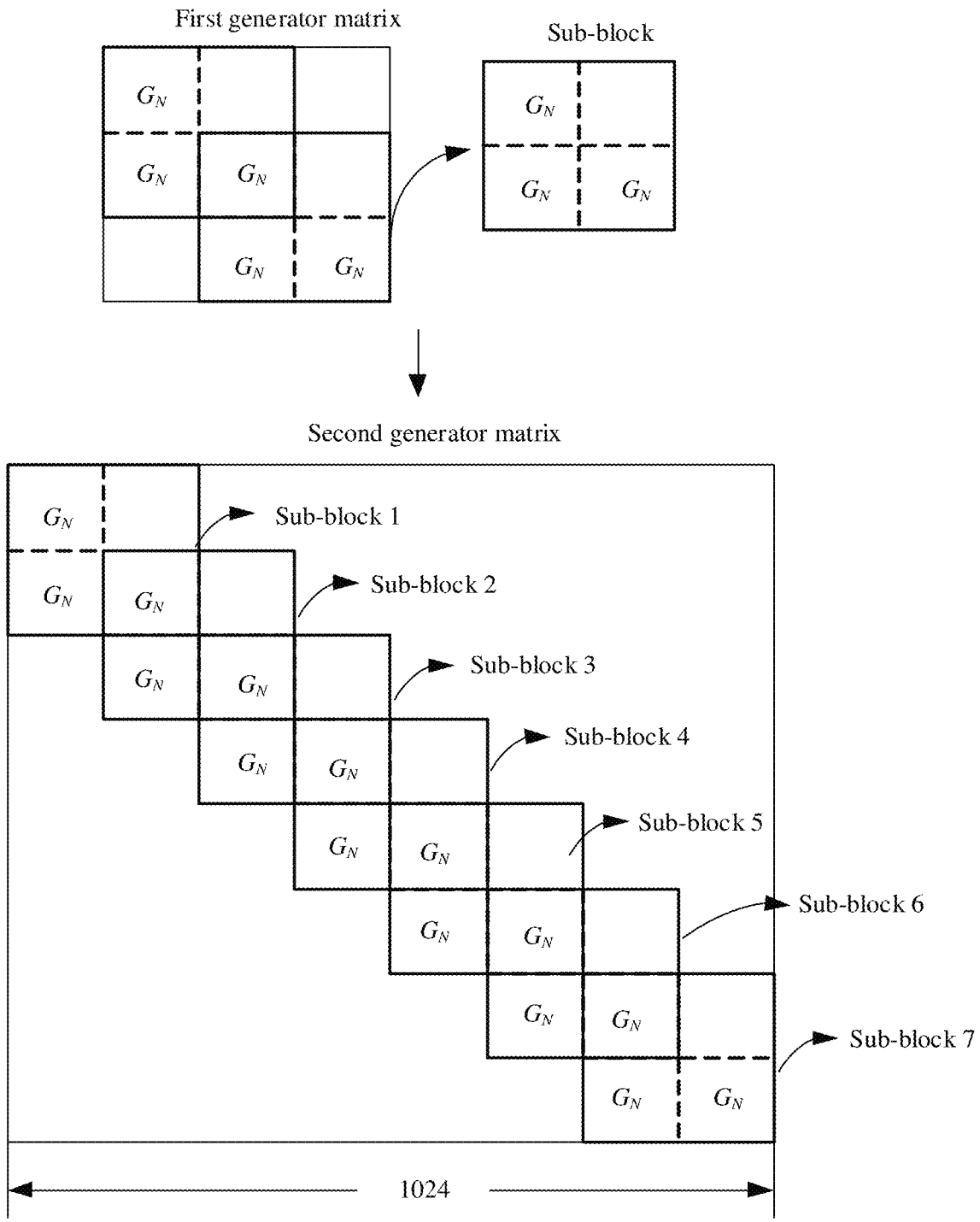
FIG. 6C is a schematic diagram of still another second generator matrix in accordance with some embodiments.

The following describes, with reference to FIG. 6A to FIG. 6C, the second generator matrix by using examples.

FIG. 6A is a schematic diagram of a second generator matrix according to this embodiment of this application. Refer to FIG. 6A, the first generator matrix includes two sub-blocks, each sub-block includes 16 sub-matrices, a part of sub-matrices are $G_N$, and a part of sub-matrices are $0_N$. FIG. 6A shows a position relationship between two sub-blocks.

In response to a size of each sub-matrix being 128 (including 128 rows and 128 columns), a size of the sub-block is 512, a distance between the two sub-blocks in the first generator matrix is 256. In response to the encoding length N' being 2048, the second generator matrix includes seven sub-blocks denoted as a sub-block 1, a sub-block 2, . . . , a sub-block 6, and a sub-block 7. A position relationship between each two adjacent sub-blocks in the seven sub-blocks is the same as a position relationship between the two sub-blocks in the first generator matrix. A size (a quantity of rows or columns included in the second generator matrix) of the second generator matrix is 2048.

FIG. 6B is a schematic diagram of another second generator matrix according to this embodiment of this application. Refer to FIG. 6B. In some embodiments the first generator matrix includes two sub-blocks, each sub-block includes 16 sub-matrices, a part of sub-matrices are $G_N$, and a part of sub-matrices are $0_N$. FIG. 6B shows a position relationship between the two sub-blocks.

In response to a size of each sub-matrix being 128 (including 128 rows and 128 columns), a size of the sub-block is 512, and a distance between the two sub-blocks in the first generator matrix is 256. In response to the encoding length N' being 1500, the second generator matrix includes five sub-blocks denoted as a sub-block 1, a sub-block 2, a sub-block 3, a sub-block 4, and a sub-block 5, and a position relationship between each two adjacent sub-blocks in the five sub-blocks is the same as a position relationship between the two sub-blocks in the first generator matrix. A size (a quantity of rows or columns included in the second generator matrix) of the second generator matrix is 1536.

FIG. 6C is a schematic diagram of still another second generator matrix according to this embodiment of this application. Refer to FIG. 6C. In some embodiments the first generator matrix includes two sub-blocks, each sub-block includes four sub-matrices, a part of sub-matrices are $G_N$, and a part of sub-matrices are $0_N$. FIG. 6C shows a position relationship between the two sub-blocks.

In response to a size of each sub-matrix being 128 (including 128 rows and 128 columns), a size of the sub-block is 256, a distance between the two sub-blocks in the first generator matrix is 128. In response to the encoding length N' being 1024, the second generator matrix includes seven sub-blocks denoted as a sub-block 1, a sub-block 2, . . . , a sub-block 6, and a sub-block 7. A position relationship between each two adjacent sub-blocks in the seven sub-blocks is the same as a position relationship between the two sub-blocks in the first generator matrix. A size (a quantity of rows or columns included in the second generator matrix) of the second generator matrix is 1024.

In FIG. 6A to FIG. 6C, sub-matrices except $G_N$ are $0_N$. For ease of description and viewing, marks of $0_N$ are omitted in the figures, that is, blank sub-matrices in FIG. 6A to FIG. 6C are $0_N$.

FIG. 6A to FIG. 6C show the examples of the second generator matrix, but do not limit the second generator matrix. Certainly, there alternatively is another second generator matrix. This is not limited in this embodiment of this application.

S304. Polar encode the K to-be-encoded bits based on the second generator matrix, to obtain encoded bits.

In response to the size of the second generator matrix being equal to the encoding length, the K to-be-encoded bits are polar encoded based on the second generator matrix, to obtain the encoded bits.

In response to the size of the second generator matrix being greater than the encoding length, a third generator matrix is first determined in the second generator matrix, and the K to-be-encoded bits are polar encoded based on the third generator matrix, to obtain the encoded bits. The third generator matrix is a matrix taken from the top-left corner area of the second generator matrix, or the third generator matrix is a matrix taken from the bottom-right corner area of the second generator matrix. The third generator matrix is a square matrix.

Figure 7A:
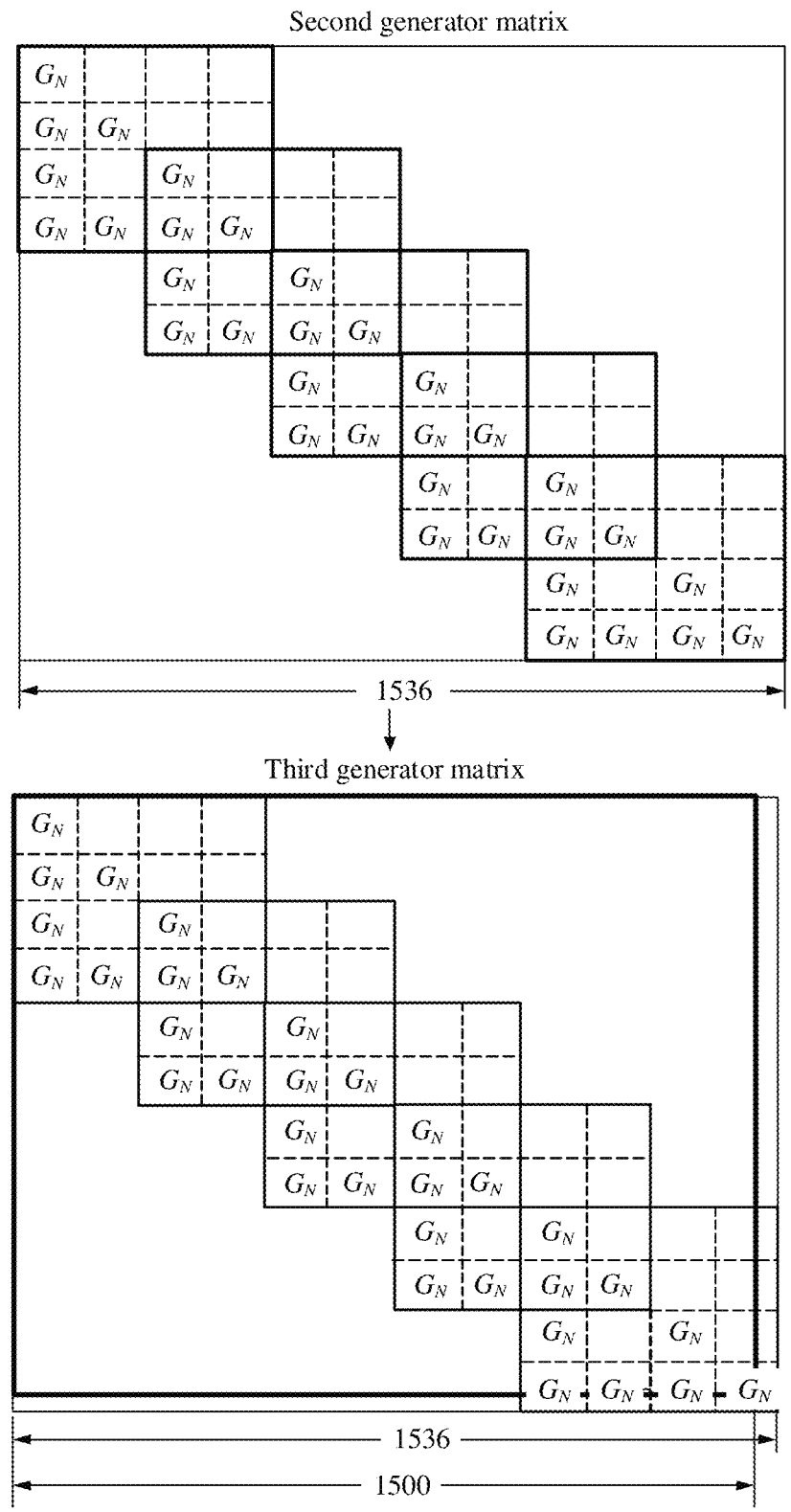
FIG. 7A is a schematic diagram of a third generator matrix in accordance with some embodiments.

The following describes the third generator matrix with reference to FIG. 7A and FIG. 7B.

FIG. 7A is a schematic diagram of a third generator matrix according to this embodiment of this application. Refer to FIG. 7A. In response to the encoding length being 1500, and the size of the second generator matrix is 1536, a matrix with a size 1500 is taken as the third generator matrix from the top-left corner area of the second generator matrix.

FIG. 7B is a schematic diagram of another third generator matrix according to this embodiment of this application. Refer to FIG. 7B. In response to the encoding length being 1500, and the size of the second generator matrix is 1536, a matrix with a size 1500 is taken as the third generator matrix from the bottom-right corner area of the second generator matrix.

In response to the K to-be-encoded bits being polar encoded, K sub-channels with highest reliability is determined from a plurality of sub-channels corresponding to the K to-be-encoded bits; positions of the K to-be-encoded bits are determined based on the K sub-channels with the highest reliability; a to-be-encoded sequence is determined based on the positions of the K to-be-encoded bits, where the to-be-encoded sequence includes the K to-be-encoded bits and frozen bits; and the to-be-encoded sequence is polar encoded based on the second generator matrix to obtain encoded bits.

Optionally, the positions of the K to-be-encoded bits are positions corresponding to the K sub-channels with the highest reliability. After the positions of the K to-be-encoded bits are determined, information bits (the to-be-encoded bits) are filled in the positions of the K to-be-encoded bits, and the frozen bits are filled in other positions, to obtain an encoded sequence. The encoded sequence includes N' bits, the N' bits include K information bits and N'-K frozen bits.

For example, in response to the encoding length being 8, a quantity of to-be-encoded bits is 4, and sub-channels with highest reliability in the eight sub-channels are a sub-channel 4, a sub-channel 6, a sub-channel 7, and a sub-channel 8, positions corresponding to the sub-channel 4, the sub-channel 6, the sub-channel 7, and the sub-channel 8 are used to carry information bits, and other sub-channels are used to carry frozen bits. In this case, the to-be-encoded sequence is 00010111, where 1 represents an information bit, and 0 represents a frozen bit.

The K sub-channels with the highest reliability is determined in the following manner:

First Manner:

P groups of sub-channels are determined from the plurality of sub-channels, where P is a positive integer. $X_i$ first sub-channels are determined from an $i^{th}$ group of sub-channels based on reliability of the $i^{th}$ group of sub-channels, where the K sub-channels with the highest reliability include first sub-channels determined in each group of sub-channels, $X_i$ first sub-channels are $X_i$ sub-channels with highest reliability in the $i^{th}$ group of sub-channels, i is an integer, $1 \leq i \leq P$, $X_i$ is a positive integer, and $\Sigma_{i=1}^{i=P} X_i = K$.

Optionally, a quantity of sub-channels included in a group of sub-channels are the same as a size of a sub-matrix. For example, in response to a size of a sub-matrix being 16, a group of sub-channels includes 16 sub-channels.

Optionally, a quantity of sub-channels included in a group of sub-channels are the same as a size of a sub-block. For example, in response to a size of a sub-block being 64, a group of sub-channels includes 64 sub-channels.

Reliability of each group of sub-channels are calculated in advance and stored. The reliability of each group of sub-channels are stored in the following two manners:

Manner 1: A ranking sequence of the stored reliability satisfies $r=\{r_1, r_2, \ldots, r_N\}$, where $r_i$ represents a sub-channel sequence number of a group of sub-channels, a position of $r_i$ in the r sequence represents reliability rankings of the sub-channel $r_i$ in sub-channels, and a higher ranking indicates higher reliability.

For example, in response to a group of sub-channels including eight sub-channels, sequence numbers of the eight sub-channels are 1, 2, ..., 7, and 8, and a reliability ranking sequence is r={4, 5, 3, 6, 7, 2, 1, 8}, reliability of the eight sub-channels satisfies: the sub-channel 4>the sub-channel 5>the sub-channel 3>the sub-channel 6>the sub-channel 7>the sub-channel 2>the sub-channel 1>the sub-channel 8.

Manner 2: A ranking sequence of the stored reliability satisfies $w=\{w_1, w_2, \ldots, w_N\}$, where $w_i$ represents a value of reliability of an $i^{th}$ sub-channel in a group of sub-channels; larger $w_i$ indicates higher reliability of the $i^{th}$ sub-channel; and in response to $w_i > w_j$, the reliability of the $i^{th}$ sub-channel is greater than reliability of a $j^{th}$ sub-channel.

For example, in response to a group of sub-channels including eight sub-channels, and a ranking sequence of reliability satisfies w={2.1, 3, 4.5, 5, 3.2, 2, 2.6, 7}, reliability of the eight sub-channels is separately shown in Table 1:

TABLE 1

| Sub-channel | Reliability |
| --- | --- |
| Sub-channel 1 | 2.1 |
| Sub-channel 2 | 3 |
| Sub-channel 3 | 4.5 |
| Sub-channel 4 | 5 |
| Sub-channel 5 | 3.2 |
| Sub-channel 6 | 2 |
| Sub-channel 7 | 2.6 |
| Sub-channel 8 | 7 |

Optionally, rankings of reliability of sub-channels in different groups are the same or is different. In response to the rankings of the reliability of the sub-channels in the different groups being the same, reliability of one group of sub-channels are stored.

Second Manner

Reliability of sub-channels corresponding to the encoding length is calculated, the sub-channels are sorted in descending order of the reliability of the sub-channels, and first K sub-channels of the sorted sub-channels are determined as the K sub-channels with the highest reliability.

Optionally, the reliability of the sub-channels corresponding to the encoding length is calculated in advance, and a sequence of the reliability is stored. In response to a maximum encoding length supported by a protocol being N*T, T reliability sequences are calculated in advance and stored, where N is a size of a sub-matrix, and lengths of the T reliability sequences are T, 2T, 3T, . . . , and N*T.

In an application process, in response to the encoding length N' satisfying the following condition: t'−1<N'<t', a prestored reliability sequence with a length t' *N is selected, and the K sub-channels with the highest reliability is determined from the reliability sequence with the length of t'*N.

Calculation of the reliability of the sub-channels shown includes intra-short-code reliability calculation and inter-short-code reliability calculation. Calculation of the reliability within the short code is the same as an existing calculation manner.

Optionally, in response to second generator matrices being different, manners of calculating sub-channel reliability are also different. The following describes, with reference to FIG. 8A to FIG. 8B, a manner of calculating sub-channel reliability by using an example.

Example 1: In some embodiments the second generator matrix is the second generator matrix shown in FIG. 6C, and encoding corresponding to the second generator matrix further is referred to as two-coupling encoding.

The following describes, with reference to 8A, a sub-channel reliability determining process.

Figure 8A:
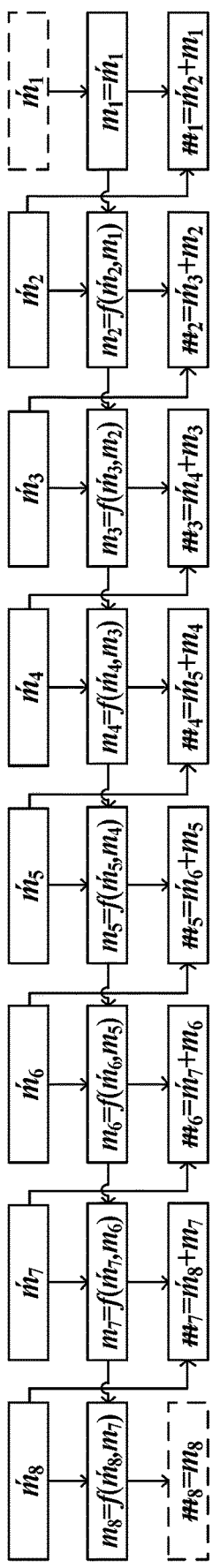
FIG. 8A is a schematic diagram of a decoding process in accordance with some embodiments.

FIG. 8A is a schematic diagram of a decoding process in accordance with some embodiments. Refer to FIG. 8A. $\acute{m}_t$ is input first reliability of an $i^{th}$ group of sub-channels, and $\mathcal{m}_i$ is calculated third reliability of the $i^{th}$ group of sub-channels, where i is an integer between 1 and 8. An f operation is $f(m_1, m_2)=\phi^{-1}(1-(1-\phi(m_1))(1-\phi(m_2)))$, where $$\phi(x) = \begin{cases} 1 - \frac{1}{\sqrt{4\pi x}} \int_{-\infty}^{\infty} \tanh\frac{u}{2} e^{-\frac{(u-x)^2}{4x}} du, & x > 0, \\ 1, & x = 0. \end{cases}$$

and $\phi^{-1}(x)$ is an inverse function of $\phi(x)$.

Refer to FIG. 8A. Second reliability $m_1$ of a first group of sub-channels is first reliability $\acute{m}_1$ of the first group of sub-channels; then, an f operation is performed on $m_1$ and $\acute{m}_2$, to obtain second reliability $m_2$ of a second group of sub-channels; then, an f operation is performed on $m_2$ and $\acute{m}_3$ to obtain second reliability $m_3$ of a third group of sub-channels; this method is applied by analogy until second reliability of eight groups of sub-channels is obtained. This is expressed by using formulas: $m_1=\acute{m}_1$, $m_2=f(\acute{m}_2, m_1)$, $m_3=f(\acute{m}_3, m_2)$, $m_4=f(\acute{m}_4, m_3)$, $m_5=f(\acute{m}_5, m_4)$, $m_6=f(\acute{m}_6, m_5)$, $=f(\acute{m}_7, m_6)$, and $m_8=f(\acute{m}_8, m_7)$.

Refer to FIG. 8A. Third reliability $\mathcal{m}_8$ of an eighth group of sub-channels is second reliability $m_8$ of the eighth group of sub-channels; then, third reliability $\mathcal{m}_7$ of a seventh group of sub-channels is a sum of $\acute{m}_8$ and $m_7$; then, third reliability $\mathcal{m}_6$ of a sixth group of sub-channels is a sum of $\acute{m}_7$ and $m_6$; this method is applied by analogy until third reliability of the first group of sub-channels is obtained. This is expressed by using formulas: $\mathcal{m}_8=m_8$, $\mathcal{m}_7=\acute{m}_8+m_7$, $\mathcal{m}_6=\acute{m}_7+m_6$, $\mathcal{m}_5=\acute{m}_6+m_5$, $\mathcal{m}_4=\acute{m}_5+m_4$, $\mathcal{m}_3=\acute{m}_4+m_3$, $\mathcal{m}_2=\acute{m}_3+m_2$, and $\mathcal{m}_1=\acute{m}_2+m_1$.

Figure 8B:
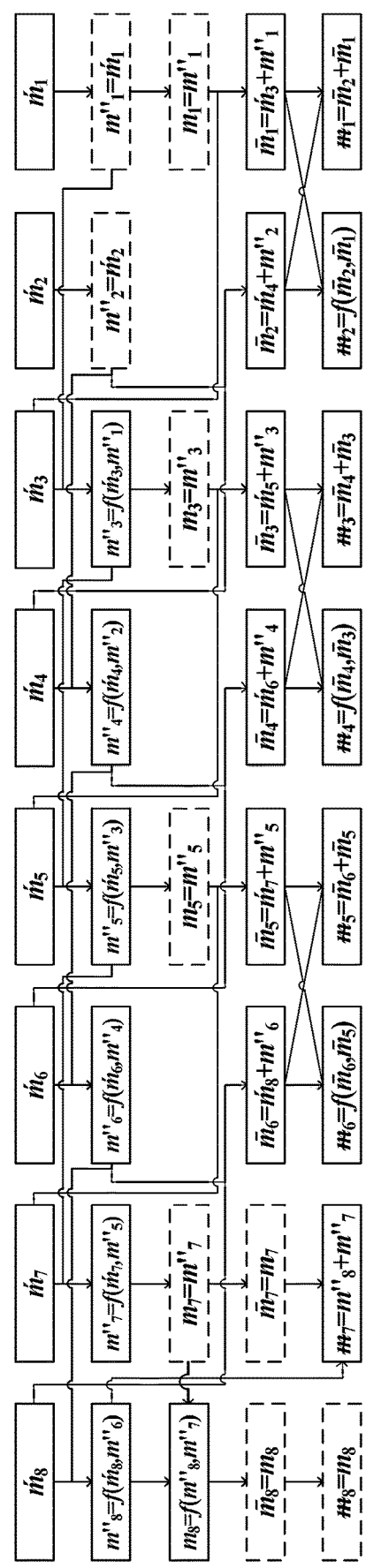
FIG. 8B is a schematic diagram of another decoding process in accordance with some embodiments.

FIG. 8B is a schematic diagram of another decoding process in accordance with some embodiments. Refer to FIG. 8B. $\acute{m}_t$ is input first reliability of an $i^{th}$ group of sub-channels, and an f operation is the same as the f operation shown in FIG. 8A.

First, $m''_i$ is calculated based on $\acute{m}_t$, where $m''_1=\acute{m}_1$, $m''_2=\acute{m}_2$, $m''_3=f(\acute{m}_3, m''_1)$, $m''_4=f(\acute{m}_4, m''_2)$, $m''_5=f(\acute{m}_5, m''_3)$, $m''_6=f(\acute{m}_6, m''_4)$ $m''_7=f(\acute{m}_7, m''_5)$, and $m''_8=f(\acute{m}_8, m''_6)$.

Then, $m_i$ is calculated based on $m''_i$, where $m_1=m''_1$, $m_3=m''_3$, $m_5=m''_5$, $m_7=m''_7$, and $m_8=f(m''_8, m''_7)$.

Then, $\overline{m}_i$ is calculated based on the foregoing calculated parameters, where $\overline{m}_1=\acute{m}_3+m''_1$, $\overline{m}_2=\acute{m}_4+m''_2$, $\overline{m}_3=\acute{m}_5+m''_3$, $\underline{m}_4=\acute{m}_6+m''_4$, $\underline{m}_5=\acute{m}_7+m''_5$, $\underline{m}_6=\acute{m}_8+m''_6$, $\underline{m}_7=m_7$, and $\underline{m}_8=m_8$.

Then, final reliability $\mathcal{m}_i$ of the sub-channels is calculated based on the foregoing calculated parameters, where $\mathcal{m}_1=\underline{m}_2+\underline{m}_1$, $\mathcal{m}_2=f(\underline{m}_2, \underline{m}_1)$, $\mathcal{m}_3=\underline{m}_4+\underline{m}_3$, $\mathcal{m}_4=f(\underline{m}_4, \underline{m}_3)$, $\mathcal{m}_5=\underline{m}_6+\underline{m}_5$, $\mathcal{m}_6=f(\underline{m}_6, \underline{m}_5)$, $\mathcal{m}_7=\underline{m}_8+\underline{m}_7$, and $\mathcal{m}_8=\underline{m}_8$.

The following describes an encoding method in this application with reference to a diagram of encoding.

Figure 9A:
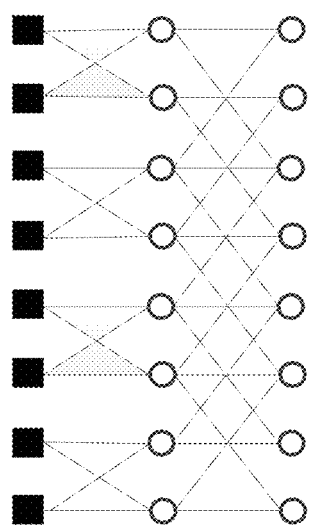
FIG. 9A is another diagram of encoding in accordance with some embodiments.

FIG. 9A is another diagram of encoding according to this embodiment of this application. A second generator matrix corresponding to the diagram of encoding is the second generator matrix in FIG. 6C.

Refer to FIG. 9A. In comparison with the diagram of encoding shown in FIG. 2, a leftmost block in FIG. 9A represents a diagram of encoding short codes, instead of representing one information bit or one frozen bit. For example, a code length of the short code is a size N of a sub-matrix. A circle in each column except a first column represents one part and one bit vector, instead of representing one part and one bit.

In the foregoing diagram of encoding/decoding, a quantity of polarizations (a quantity of columns at stages in the diagram of encoding/decoding) of each short code with a length N is $\log_2(N)$. On this basis, the short code is further polarized twice, and a long code with a code length N' is obtained. Therefore, a quantity of polarizations of the long code with the code length N' is $\log_2(N)+2$, and further, total encoding/decoding complexity is $N'*(\log_2(N)+2)$. Because N is set to a constant that does not vary with N', in response to N' being very large, the constant term is ignored, and encoding/decoding complexity is O(N').

A polar code shown in this application is referred to as a coupling polar code. From a perspective of a diagram of encoding, a diagram of encoding the coupling polar code is considered as recombination or clipping of the original diagram of encoding the long polar code. The following describes the diagram of encoding in detail with reference to FIG. 9B and FIG. 9C.

Figure 9B:
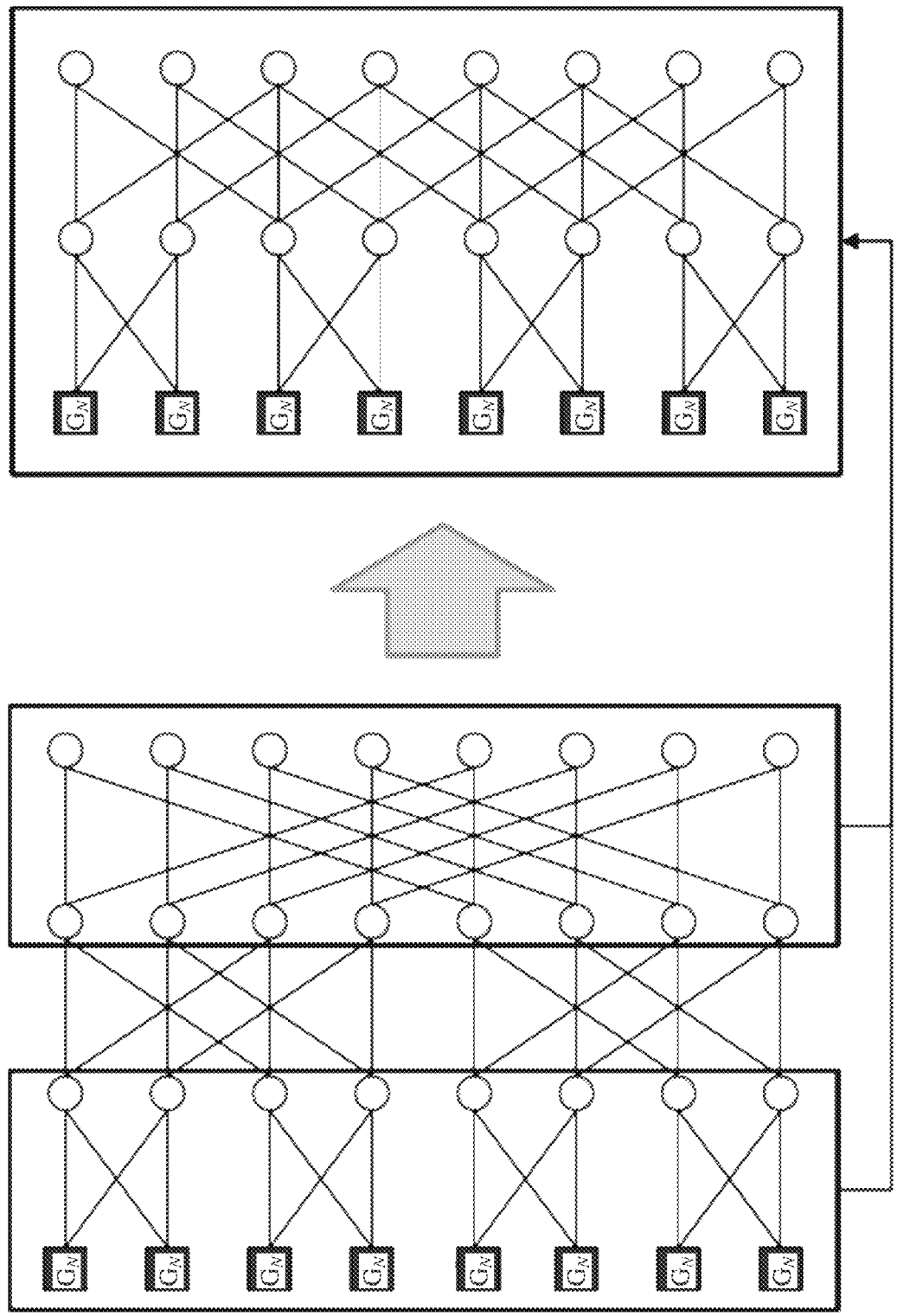
FIG. 9B is still another diagram of encoding in accordance with some embodiments.

FIG. 9B is still another diagram of encoding according to this embodiment of this application. Refer to FIG. 9B. Several columns are extracted from the original diagram of encoding the long polar code, and then combined to obtain a diagram of encoding a coupling polar code.

Figure 9C:
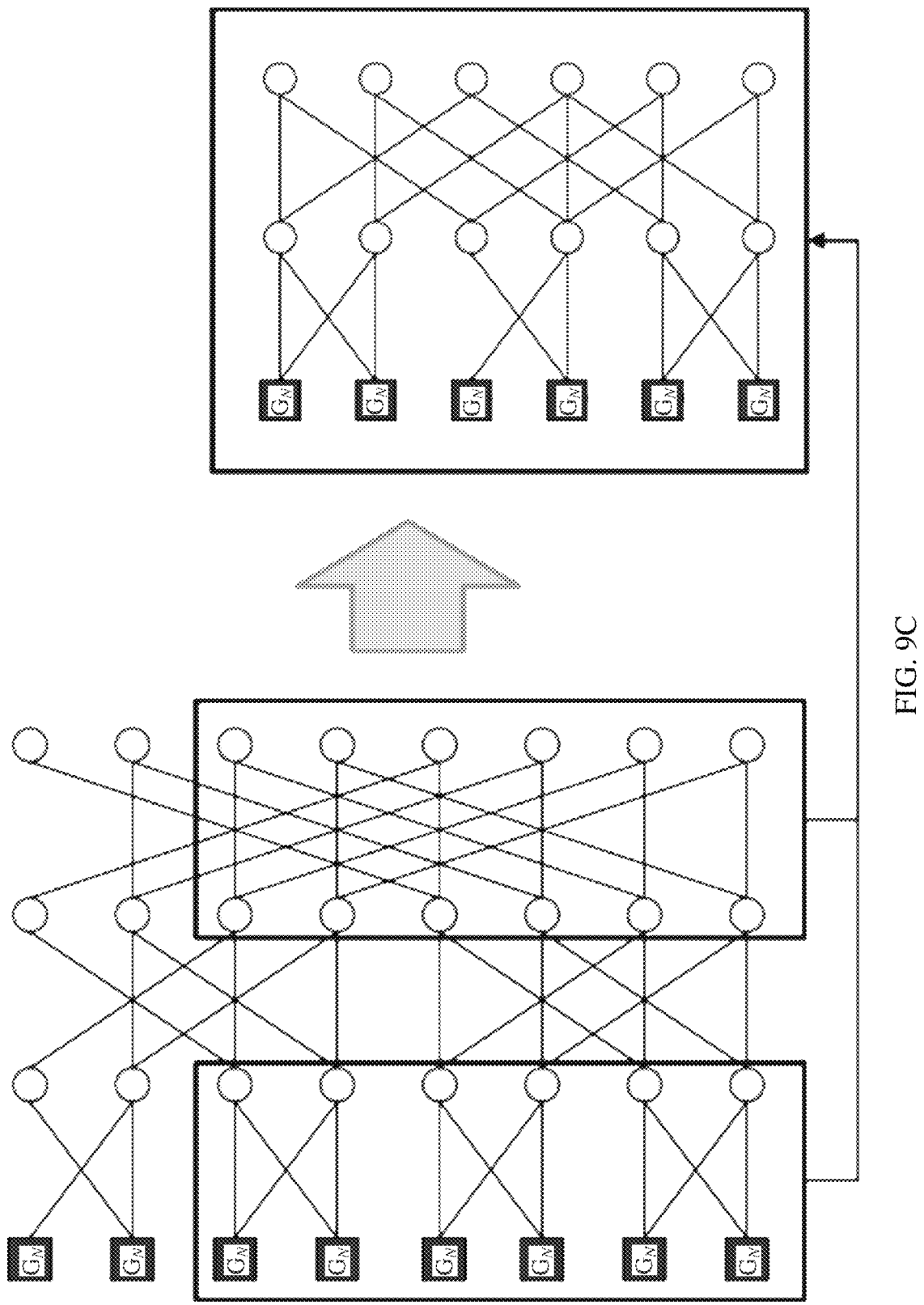
FIG. 9C is yet another diagram of encoding in accordance with some embodiments.

FIG. 9C is yet another diagram of encoding according to this embodiment of this application. Refer to FIG. 9C. Several rows and several columns are extracted from the original diagram of encoding the long polar code, and then combined to obtain a diagram of encoding a coupling polar code.

After obtaining the encoded bits, a transmit end sends the encoded bits. After being rate matched, interleaved, and modulated, the encoded bits are transmitted to a receive end through a channel.

According to the encoding method provided in this embodiment of this application, in response to the K to-be-encoded bits to be encoded, the first generator matrix is first determined, then the second generator matrix is generated based on the first generator matrix, and the K to-be-encoded bits are polar encoded based on the second generator matrix. The first generator matrix includes the at least two sub-blocks distributed based on the preset position relationship, each sub-block includes a plurality of first generator matrix cores, the second generator matrix includes the T sub-blocks, and the position relationship between two adjacent sub-blocks of the T sub-blocks is determined based on the preset position relationship. Therefore, in some embodiments the second generator matrix includes a plurality of sub-blocks arranged according to the foregoing preset position relationship, and each sub-block includes a plurality of first generator matrix cores. Therefore, polar encoding the K to-be-encoded bits based on the second generator matrix is equivalent to: polar encoding a plurality of short codes, and coupling the plurality of short codes to obtain an encoding result. This reduces encoding complexity.

Figure 10:
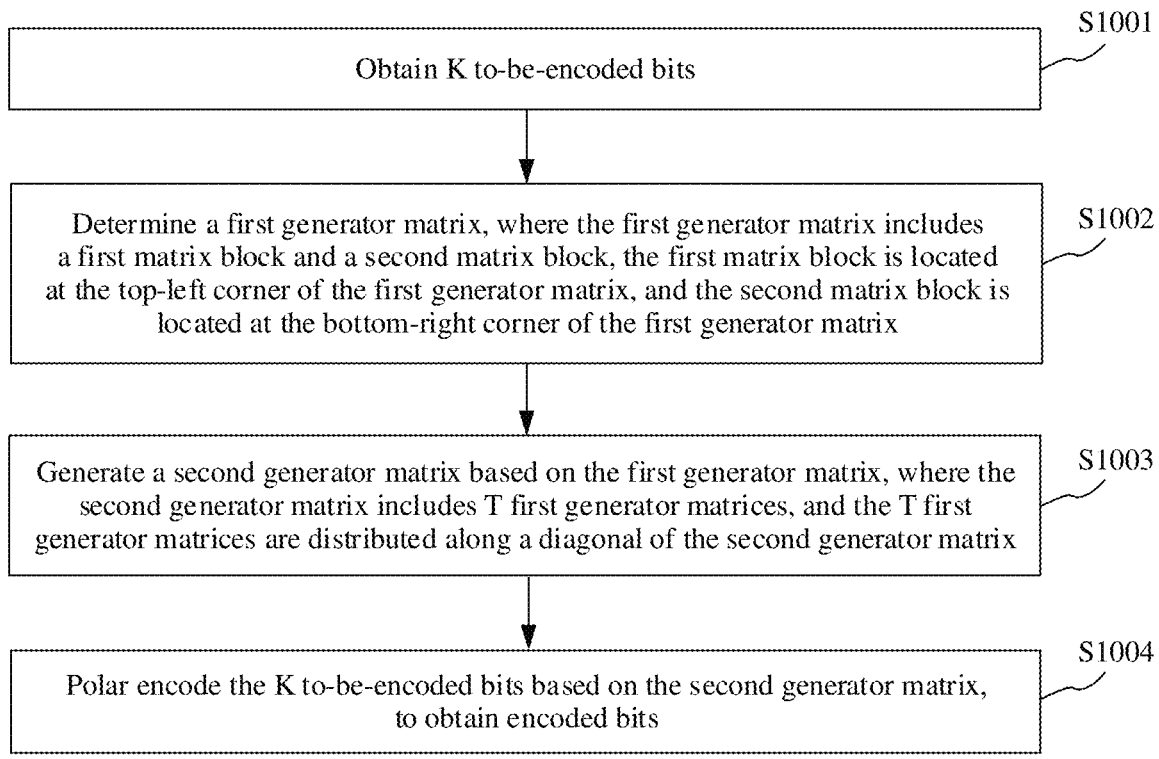
FIG. 10 is a schematic flowchart of another encoding method in accordance with some embodiments.

The following describes another encoding method with reference to FIG. 10.

FIG. 10 is a schematic flowchart of another encoding method in accordance with some embodiments. Refer to FIG. 10. The method includes the following steps.

S1001: Obtain K to-be-encoded bits.

K is a positive integer.

In some embodiments, for a process of performing step S1001, refer to step S301. Details are not described herein again.

S1002: Determine a first generator matrix.

In some embodiments, the first generator matrix in the embodiment in FIG. 10 is equivalent to the sub-block in the embodiment in FIG. 3, and description of the sub-block in the embodiment in FIG. 3 is applicable to the first generator matrix in the embodiment in FIG. 10. Details are not described herein again.

The first generator matrix includes a first matrix block and a second matrix block, the first matrix block is located at the top-left corner of the first generator matrix, the second matrix block is located at the bottom-right corner of the first generator matrix, the first matrix block is the same as the second matrix block, and a distance (which further is a distance between the first matrix block and the second matrix block for short below) between a first element in the first matrix block and a second element in the second matrix block is u in a diagonal direction of the first generator matrix, where u is an integer greater than or equal to 1.

Optionally, the first element is an element at the top-left corner of the first matrix block, and the second element is an element at the top-left corner of the second generator matrix. The distance between the first element and the second element is a difference between row numbers of the first element and the second element or a difference between column numbers of the first element and the second element. For example, the first element is 0 or 1.

Elements in the first generator matrix except the first matrix block and the second matrix block is elements 0.

Optionally, the first matrix block and the second matrix block includes one or more sub-matrices, and the sub-matrix is $G_N$ or $0_N$. Each of the first matrix block and the second matrix block is a square matrix. For description of $G_N$ and $0_N$, refer to the embodiment shown in FIG. 3.

The first generator matrix satisfies self-similarity (or referred to as shift self-similarity). The self-similarity means that after the first matrix block in the first generator matrix moves (for example, moves along a main diagonal of the first generator matrix) by a preset distance, the first matrix block moves to a position of the second matrix block, and content in the first matrix block is the same as that in the second matrix block. In response to the first generator matrix having the self-similarity, elements in the first generator matrix satisfy $\alpha_{i,j}=\alpha_{i+u,j+u}$, where i is an integer, j is an integer, v is a size of the first generator matrix, u is an integer, $1 \leq i < v$, $1 \leq j < v$, $1 < i+u \leq v$, and $1 < j+u \leq v$.

Figure 11A:
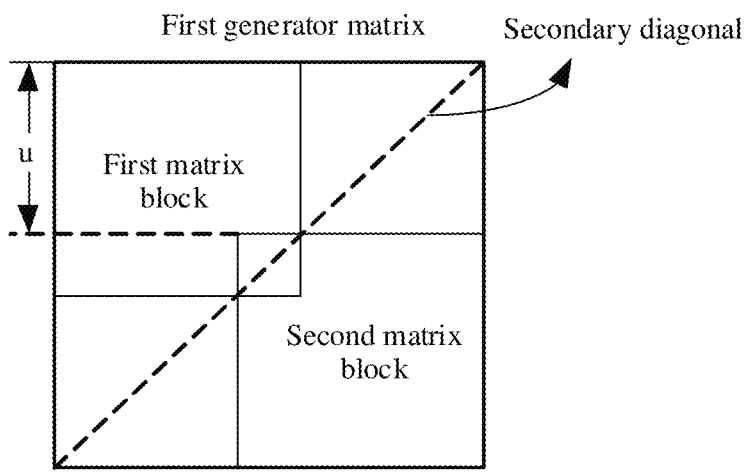
FIG. 11A is a schematic diagram of yet another first generator matrix in accordance with some embodiments.
Figure 11B:
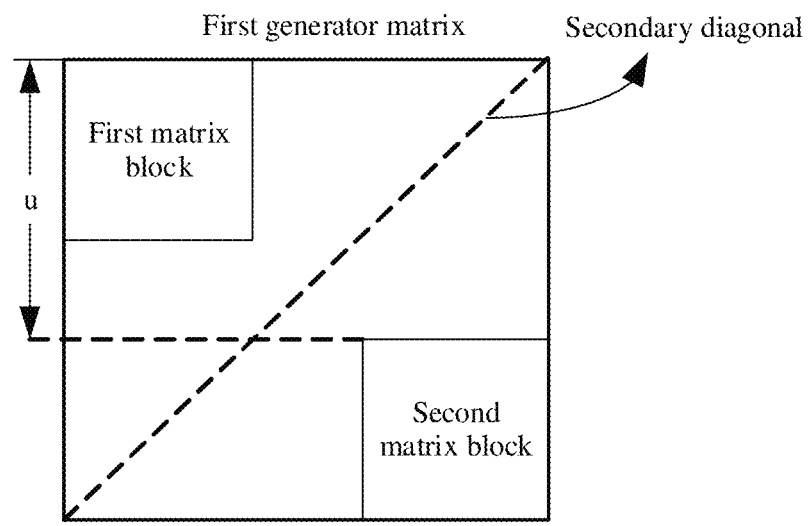
FIG. 11B is a schematic diagram of still yet another first generator matrix in accordance with some embodiments.
Figure 11C:
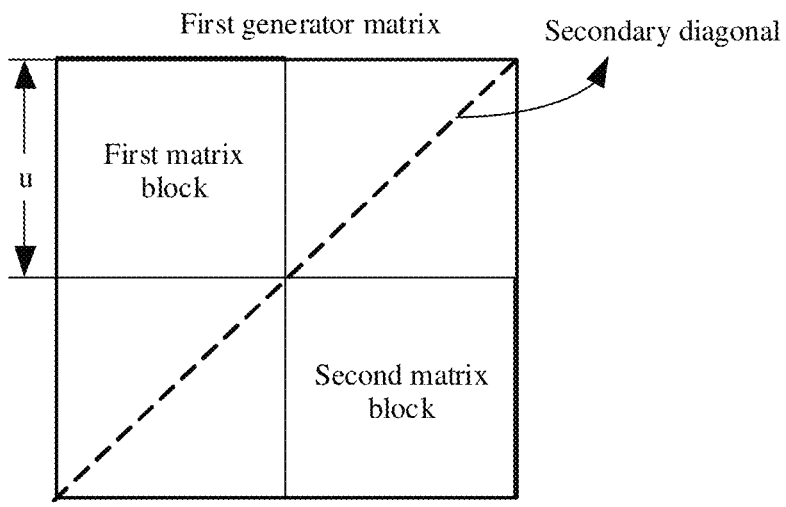
FIG. 11C is a schematic diagram of a further first generator matrix in accordance with some embodiments.

The following describes, with reference to FIG. 11A to FIG. 11C, that the first generator matrix includes a first matrix block and a second matrix block.

FIG. 11A is a schematic diagram of yet another first generator matrix according to this embodiment of this application. Refer to FIG. 11A. The first generator matrix includes a first matrix block and a second matrix block, the first matrix block is located at the top-left corner (or referred to as the top-left corner area) of the first generator matrix, and the second matrix block is located at the bottom-right corner (or referred to as the bottom-right corner area) of the first generator matrix. The first matrix block is the same as the second matrix block. The first generator matrix and a second generator matrix overlap each other.

FIG. 11B is a schematic diagram of still yet another first generator matrix according to this embodiment of this application. Refer to FIG. 11B. The first generator matrix includes a first matrix block and a second matrix block, the first matrix block is located at the top-left corner (or referred to as the top-left corner area) of the first generator matrix, and the second matrix block is located at the bottom-right corner (or referred to as the bottom-right corner area) of the first generator matrix. The first matrix block is the same as the second matrix block. There is a distance between the first generator matrix and a second generator matrix, that is, there is a distance between an element at the bottom-right corner of the first generator matrix (an element 1 for short) and an element at the top-left corner of the second generator matrix (an element 2 for short). For example, a difference between row numbers of element 2 and element 1 is greater than 1.

FIG. 11C is a schematic diagram of a further first generator matrix according to this embodiment of this application. Refer to FIG. 11C. The first generator matrix includes a first matrix block and a second matrix block, the first matrix block is located at the top-left corner (or referred to as the top-left corner area) of the first generator matrix, and the second matrix block is located at the bottom-right corner (or referred to as the bottom-right corner area) of the first generator matrix. The first matrix block is the same as the second matrix block. The first generator matrix is adjacent to a second generator matrix, that is, an element at the bottom-right corner of the first generator matrix (an element 1 for short) is adjacent to an element at the top-left corner of the second generator matrix (an element 2 for short). For example, a row number of the element 2 is greater than that of the element 1 by 1, and a column number of the element 2 is greater than that of element 1 by 1.

Optionally, elements in the first generator matrix are symmetrical along a secondary diagonal of the first generator matrix.

The following shows the first generator matrix by using examples.

Figure 12A:
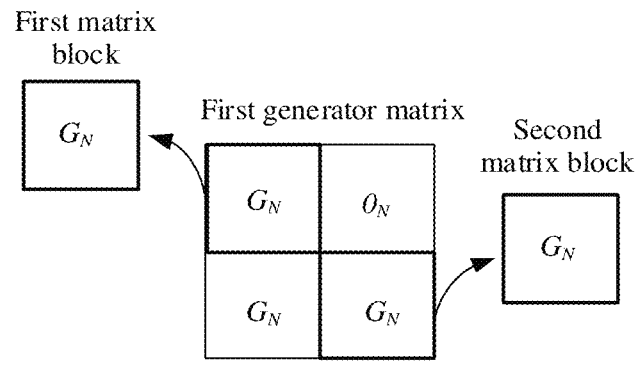
FIG. 12A is a schematic diagram of a still further first generator matrix in accordance with some embodiments.

FIG. 12A is a schematic diagram of a still further first generator matrix according to this embodiment of this application. Refer to FIG. 12A. The first generator matrix includes a first matrix block and a second matrix block, and each of the first matrix block and the second matrix block includes one $G_N$. In response to N being 128, a distance between the first matrix block and the second matrix block is 128.

Figure 12B:
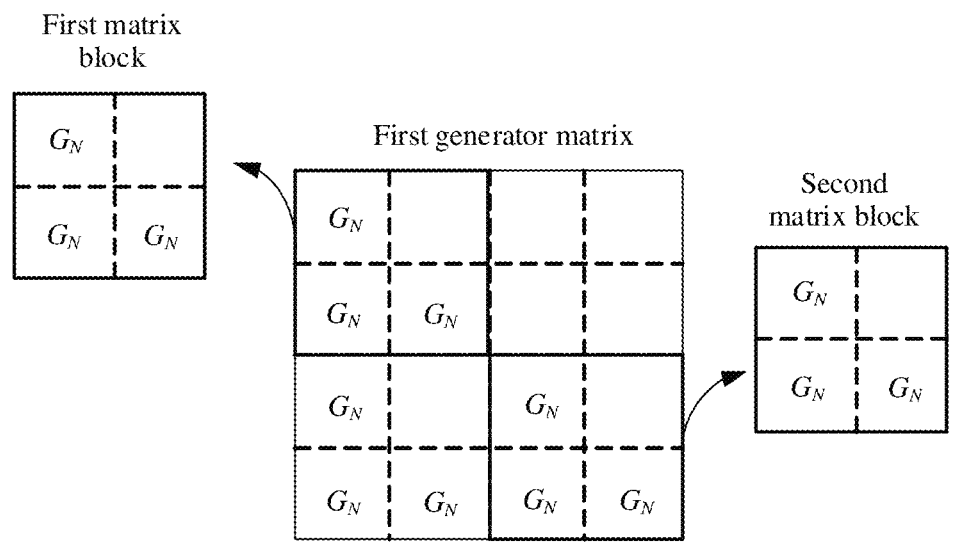
FIG. 12B is a schematic diagram of a yet further first generator matrix in accordance with some embodiments.

FIG. 12B is a schematic diagram of a yet further first generator matrix according to this embodiment of this application. Refer to FIG. 12B, the first generator matrix includes a first matrix block and a second matrix block, and each of the first matrix block and the second matrix block includes four sub-matrices. In response to N being 128, a distance between the first matrix block and the second matrix block is 256.

For ease of description and viewing, in FIG. 12A and FIG. 12B, marks of $0_N$ omitted in the figures, that is, blank sub-matrices in FIG. 12A and FIG. 12B are $0_N$. FIG. 12A and FIG. 12B show examples of the first generator matrix, and do not limit the first generator matrix.

S1003: Determine the second generator matrix based on an encoding length and the first generator matrix.

The second generator matrix includes T first generator matrices, the T first generator matrices are distributed along a diagonal (the diagonal is a main diagonal) of the second generator matrix, and a first matrix block of an $(a+1)^{th}$ first generator matrix in the T first generator matrices overlaps a second matrix block of an $a^{th}$ first generator matrix, where a is an integer greater than or equal to 1, and T is an integer greater than or equal to 2.

The following describes the second generator matrix with reference to FIG. 13.

FIG. 13 is a schematic diagram of yet another second generator matrix according to this embodiment of this application. Refer to FIG. 13. The second generator matrix includes five first generator matrices. The five first generator matrices are distributed along a main diagonal of the second generator matrix, reference numerals of the first generator matrices increase successively in a downward and rightward extension direction of the main diagonal of the second generator matrix, and a matrix at the top-left corner of the second generator matrix is the $1^{st}$ first generator matrix. For example, refer to FIG. 13. A first generator matrix indicated by a reference numeral 1 is the $1^{st}$ first generator matrix, a first generator matrix indicated by a reference numeral 2 is the $2^{nd}$ first generator matrix, and this method is applied by analogy. A first generator matrix indicated by a reference numeral 5 is the $5^{th}$ first generator matrix.

Refer to FIG. 13. A second matrix block of the $1^{st}$ first generator matrix overlaps a first matrix block of the $2^{nd}$ first generator matrix. A second matrix block of the $2^{nd}$ first generator matrix overlaps a first matrix block of the $3^{rd}$ first generator matrix. A second matrix block of the $3^{rd}$ first generator matrix overlaps a first matrix block of the $4^{th}$ first generator matrix. A second matrix block of the $4^{th}$ first generator matrix overlaps a first matrix block of the $5^{th}$ first generator matrix.

T is a minimum integer that enables a first condition to be satisfied, and the first condition is that a size of the second generator matrix is greater than or equal to the encoding length.

For example, T satisfies the following relationship:

$v+(T-2)*u<N'+(T-1)*u$, where v is a size of the first generator matrix, N' is the encoding length, and N' is an integer greater than 1.

For example, in response to the size v of the first generator matrix being 512, the encoding length N' is 2048, and the distance u between two adjacent sub-blocks is 256, T is 7.

For example, in response to the size v of the first generator matrix being 512, the encoding length N' is 1500, and the distance u between two adjacent sub-blocks is 256, T is 5.

Optionally, the quantity T of first generator matrices included in the second generator matrix is determined based on the encoding length and the first generator matrix, and then the second generator matrix is generated based on the first generator matrix and the quantity T. For example, the first generator matrix is copied and moved T−1 times in a direction of the main diagonal of the first generator matrix, to obtain the second generator matrix. A distance for moving once is u, and the moving distance is a quantity of moved rows or columns. For example, in response to three rows being moved by, the moving distance is 3.

Figure 14:
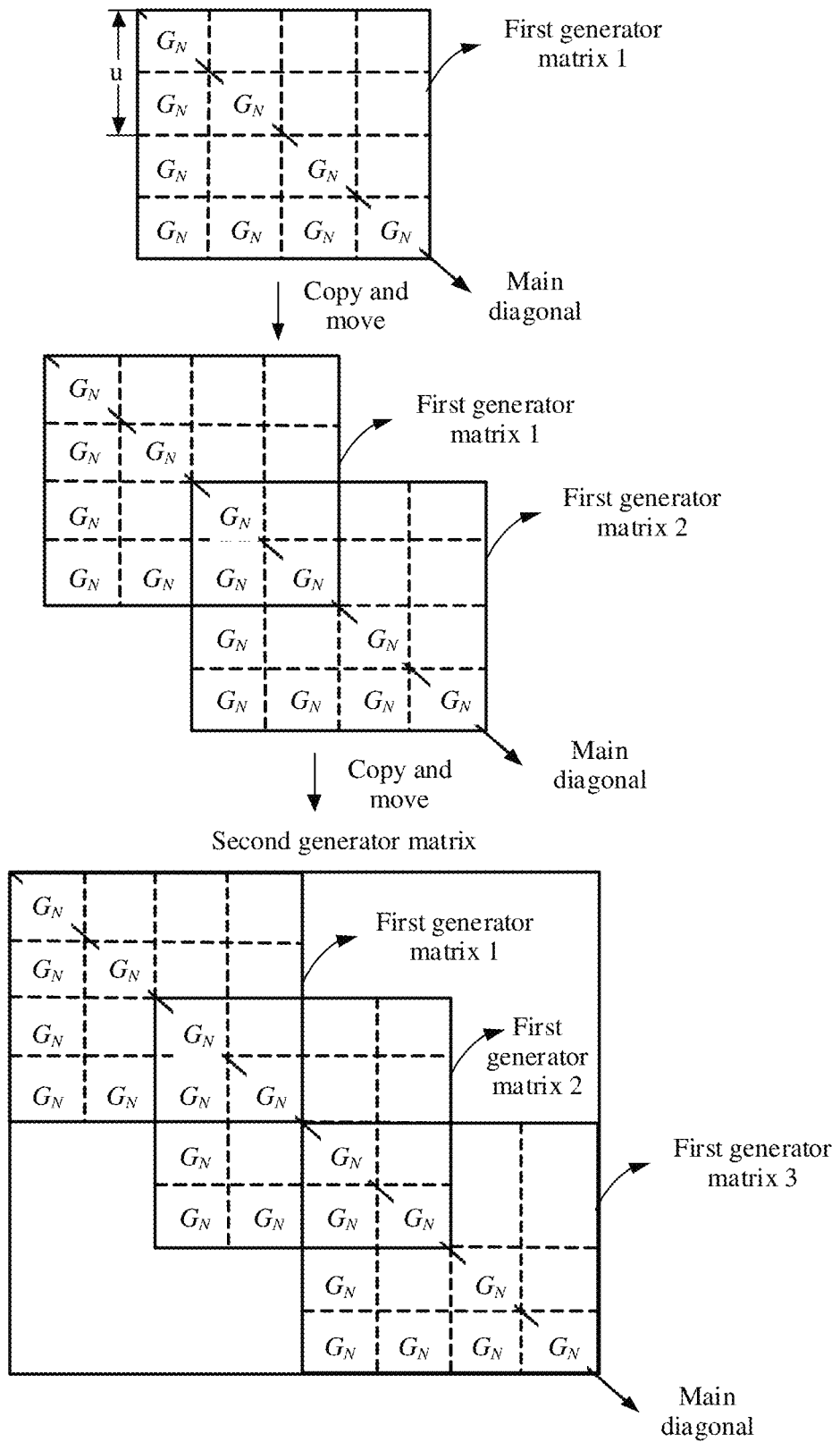
FIG. 14 is a schematic diagram of a process of generating a second generator matrix in accordance with some embodiments.

The following describes, with reference to FIG. 14, a process of generating the second generator matrix based on the first generator matrix.

FIG. 14 is a schematic diagram of a process of generating the second generator matrix according to this embodiment of this application. Refer to FIG. 14. The first generator matrix includes 16 sub-matrices, a part of sub-matrices are $G_N$, and a part of sub-matrices are $0_N$. The first generator matrix satisfies the self-similarity, and a distance (a row spacing or a column spacing) between the first matrix block and the second matrix block in the first generator matrix is u. In response to the second generator matrix including three first generator matrices, a first generator matrix is to be copied and moved twice.

Refer to FIG. 14. In a process of copying and moving for the first time, a first generator matrix 1 is copied, and the copied first generator matrix 1 is moved in a direction of a main diagonal by u rows (a diagonal distance corresponding to the u rows is $\sqrt{2}*u$), to obtain a first generator matrix 2. A first matrix block of the first generator matrix 2 overlaps a second matrix block of the first generator matrix 1.

Refer to FIG. 14. In a process of copying and moving for the second time, the first generator matrix 2 is copied, and the copied first generator matrix 2 is moved by u rows in the direction of the main diagonal (a diagonal distance corresponding to the u rows is J*u), to obtain s first generator matrix 3. A first matrix block of the first generator matrix 3 overlaps a second matrix block of the first generator matrix 2.

It is determined that the second generator matrix includes the first generator matrix 1, the first generator matrix 2, and the first generator matrix 3.

FIG. 14 shows an example manner of generating the second generator matrix based on the first generator matrix, and does not limit the manner. In FIG. 14, sub-matrices except $G_N$ are $0_N$. For ease of description and viewing, marks of $0_N$ omitted in the figure, that is, blank sub-matrices in FIG. 14 are $0_N$.

Figure 15A:
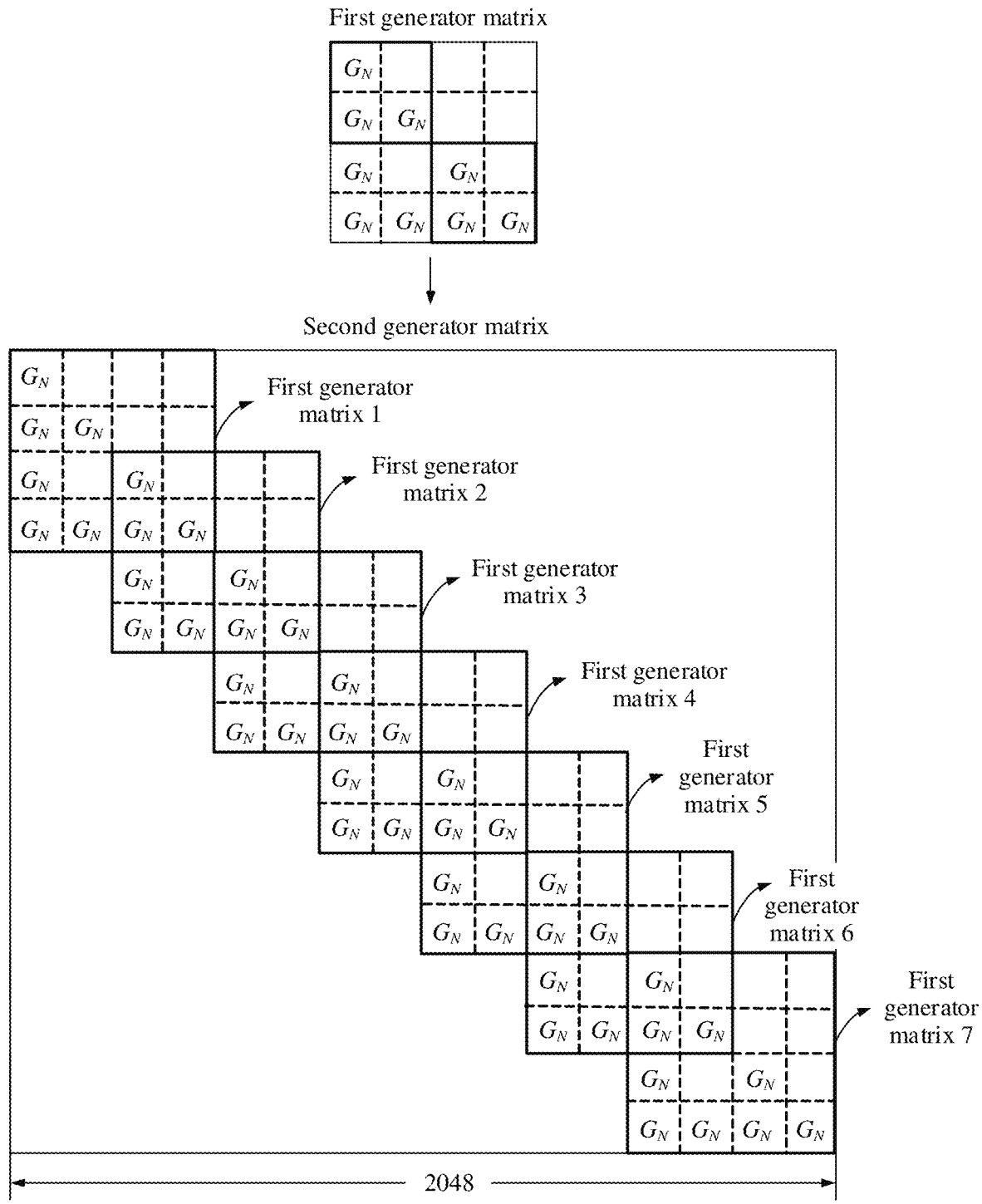
FIG. 15A is a schematic diagram of still yet another second generator matrix in accordance with some embodiments.
Figure 15B:
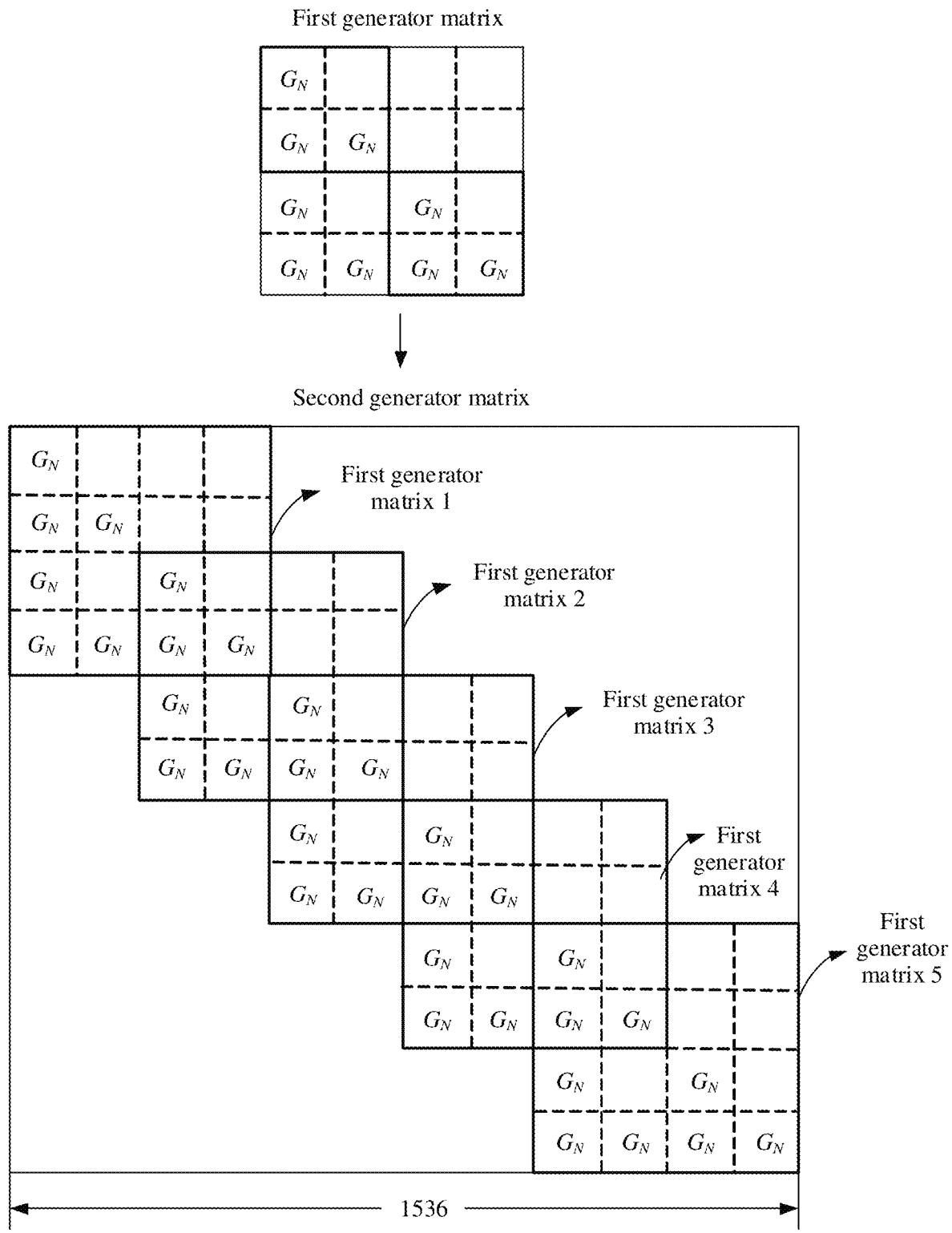
FIG. 15B is a schematic diagram of a further second generator matrix in accordance with some embodiments.
Figure 15C:
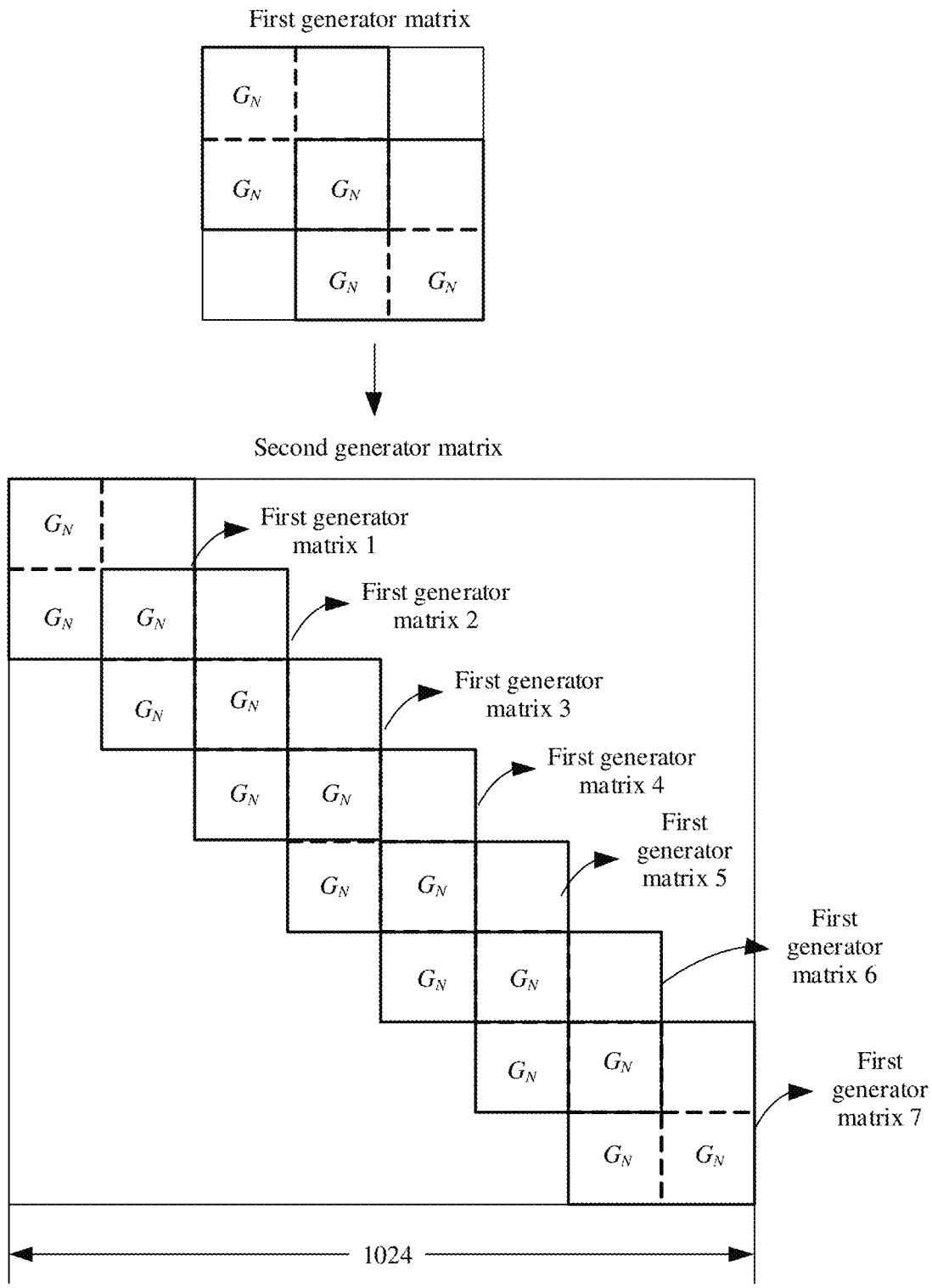
FIG. 15C is a schematic diagram of a still further second generator matrix in accordance with some embodiments.

The following describes, with reference to FIG. 15A to FIG. 15C, the second generator matrix by using examples.

FIG. 15A is a schematic diagram of still yet another second generator matrix according to this embodiment of this application. Refer to FIG. 15A. The first generator matrix includes 16 sub-matrices, a part of sub-matrices are $G_N$, and a part of sub-matrices are $0_N$. The first generator matrix satisfies the self-similarity.

In response to a size of each sub-matrix being 128 (including 128 rows and 128 columns), a size of a sub-block is 512, a distance between two sub-blocks in the first generator matrix is 256. In response to the encoding length N' being 2048, the second generator matrix includes seven first generator matrices, a first matrix block of a latter first generator matrix in each two adjacent generator matrices of the seven first generator matrices overlaps a second matrix block of a former first generator matrix, and a size (a quantity of rows or columns included in the second generator matrix) of the second generator matrix is 2048.

FIG. 15B is a schematic diagram of a further second generator matrix according to this embodiment of this application. Refer to FIG. 15B. The first generator matrix includes 16 sub-matrices, a part of sub-matrices are $G_N$, and a part of sub-matrices are $0_N$. The first generator matrix satisfies the self-similarity.

In response to a size of each sub-matrix being 128 (including 128 rows and 128 columns), a size of a sub-block is 512, a distance between two sub-blocks in the first generator matrix is 256. In response to the encoding length N' being 1500, the second generator matrix includes five first generator matrices, a first matrix block of a latter first generator matrix in each two adjacent generator matrices of the five first generator matrices overlaps a second matrix block of a former first generator matrix, and a size (a quantity of rows or columns included in the second generator matrix) of the second generator matrix is 1536.

FIG. 15C is a schematic diagram of a still further second generator matrix according to this embodiment of this application. Refer to FIG. 15C. The first generator matrix includes 16 sub-matrices, a part of sub-matrices are $G_N$, and a part of sub-matrices are $0_N$. The first generator matrix satisfies the self-similarity.

In response to a size of each sub-matrix being 128 (including 128 rows and 128 columns), a size of a sub-block is 256, a distance between two sub-blocks in the first generator matrix is 128. In response to the encoding length N' being 1024, the second generator matrix includes seven first generator matrices, a first matrix block of a latter first generator matrix in each two adjacent generator matrices of the seven first generator matrices overlaps a second matrix block of a former first generator matrix, and a size (a quantity of rows or columns included in the second generator matrix) of the second generator matrix is 1024.

In FIG. 15A to FIG. 15C, sub-matrices except $G_N$ are $0_N$. For ease of description and viewing, marks of $0_N$ omitted in the figures, that is, blank sub-matrices in FIG. 15A to FIG. 15C are $0_N$.

S1004: Polar encode the K to-be-encoded bits based on the second generator matrix, to obtain encoded bits.

In some embodiments, for a process of performing step S1004, refer to step S304. Details are not described herein again.

According to the encoding method provided in this embodiment of this application, in response to the K to-be-encoded bits to be encoded, the first generator matrix is first determined, then the second generator matrix is generated based on the first generator matrix, and the K to-be-encoded bits are polar encoded based on the second generator matrix. Because the first generator matrix has the self-similarity, and the second generator matrix includes a plurality of first matrix blocks, polar encoding the K to-be-encoded bits based on the second generator matrix is equivalent to: polar encoding a plurality of short codes, and coupling the plurality of short codes, to obtain an encoding result. This reduces encoding complexity.

Based on any one of the foregoing encoding methods, the following describes a decoding method based on the foregoing encoding method.

Figure 16:
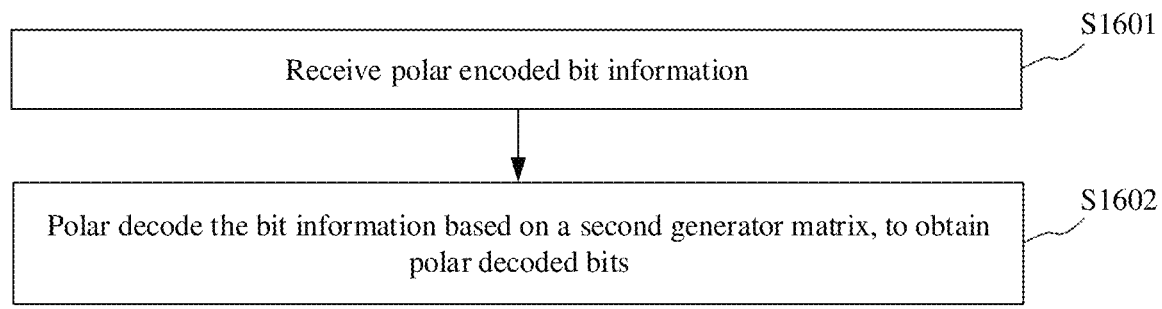
FIG. 16 is a schematic diagram of decoding in accordance with some embodiments.

FIG. 16 is a schematic diagram of decoding in accordance with some embodiments. Refer to FIG. 16. The method includes the following steps.

S1601: Receive polar encoded bit information.

The bit information includes N' first log-likelihood ratio (likelihood rate, LLR) sequences, where N' is a positive integer. For example, after receiving a signal, a receive end performs processing such as demodulation on the signal to obtain N' first LLRs, and performs polar decoding based on the received N' first LLRs. Regardless of whether a transmit end sends a bit 1 or a bit 0, the receive end makes an incorrect determining. Given a signal r, a likelihood ratio is a ratio of a probability p(r|b=0) of correctly determining 0 by the receive end to a probability p(r|b=1)] of correctly determining 1 by the receive end. To facilitate calculation processing, the likelihood ratio is a natural logarithm. In this case, a log-likelihood ratio, that is, LLR=ln[p(r|b=0)/p(r|b=1)], is obtained. The LLR is a floating-point number.

S1602: Polar decode the bit information based on a second generator matrix, to obtain polar decoded bits.

Optionally, the second generator matrix is the polar encoded matrix in the embodiment in FIG. 3. For related description of the second generator matrix, refer to the embodiment shown in FIG. 3. Details are not described herein again.

Optionally, the second generator matrix is the polar encoded matrix in the embodiment in FIG. 10. For related description of the second generator matrix, refer to the embodiment shown in FIG. 10. Details are not described herein again.

In the embodiment shown in FIG. 3 or FIG. 10, the encoded sequence includes the N' unencoded bits, and the N' unencoded bits include the K information bits and the N'—K frozen bits. N' bits includes T groups of unencoded bits, and each group of unencoded bits includes N unencoded bits, that is, N'=N*T.

N' first LLRs include T first LLR sequences. In other words, N' first LLRs are divided into T first LLR sequences, and one of the first LLR sequences includes N LLRs.

One of the first LLR sequences are related to two or more groups of unencoded bits. For example, in response to the encoded sequence including eight groups of unencoded bits, and FIG. 6C shows the second generator matrix, N' first LLRs include eight first LLR sequences, and Table 2 shows a relationship between the eight first LLR sequences and a group of unencoded bits.

TABLE 2

| Identifier of a first LLR sequence | Group of unencoded bits |
|---|---|
| First LLR sequence 1 | First group of unencoded bits and second group of unencoded bits |
| First LLR sequence 2 | Second group of unencoded bits and third group of unencoded bits |
| First LLR sequence 3 | Third group of unencoded bits and fourth group of unencoded bits |
| First LLR sequence 4 | Fourth group of unencoded bits and fifth group of unencoded bits |
| First LLR sequence 5 | Fifth group of unencoded bits and sixth group of unencoded bits |
| First LLR sequence 6 | Sixth group of unencoded bits and seventh group of unencoded bits |

TABLE 2-continued

| Identifier of a first LLR sequence | Group of unencoded bits |
|---|---|
| First LLR sequence 7 | Seventh group of unencoded bits and eighth group of unencoded bits |
| First LLR sequence 8 | Eighth group of unencoded bits |

Refer to Table 2. The first LLR sequence 1 is related to the first group of unencoded bits and the second group of unencoded bits, the first LLR sequence 2 is related to the second group of unencoded bits and the third group of unencoded bits, and this method is applied by analogy.

To perform accurate decoding, the first LLR sequence is decoupled to obtain a second LLR sequence corresponding to each first LLR sequence, so that one second LLR sequence corresponds to one group of unencoded bits. For example, the first LLR sequences shown in Table 2 are decoupled to obtain eight second LLR sequences. Table 3 shows a relationship between the eight second LLR sequences and the groups of unencoded bits.

TABLE 3

| Identifier of a first LLR sequence | Group of unencoded bits |
|---|---|
| First LLR sequence 1 | First group of unencoded bits |
| First LLR sequence 2 | Second group of unencoded bits |
| First LLR sequence 3 | Third group of unencoded bits |
| First LLR sequence 4 | Fourth group of unencoded bits |
| First LLR sequence 5 | Fifth group of unencoded bits |
| First LLR sequence 6 | Sixth group of unencoded bits |
| First LLR sequence 7 | Seventh group of unencoded bits |
| First LLR sequence 8 | Eighth group of unencoded bits |

Refer to Table 2. The first LLR sequence 1 is related to the first group of unencoded bits, the first LLR sequence 2 is related to the second group of unencoded bits, and this method is applied by analogy.

Optionally, a second LLR sequence is determined based on a first LLR sequence in the following manner determining an $i^{th}$ second LLR sequence based on an $i^{th}$ first LLR sequence and at least one of first (i−1) second LLR sequences, where i is an integer between 2 and T.

Optionally, polar decoding is performed based on the T second LLR sequences in the following manner determining to obtain a $T^{th}$ decoding result based on a $T^{th}$ second LLR sequence; and determining an $i^{th}$ decoding result based on the $i^{th}$ second LLR sequence and at least one of an $(i+1)^{th}$ decoding result to the $T^{th}$ decoding result, where i is an integer between 1 and T−1.

The following describes, by using examples, a process of determining the second LLR sequence and performing polar decoding based on the T second LLR sequences.

Example 1: In some embodiments the second generator matrix is the second generator matrix shown in FIG. 6C, and encoding corresponding to the second generator matrix further is referred to as two-coupling encoding.

The $i^{th}$ second LLR sequence is determined in the following manner determining the $i^{th}$ second LLR sequence based on the $i^{th}$ first LLR sequence and an $(i−1)^{th}$ second LLR sequence, wherein a $1^{st}$ second LLR sequence is the same as the $1^{st}$ first LLR sequence.

The $i^{th}$ decoding result is determined in the following manner determining the $i^{th}$ decoding result based on the $(i+1)^{th}$ decoding result, an $(i+1)^{th}$ first LLR sequence, and an $i^{th}$ second LLR sequence.

Figure 17:
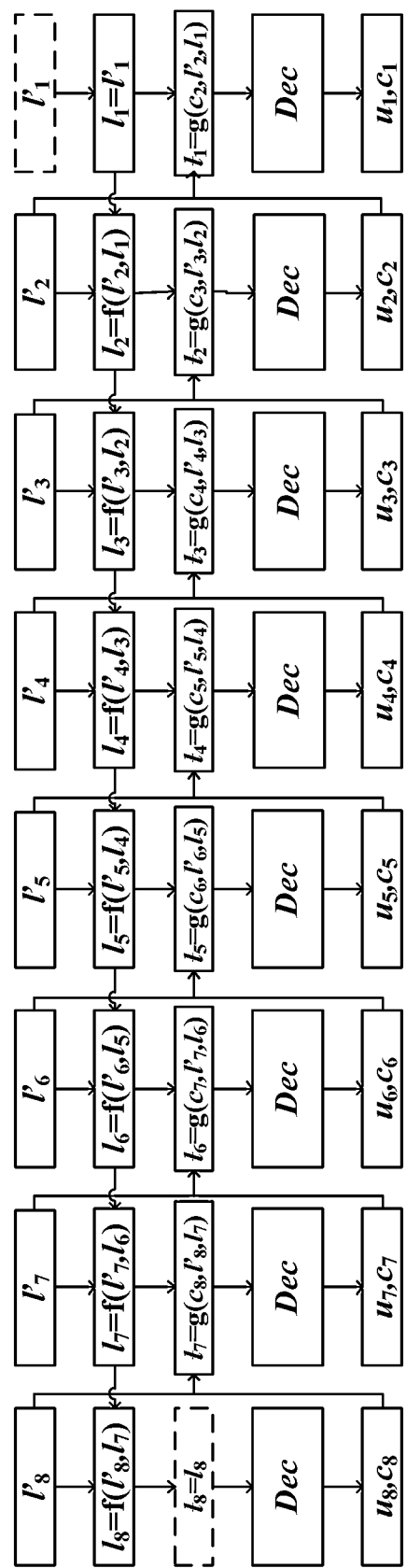
FIG. 17 is a schematic diagram of a decoding process in accordance with some embodiments.

The following describes, with reference to FIG. 17, a decoding process corresponding to the foregoing second generator matrix.

FIG. 17 is a schematic diagram of a decoding process according to this embodiment of this application. Refer to FIG. 17, $l'_i$ is an $i^{th}$ first LLR sequence, $l_i$ is an $i^{th}$ second LLR sequence, $u_i$ is an unencoded $i^{th}$ bit sequence, and $c_i$ is an encoded $i^{th}$ bit sequence, where i is an integer between 1 and 8. An f operation is: $f(L_1, L_2) = sgn(L_1) sgn(L_2) min(|L_1|, |L_2|)$. A g operation is: $g(u, L_1, L_2) = (-1)^{\hat{u}_1^{2i-1}} L_1 + L_2$, and c is encoded to obtain u.

After receiving the N' LLRs, the receive end divides the received N' LLRs into eight first LLR sequences, where the eight first LLR sequences are denoted as $l'_1, l'_2, l'_3, l'_4, l'_5, l'_6, l'_7$, and $l'_8$. Second LLR sequences corresponding to the eight first LLR sequences are denoted as $l_1, l_2, l_3, l_4, l_5, l_6, l_7$, and $l_8$.

Refer to FIG. 17. The $1^{st}$ second LLR sequence $l_1$ is first determined, an f operation is performed on the $1^{st}$ second LLR sequence $l_1$ and the $2^{nd}$ first LLR sequence $l_2$ to obtain the $2^{nd}$ second LLR sequence $l_2$, an f operation is performed on the $2^{nd}$ second LLR sequence $l_2$ and the $3^{rd}$ first LLR sequence 13 to obtain the $3^{rd}$ second LLR sequence $l_3$, and this method is applied by analogy until the eight second LLR sequences are obtained. This is expressed by using formulas: $l_1' = l_2 = f(l'_2, l_1), l_3 = f(l'_3, l_2), l_4 = (l'_4, l_3), l_5 = (l'_5, l_4), l_6 = f(l'_6, l_5), l_7 = f(l'_7, l_6)$, and $l_8 = f(l'_8, l_7)$.

Refer to FIG. 17, the $8^{th}$ second LLR sequence $l_8$ is first input into a decoder for decoding, to obtain an $8^{th}$ decoding result $u_8$, where $u_8$ includes N decoded bits. $u_8$ is encoded to obtain an $8^{th}$ encoded bit sequence $c_8$. A g operation is performed on $c_8, l'_8$, and $l_7$ to obtain a g operation result $l_8$, and the g operation result $l_8$ is input into the decoder for decoding, to obtain a $7^{th}$ decoding result $u_7$. $u_7$ is encoded to obtain a $7^{th}$ encoded bit sequence $c_7$. A g operation is performed on $c_7, l'_7$, and $l_6$ to obtain a g operation result $l_7$, and the g operation result $l_7$ is input into the decoder for decoding, to obtain a $6^{th}$ decoding result $u_6$. This method is applied by analogy until a $1^{st}$ decoding result $u_1$ is determined.

Example 2: In some embodiments the second generator matrix is the second generator matrix shown in FIG. 14, and encoding corresponding to the second generator matrix further is referred to as four-coupling encoding.

The $i^{th}$ second LLR sequence is determined in the following manner determining the $i^{th}$ second LLR sequence based on the $i^{th}$ first LLR sequence and an $(i−2)^{th}$ second LLR sequence, where i is an integer between 3 and T. A $1^{st}$ second LLR sequence is the same as a $1^{st}$ first LLR sequence, and a $2^{nd}$ second LLR sequence is the same as a $2^{nd}$ first LLR sequence.

Figure 18:
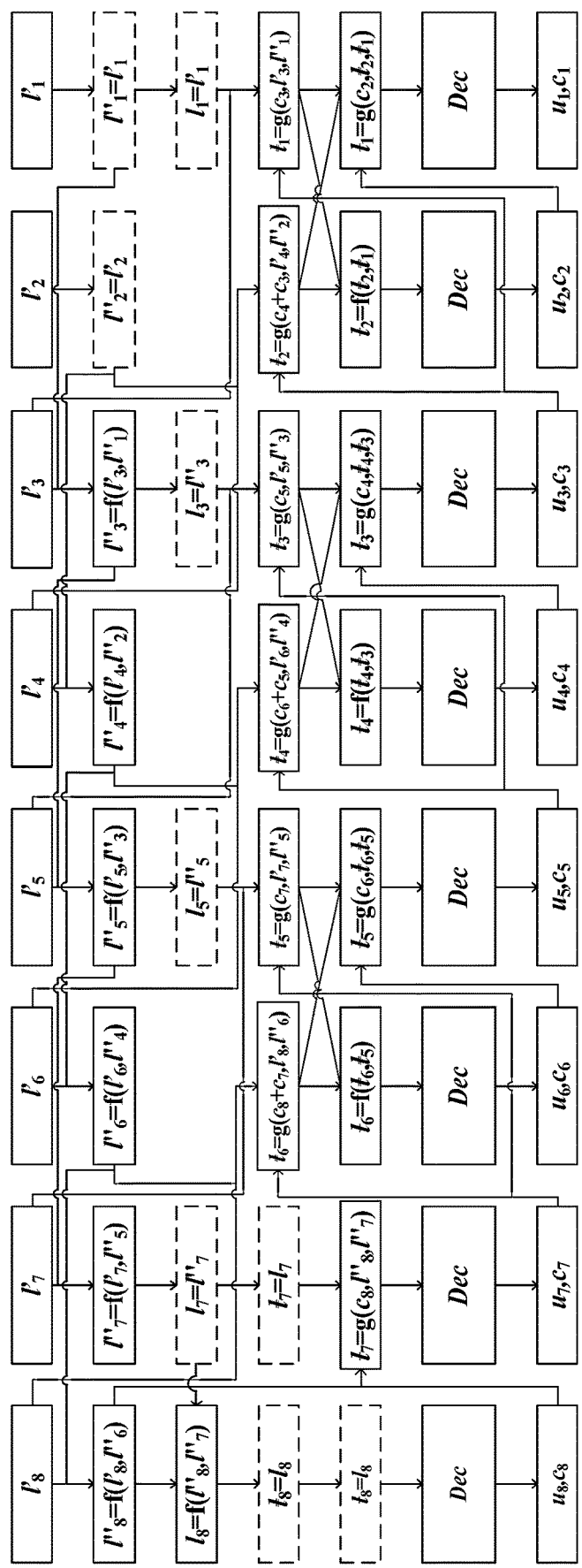
FIG. 18 is a schematic diagram of another decoding process in accordance with some embodiments.

The following describes, with reference to FIG. 18, a decoding process corresponding to the foregoing second generator matrix.

FIG. 18 is a schematic diagram of another decoding process according to this embodiment of this application. An f operation in FIG. 18 is the same as the g operation in FIG. 17.

Refer to FIG. 17. $l'_i$ is the $i^{th}$ first LLR sequence. After receiving the N' LLRs, the receive end divides the received N' LLRs into eight first LLR sequences, where the eight first LLR sequences are denoted as $l'_1, l'_2, l'_3, l'_4, l'_5, l'_6, l'_7$, and $l'_8$.

First, $l''_i$ is calculated based on $l'_i$, where $l''_1 = l'_1, l''_2 = l'_2, l''_3 = f(l'_3, l''_1), l''_4 = f(l'_4, l''_2), l''_5 = f(l'_5, l''_3), l''_6 = f(l'_6, l''_4), l''_7 = f(l'_7, l''_5)$, and $l''_8 = f(l'_8, l''_6)$. $l''_i$ is the $i^{th}$ second LLR sequence.

Then, $l_i$ is calculated based on $l''_i$, where $l_8=f(l''_8, l''_7)$, $l_7=l''_7$, $l_5=l_3=l''_3$, and $l_1=l''_1$.

Then, decoding is performed based on the foregoing calculated parameters: $l_8$ is input into a decoder for decoding, to obtain an $8^{th}$ decoding result $u_8$, where $u_8$ includes N decoded bits. $u_8$ is encoded to obtain an $8^{th}$ encoded bit sequence $c_8$. A g operation is performed on $c_8$, and and a g operation result $l_7$ is input into the decoder for decoding, to obtain a $7^{th}$ decoding result $u_7$. $u_7$ is encoded to obtain a $7^{th}$ encoded bit sequence $c_7$. A g operation is performed on $c_8+c_7$, $l''_8$, and $l''_6$ to obtain a g operation result $l_6$, and a g operation is performed on $l_6$ and $l_5$ to obtain a g operation result $l_6$, where $l_5$ is a result of a g operation on $c_7$, $l'_2$, and $l''_5$. $l_6$ is input into the decoder for decoding, to obtain a $6^{th}$ decoding result $u_6$. This method is applied by analogy until a $1^{st}$ decoding result $u_1$ is determined.

Figure 19:
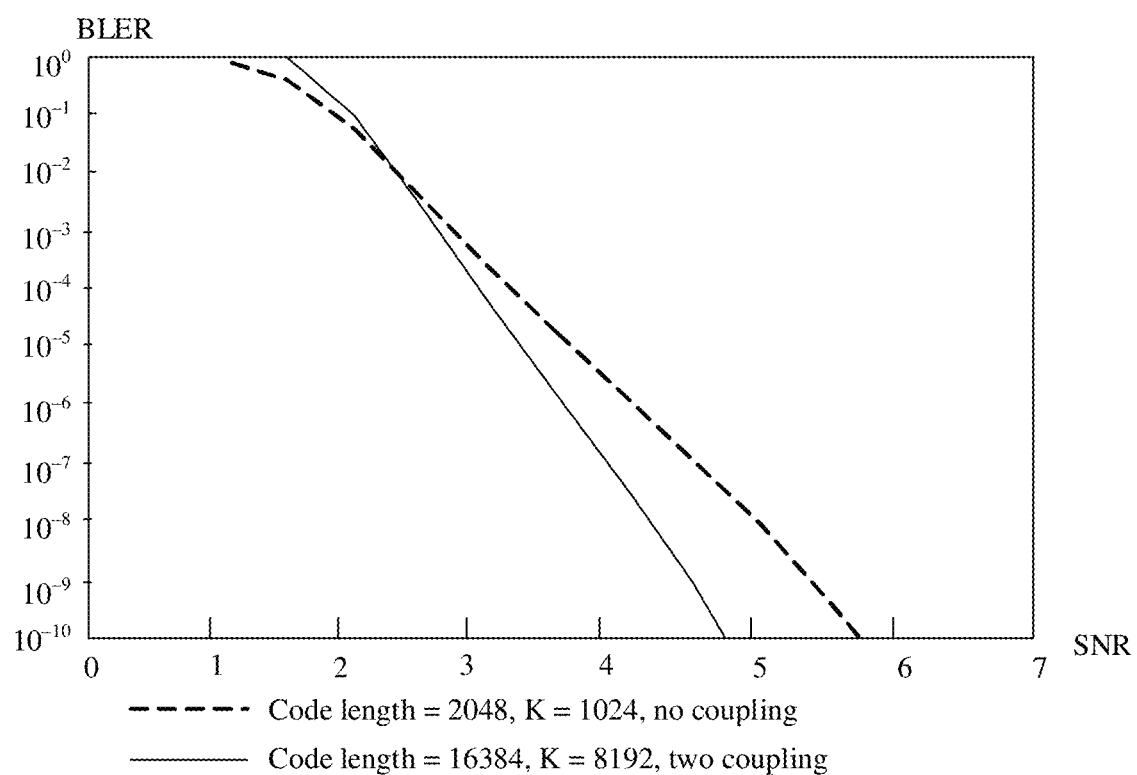
FIG. 19 is a schematic diagram of decoding performance in accordance with some embodiments.

The following describes decoding performance of a decoding method in this application with reference to FIG. 19.

FIG. 19 is a schematic diagram of decoding performance in accordance with some embodiments. Refer to FIG. 19. A horizontal axis represents a signal-to-noise ratio (SNR), and a vertical axis represents a block error rate (BLER).

Refer to FIG. 19. In response to a code length being 2048, a quantity of information bits is 1024, and no coupling is performed (an existing manner), a dashed line shows a performance curve. In response to the code length being 16384, the quantity K of information bits is 8129, and a two-coupling operation is performed (for example, FIG. 6C shows the second generator matrix), a solid line shows a performance curve. From FIG. 19 a performance gain is about 1 dB in the manner shown in this application.

In an application process, compared with a long polar code, a coupling polar code has less complexity without a performance loss. In response to the code length increasing to a value, coupling in a larger range is unable to bring a significant performance gain. The following provides description with reference to FIG. 20A.

Figure 20A:
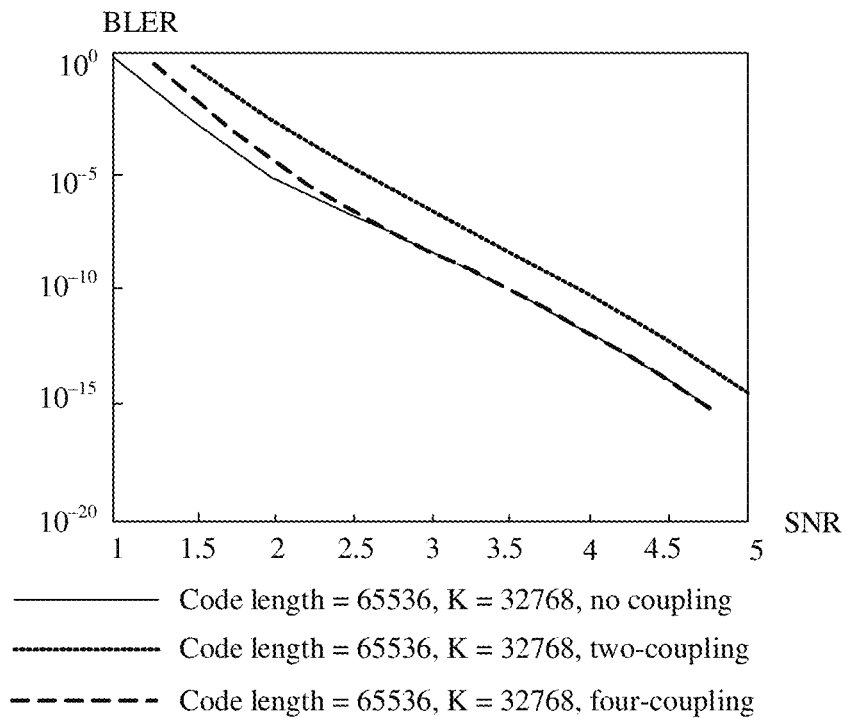
FIG. 20A is another schematic diagram of decoding performance in accordance with some embodiments.

FIG. 20A is another schematic diagram of decoding performance according to this embodiment of this application. Refer to FIG. 20A. In response to the code length being 65536, the quantity K of information bits is 32768, and no coupling is performed (an existing manner), a solid line shows a performance curve. In response to the code length being 65536, the quantity K of information bits is 32768, and a two-coupling operation is performed (for example, FIG. 6C shows the second generator matrix), a dashed line shows a performance curve. In response to the code length being 65536, the quantity K of information bits is 32768, and a four-coupling operation is performed (for example, FIG. 14 shows the second generator matrix), another dashed line shows a performance curve.

Figure 20B:
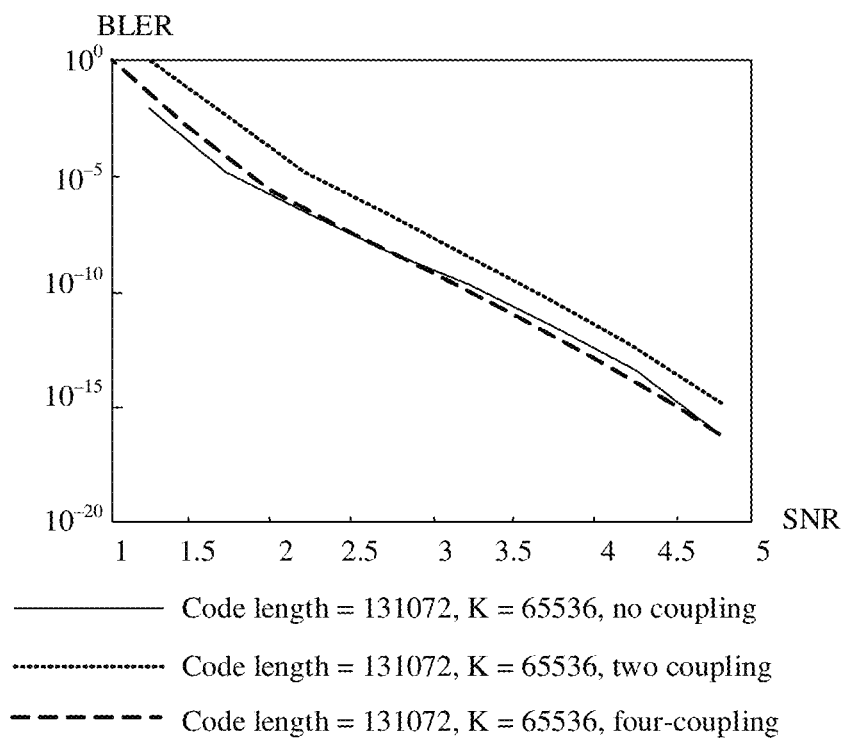
FIG. 20B is still another schematic diagram of decoding performance in accordance with some embodiments.

FIG. 20B is still another schematic diagram of decoding performance according to this embodiment of this application. Refer to FIG. 20B. In response to the code length being 131072, the quantity K of information bits is 65536, and no coupling is performed (an existing manner), a solid line shows a performance curve. In response to the code length being 131072, the quantity K of information bits is 65536, and a two-coupling operation is performed (for example, FIG. 6C shows the second generator matrix), a dashed line shows a performance curve. In response to the code length being 131072, the quantity K of information bits is 65536, and a four-coupling operation is performed (for example, FIG. 14 shows the second generator matrix), another dashed line shows a performance curve.

In response to a coupling range being larger, encoding/decoding complexity is higher. In addition, from FIG. 20A and FIG. 20B, that a coupling range or width is limited to some extent, or an appropriate coupling degree is selected, so that software and hardware implementation complexity is reduced as much as possible without a performance loss.

Figure 21:
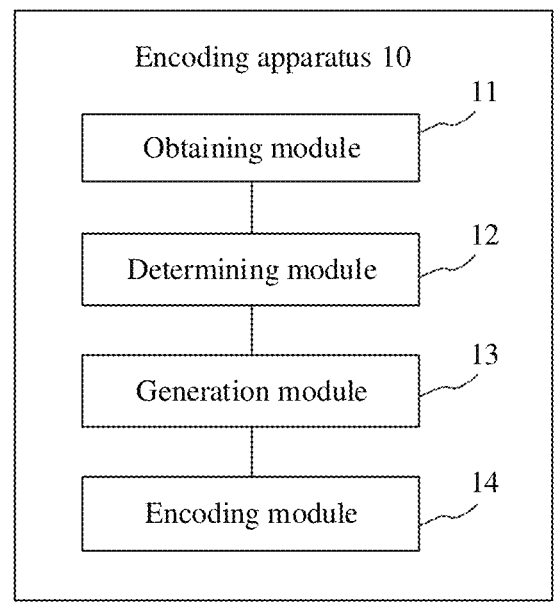
FIG. 21 is a schematic diagram of a structure of an encoding apparatus in accordance with some embodiments.

FIG. 21 is a schematic diagram of a structure of an encoding apparatus in accordance with some embodiments. Refer to FIG. 21. The encoding apparatus 10 includes an obtaining module 11, a determining module 12, a generation module 13, and an encoding module 14.

The obtaining module 11 is configured to obtain K to-be-encoded bits, where K is a positive integer.

The determining module 12 is configured to determine a first generator matrix. The first generator matrix includes at least two sub-blocks distributed based on a preset position relationship, and the sub-block includes a plurality of first generator matrix cores.

The generation module 13 is configured to generate a second generator matrix based on the first generator matrix. The second generator matrix includes T sub-blocks, and a position relationship between two adjacent sub-blocks of the T sub-blocks is determined based on the preset position relationship, where T is a positive integer.

The encoding module 14 is configured to polar encode the K to-be-encoded bits based on the second generator matrix, to obtain encoded bits.

Optionally, the obtaining module 11 performs step S301 in the embodiment in FIG. 3.

Optionally, the determining module 12 performs step S302 in the embodiment in FIG. 3.

Optionally, the generation module 13 performs step S303 in the embodiment in FIG. 3.

Optionally, the encoding module 14 performs step S304 in the embodiment in FIG. 3.

In some embodiments, the encoding apparatus shown implements the technical solutions shown in the foregoing method embodiments. Implementation principles and beneficial effects thereof are similar to those of the method embodiments. Details are not described herein again.

In some embodiments, the position relationship between two adjacent sub-blocks of the T sub-blocks is the same as the preset position relationship.

In some embodiments, an overlapping portion exists in the at least two sub-blocks.

In some embodiments, a first diagonal of the sub-block comprises the first generator matrix cores.

In some embodiments, the plurality of first generator matrix cores in the sub-block are distributed in a lower triangular form.

In some embodiments, distribution of the first generator matrix cores in the sub-block is the same as distribution of first elements in a second generator matrix core, a quantity of elements included in the second generator matrix core is the same as a quantity of sub-matrices included in the sub-block, and a sub-matrix included in the sub-block is the first generator matrix core or a zero matrix.

In some embodiments, the first generator matrix includes two sub-blocks.

In some embodiments, the quantity of sub-matrices included in the sub-block is 2*2, and the sub-matrix included in the sub-block is the first generator matrix core or the zero matrix.

In some embodiments, the first generator matrix includes a first sub-block and a second sub-block, and a first sub-matrix in the first sub-block overlaps a second sub-matrix in the second sub-block; and coordinates of the first sub-matrix in the first sub-block are (2, 2), and coordinates of the second sub-matrix in the second sub-block are (1, 1).

In some embodiments, the quantity of sub-matrices included in the sub-block is 4*4, and the sub-matrix included in the sub-block is the first generator matrix core or the zero matrix.

In some embodiments, the first generator matrix includes a first sub-block and a second sub-block, and four first sub-matrices in the first sub-block overlap four second sub-matrices in the second sub-block.

Coordinates of the four first sub-matrices in the first sub-block are (3, 3), (3, 4), (4, 3), and (4, 4); and
  coordinates of the four second sub-matrices in the second sub-block are (1, 1), (1, 2), (2, 1), and (2, 2).

In some embodiments, the K to-be-encoded bits are information bits. The encoding module 14 is configured to:
  determine K sub-channels with highest reliability in a plurality of sub-channels corresponding to the K to-be-encoded bits;
  determine positions of the K to-be-encoded bits based on the K sub-channels with the highest reliability;
  determine a to-be-encoded sequence based on the positions of the K to-be-encoded bits, where the to-be-encoded sequence comprises the K to-be-encoded bits and frozen bits; and
  polar encode the to-be-encoded sequence based on the second generator matrix, to obtain the encoded bits.

In some embodiments, the plurality of sub-channels include P groups of sub-channels,
  where P is a positive integer. The encoding module 14 is configured to:
  determine $X_i$ first sub-channels from an $i^{th}$ group of sub-channels based on reliability of the $i^{th}$ group of sub-channels, where the $X_i$ first sub-channels are $X_i$ sub-channels with highest reliability in the $i^{th}$ group of sub-channels, i is an integer, $1 \leq i \leq P$, $X_i$ is a positive integer, and $\Sigma_{i=1}^{i=P} X_i = K$.

The K sub-channels with the highest reliability include the first sub-channels.

In some embodiments, the encoding apparatus shown implements the technical solutions shown in the foregoing method embodiments. Implementation principles and beneficial effects thereof are similar to those of the method embodiments. Details are not described herein again.

Figure 22:
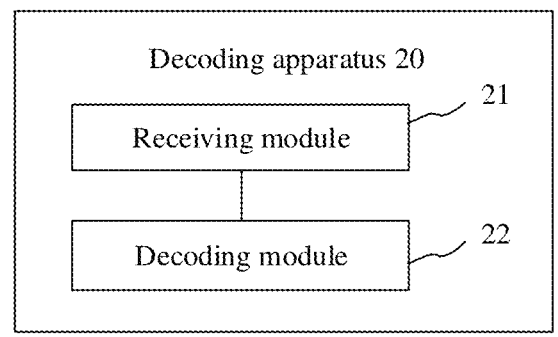
FIG. 22 is a schematic diagram of a structure of a decoding apparatus in accordance with some embodiments.

FIG. 22 is a schematic diagram of a structure of a decoding apparatus in accordance with some embodiments. Refer to FIG. 22. The decoding apparatus 20 includes a receiving module 21 and a decoding module 22.

The receiving module 21 is configured to receive polar encoded bit information.

The decoding module 22 is configured to polar decode the bit information based on a second generator matrix, to obtain polar decoded bits.

The second generator matrix is generated based on a first generator matrix, the first generator matrix includes at least two sub-blocks distributed based on a preset position relationship, the sub-block includes a plurality of first generator matrix cores, the second generator matrix includes T sub-blocks, and a position relationship between two adjacent sub-blocks of the T sub-blocks is determined based on the preset position relationship, where T is a positive integer.

Optionally, the receiving module 21 performs step S1601 in the embodiment in FIG. 16.

Optionally, the decoding module 22 performs step S1602 in the embodiment in FIG. 16.

In some embodiments, the decoding apparatus shown implements the technical solutions shown in the foregoing method embodiments. Implementation principles and beneficial effects thereof are similar to those of the method embodiments. Details are not described herein again.

In some embodiments, the position relationship between two adjacent sub-blocks of the T sub-blocks is the same as the preset position relationship.

In some embodiments, an overlapping portion exists in the at least two sub-blocks.

In some embodiments, a first diagonal of the sub-block includes the first generator matrix cores.

In some embodiments, the plurality of first generator matrix cores in the sub-block are distributed in a lower triangular form.

In some embodiments, distribution of the first generator matrix cores in the sub-block is the same as distribution of first elements in a second generator matrix core, a quantity of elements included in the second generator matrix core is the same as a quantity of elements included in the sub-block, and an element included in the sub-block is the first generator matrix core or a zero matrix.

In some embodiments, the first generator matrix includes two sub-blocks.

In some embodiments, the quantity of elements included in the sub-block is 2*2, and the element included in the sub-block is the first generator matrix core or the zero matrix.

In some embodiments, the first generator matrix includes a first sub-block and a second sub-block, and a first element in the first sub-block overlaps a second element in the second sub-block; and
  coordinates of the first element in the first sub-block are (2, 2), and coordinates of the second element in the second sub-block are (1, 1).

In some embodiments, the quantity of elements included in the sub-block is 4*4, and the element included in the sub-block is the first generator matrix core or the zero matrix.

In some embodiments, the first generator matrix includes a first sub-block and a second sub-block, and four first elements in the first sub-block overlap four second elements in the second sub-block.

Coordinates of the four first elements in the first sub-block are (3, 3), (3, 4), (4, 3), and (4, 4); and
  coordinates of the four second elements in the second sub-block are (1, 1), (1, 2), (2, 1), and (2, 2).

In some embodiments, the bit information includes N' first log-likelihood ratio LLR sequences, where N' is a positive integer.

In some embodiments, the N' first LLRs include T first LLR sequences, and the first LLR sequence includes at least two first LLRs. The decoding module 22 is configured to:
  determine T second LLR sequences corresponding to the T first LLR sequences, where one of the first LLR sequences corresponds to one or more groups of unencoded bits, and one of the second LLR sequences corresponds to one group of unencoded bits; and
  perform polar decoding based on the T second LLR sequences.

In some embodiments, the decoding module 22 is configured to:
  determine an $i^{th}$ second LLR sequence based on an $i^{th}$ first LLR sequence and at least one of first (i−1) second LLR sequences, where i is an integer between 2 and T.

In some embodiments, a coupling degree of a code block is 2. The decoding module 22 is configured to:

determine the $i^{th}$ second LLR sequence based on the $i^{th}$ first LLR sequence and an $(i-1)^{th}$ second LLR sequence.

In some embodiments, a $1^{st}$ second LLR sequence is the same as a $1^{st}$ first LLR sequence.

In some embodiments, a coupling degree of a code block is 4. The decoding module 22 is configured to:
determine the $i^{th}$ second LLR sequence based on the $i^{th}$ first LLR sequence and an $(i-2)^{th}$ second LLR sequence, where i is an integer between 3 and T.

In some embodiments, a $1^{st}$ second LLR sequence is the same as a $1^{st}$ first LLR sequence; and
a $2^{nd}$ second LLR sequence is the same as a $2^{nd}$ first LLR sequence.

In some embodiments, the decoding module 22 is configured to:
determine to obtain a $T^{th}$ decoding result based on a $T^{th}$ second LLR sequence; and
determine an $i^{th}$ decoding result based on the $i^{th}$ second LLR sequence and at least one of an $(i+1)^{th}$ decoding result to the $T^{th}$ decoding result, where i is an integer between 1 and T-1.

In some embodiments, a coupling degree of a code block is 2. The decoding module 22 is configured to:
determine the $i^{th}$ decoding result based on the $(i+1)^{th}$ decoding result, an $(i+1)^{th}$ first LLR sequence, and the $i^{th}$ second LLR sequence.

In some embodiments, the decoding apparatus shown implements the technical solutions shown in the foregoing method embodiments. Implementation principles and beneficial effects thereof are similar to those of the method embodiments. Details are not described herein again.

Figure 23:
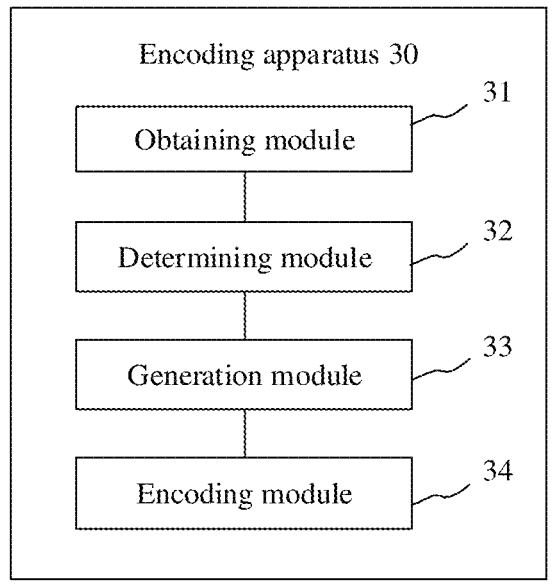
FIG. 23 is a schematic diagram of a structure of another encoding apparatus in accordance with some embodiments.

FIG. 23 is a schematic diagram of a structure of another encoding apparatus in accordance with some embodiments. Refer to FIG. 23. The encoding apparatus 30 includes an obtaining module 31, a determining module 32, a generation module 33, and an encoding module 34.

The obtaining module 31 is configured to obtain K to-be-encoded bits, where K is a positive integer.

The determining module 32 is configured to determine a first generator matrix. The first generator matrix includes a first matrix block and a second matrix block, the first matrix block is located at the top-left corner of the first generator matrix, the second matrix block is located at the bottom-right corner of the first generator matrix, the first matrix block is the same as the second matrix block, and a distance between a first element in the first matrix block and a second element in the second matrix block is u in a diagonal direction of the first generator matrix, where u is an integer greater than or equal to 1.

The generation module 33 is configured to generate a second generator matrix based on an encoding length and the first generator matrix. The second generator matrix includes T first generator matrices, the T first generator matrices are distributed along a diagonal of the second generator matrix, and a first matrix block of an $(a+1)^{th}$ first generator matrix in the T first generator matrices overlaps a second matrix block of an $a^{th}$ first generator matrix, where a is an integer greater than or equal to 1, and T is an integer greater than or equal to 2.

The encoding module 34 is configured to polar encode the K to-be-encoded bits based on the second generator matrix, to obtain encoded bits.

Optionally, the obtaining module 31 performs step S1001 in the embodiment in FIG. 10.

Optionally, the determining module 32 performs step S1002 in the embodiment in FIG. 10.

Optionally, the generation module 33 performs step S1003 in the embodiment in FIG. 10.

Optionally, the encoding module 34 performs step S1004 in the embodiment in FIG. 10.

In some embodiments, the encoding apparatus shown implements the technical solutions shown in the foregoing method embodiments. Implementation principles and beneficial effects thereof are similar to those of the method embodiments. Details are not described herein again.

In some embodiments, no overlapping element exists in the first matrix block and the second matrix block.

In some embodiments, a size of the first generator matrix is v*v, and an element in the first generator matrix satisfies $\alpha_{i,j}=\alpha_{i+u,j+u}$, where
i is an integer, j is an integer, v is a positive integer, u is an integer, $1 \le i < v$, $1 \le j < v$, $1 < i+u \le v$, and $1 < j+u \le v$.

In some embodiments, elements in the first generator matrix are symmetrical along a secondary diagonal of the first generator matrix.

In some embodiments, T is a minimum integer that enables a first condition to be satisfied, and the first condition is that a size of the second generator matrix is greater than or equal to the encoding length.

In some embodiments, T satisfies the following relationship:

$v+(T-1)*u < N' \le v+T*u$, where v is the size of the first generator matrix, N' is the encoding length, and N' is an integer greater than 1.

In some embodiments, the encoding apparatus shown implements the technical solutions shown in the foregoing method embodiments. Implementation principles and beneficial effects thereof are similar to those of the method embodiments. Details are not described herein again.

Figure 24:
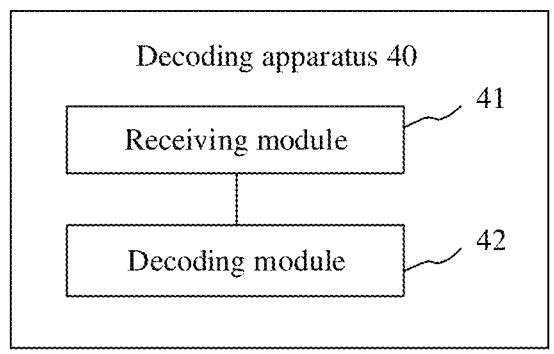
FIG. 24 is a schematic diagram of a structure of another decoding apparatus in accordance with some embodiments.

FIG. 24 is a schematic diagram of a structure of another decoding apparatus in accordance with some embodiments. Refer to FIG. 24. The decoding apparatus 40 includes a receiving module 41 and a decoding module 42.

The receiving module 41 is configured to receive polar encoded bit information.

The decoding module 42 is configured to polar decode the bit information based on a second generator matrix, to obtain polar decoded bits. The second generator matrix is generated based on a first generator matrix.

The first generator matrix includes a first matrix block and a second matrix block, the first matrix block is located at the top-left corner of the first generator matrix, the second matrix block is located at the bottom-right corner of the first generator matrix, the first matrix block is the same as the second matrix block, and a distance between a first element in the first matrix block and a second element in the second matrix block is u in a diagonal direction of the first generator matrix, where u is an integer greater than or equal to 1.

The second generator matrix includes T first generator matrices, the T first generator matrices are distributed along a diagonal of the second generator matrix, and a first matrix block of an $(a+1)^{th}$ first generator matrix in the T first generator matrices overlaps a second matrix block of an $a^{th}$ first generator matrix, where a is an integer greater than or equal to 1, and T is an integer greater than or equal to 2.

Optionally, the receiving module 41 performs step S1601 in the embodiment in FIG. 16.

Optionally, the decoding module 42 performs step S1602 in the embodiment in FIG. 16.

In some embodiments, the decoding apparatus shown implements the technical solutions shown in the foregoing method embodiments. Implementation principles and beneficial effects thereof are similar to those of the method embodiments. Details are not described herein again.

In some embodiments, no overlapping element exists in the first matrix block and the second matrix block.

In some embodiments, a size of the first generator matrix is v*v, and an element in the first generator matrix satisfies $\alpha_{i,j}=\alpha_{i+u,j+u}$, where i is an integer, j is an integer, v is a positive integer, u is an integer, 1≤i<v, 1≤j<v, 1<i+u≤v, and 1<j+u≤v.

In some embodiments, elements in the first generator matrix are symmetrical along a secondary diagonal of the first generator matrix.

In some embodiments, T is a minimum integer that enables a first condition to be satisfied, and the first condition is that a size of the second generator matrix is greater than or equal to the encoding length.

In some embodiments, T satisfies the following relationship:

$$v+(T-1)*u<N'\le v+T*u, \text{ where}$$

v is the size of the first generator matrix, N' is the encoding length, and N' is an integer greater than 1.

In some embodiments, the bit information includes N' first log-likelihood ratio LLR sequences, where N' is a positive integer.

In some embodiments, the N' first LLRs include T first LLR sequences, and the first LLR sequence includes at least two first LLRs. The decoding module 42 is configured to:

determine T second LLR sequences corresponding to the T first LLR sequences, where one of the first LLR sequences corresponds to one or more groups of unencoded bits, and one of the second LLR sequences corresponds to one group of unencoded bits; and perform polar decoding based on the T second LLR sequences.

In some embodiments, the decoding module 42 is configured to:

determine an $i^{th}$ second LLR sequence based on an $i^{th}$ first LLR sequence and at least one of first (i−1) second LLR sequences, where i is an integer between 2 and T.

In some embodiments, a coupling degree of a code block is 2. The decoding module 42 is configured to:

determine the $i^{th}$ second LLR sequence based on the $i^{th}$ first LLR sequence and an $(i-1)^{th}$ second LLR sequence.

In some embodiments, a $1^{st}$ second LLR sequence is the same as a $1^{st}$ first LLR sequence.

In some embodiments, a coupling degree of a code block is 4. The decoding module 42 is configured to:

determine the $i^{th}$ second LLR sequence based on the $i^{th}$ first LLR sequence and an $(i-2)^{th}$ second LLR sequence, where i is an integer between 3 and T.

In some embodiments, a $1^{st}$ second LLR sequence is the same as a $1^{st}$ first LLR sequence; and a $2^{nd}$ second LLR sequence is the same as a $2^{nd}$ first LLR sequence.

In some embodiments, the decoding module 42 is configured to:

determine to obtain a $T^{th}$ decoding result based on a $T^{th}$ second LLR sequence; and determine an $i^{th}$ decoding result based on the $i^{th}$ second LLR sequence and at least one of an $(i+1)^{th}$ decoding result to the $T^{th}$ decoding result, where i is an integer between 1 and T−1.

In some embodiments, a coupling degree of a code block is 2. The decoding module 42 is configured to:

determine the $i^{th}$ decoding result based on the $(i+1)^{th}$ decoding result, an $(i+1)^{th}$ first LLR sequence, and the $i^{th}$ second LLR sequence.

In some embodiments, the decoding apparatus shown implements the technical solutions shown in the foregoing method embodiments. Implementation principles and beneficial effects thereof are similar to those of the method embodiments. Details are not described herein again.

Figure 25:
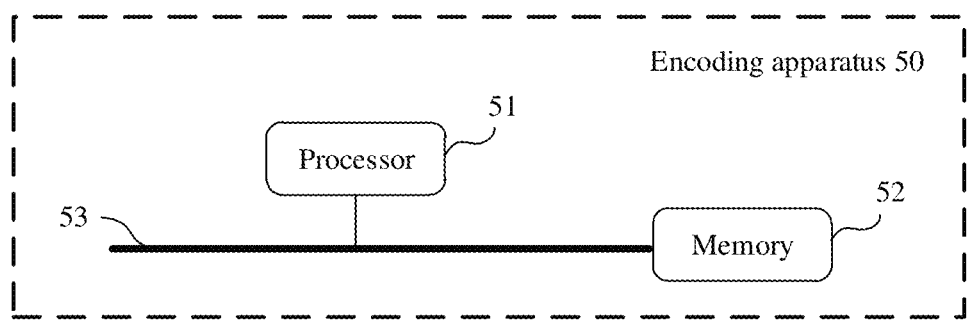
FIG. 25 is a schematic diagram of a hardware structure of still another encoding apparatus in accordance with some embodiments.

FIG. 25 is a schematic diagram of a hardware structure of still another encoding apparatus in accordance with some embodiments. Refer to FIG. 25. The encoding apparatus 50 includes a processor 51 and a memory 52.

The memory 52 is configured to store a computer program, and is further configured to store intermediate data.

The processor 51 is configured to execute the computer program stored in the memory, to implement the steps in the foregoing encoding methods. For details, refer to related description in the foregoing method embodiments.

Optionally, the memory 52 is independent, or is integrated with the processor 51. In some implementations, the memory 52 even is located outside the encoding apparatus 50.

In response to the memory 52 being a component independent of the processor 51, the encoding apparatus 50 further includes a bus 53 configured to connect the memory 52 and the processor 51.

Optionally, the encoding apparatus 50 further includes a transmitter. For example, the transmitter is configured to send encoded bits.

The encoding apparatus 50 provided in this embodiment is a terminal device or a network device, and is configured to perform the foregoing encoding methods. Implementations and technical effects thereof are similar to those of the encoding methods. Details are not described herein again in this embodiment.

Figure 26:
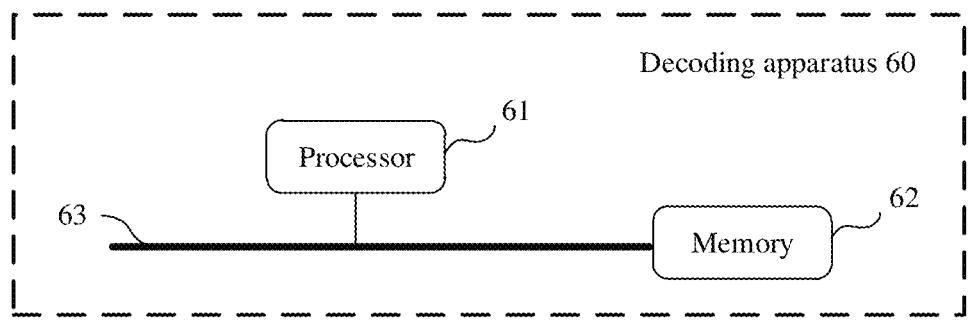
FIG. 26 is a schematic diagram of a hardware structure of still another decoding apparatus in accordance with some embodiments.

FIG. 26 is a schematic diagram of a hardware structure of still another decoding apparatus in accordance with some embodiments. Refer to FIG. 26. The decoding apparatus 60 includes a processor 61 and a memory 62.

The memory 62 is configured to store a computer program, and is further configured to store intermediate data.

The processor 61 is configured to execute the computer program stored in the memory, to implement the steps in the foregoing decoding methods. For details, refer to related description in the foregoing method embodiments.

Optionally, the memory 62 is independent, or is integrated with the processor 61. In some implementations, the memory 62 even is located outside the decoding apparatus 60.

In response to the memory 62 being a device independent of the processor 61, the decoding apparatus 60 further includes a bus 63 configured to connect the memory 62 and the processor 61.

Optionally, the decoding apparatus 60 further includes a receiver. For example, the receiver is configured to receive polar encoded bit information.

The decoding apparatus 60 provided in this embodiment is a terminal device or a network device, and is configured to perform the foregoing decoding methods. Implementations and technical effects thereof are similar to those of the decoding methods. Details are not described herein again in this embodiment.

Figure 27:
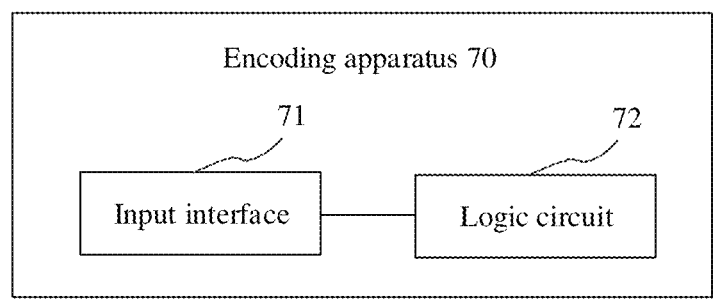
FIG. 27 is a schematic diagram of a structure of yet another encoding apparatus in accordance with some embodiments.

FIG. 27 is a schematic diagram of a structure of yet another encoding apparatus in accordance with some embodiments. Refer to FIG. 27. The encoding apparatus 70 includes an input interface 71 and a logic circuit 72.

The input interface 71 is configured to obtain K to-be-encoded bits, where K is a positive integer.

The logic circuit 72 is configured to: determine a first generator matrix, where the first generator matrix includes at least two sub-blocks distributed based on a preset position relationship, and the sub-block includes a plurality of first generator matrix cores; generate a second generator matrix based on the first generator matrix, where the second generator matrix includes T sub-blocks, and a position relationship between two adjacent sub-blocks of the T sub-blocks is determined based on the preset position relationship, where T is a positive integer; and polar encode the K to-be-encoded bits based on the second generator matrix, to obtain encoded bits.

Optionally, the input interface 71 is configured to have functions of the obtaining module 11 in the embodiment in FIG. 21. The logic circuit 72 is configured to have functions of the determining module 11, the generation module 13, and the encoding module 14 in the embodiment in FIG. 21.

Optionally, the logic circuit 72 is configured to have functions of the processor 61 in the embodiment in FIG. 25. The logic circuit 72 further performs other steps in the encoding methods.

Optionally, the encoding apparatus 70 further includes an output interface. For example, the output interface outputs encoded bits.

The encoding apparatus 70 provided implements the technical solutions shown in the foregoing method embodiments. Implementation principles and beneficial effects thereof are similar to the method embodiments. Details are not described herein again.

Figure 28:
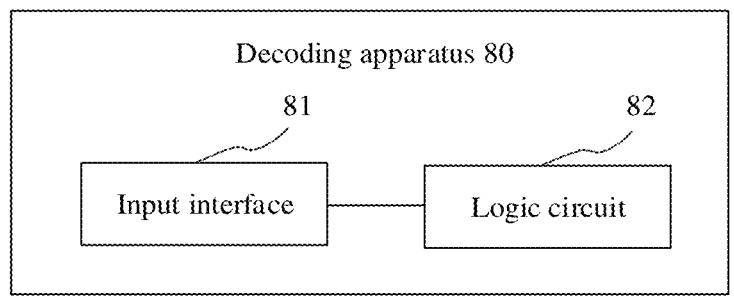
FIG. 28 is a schematic diagram of a structure of yet another decoding apparatus in accordance with some embodiments.

FIG. 28 is a schematic diagram of a structure of yet another decoding apparatus in accordance with some embodiments. Refer to FIG. 28. The decoding apparatus 80 includes an input interface 81 and a logic circuit 82.

The input interface 81 is configured to receive polar encoded bit information.

The logic circuit 82 is configured to polar decode the bit information based on a second generator matrix, to obtain polar decoded bits. The second generator matrix is generated based on a first generator matrix, the first generator matrix includes at least two sub-blocks distributed based on a preset position relationship, the sub-block includes a plurality of first generator matrix cores, the second generator matrix includes T sub-blocks, and a position relationship between two adjacent sub-blocks of the T sub-blocks is determined based on the preset position relationship, where T is a positive integer.

Optionally, the input interface 81 is configured to have functions of the receiving module 21 in the embodiment in FIG. 22. The logic circuit 82 is configured to have functions of the decoding module 22 in the embodiment in FIG. 22.

Optionally, the input interface 81 is configured to have functions of the receiver in the embodiment in FIG. 26. The logic circuit 82 is configured to have functions of the processor 61 in the embodiment in FIG. 26. The logic circuit 82 further performs other steps in the decoding methods.

Optionally, the decoding apparatus 80 further includes an output interface. For example, the output interface outputs a decoding result.

The decoding apparatus 80 provided implements the technical solutions shown in the foregoing method embodiments. Implementation principles and beneficial effects thereof are similar to the method embodiments. Details are not described herein again.

Figure 29:
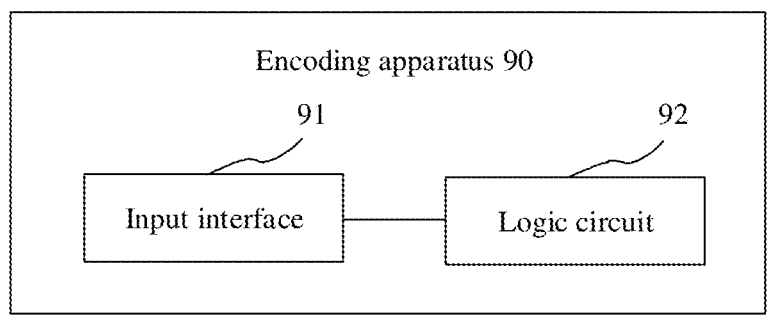
FIG. 29 is a schematic diagram of a structure of still yet another encoding apparatus in accordance with some embodiments.

FIG. 29 is a schematic diagram of a structure of still yet another encoding apparatus in accordance with some embodiments. Refer to FIG. 29. The encoding apparatus 90 includes an input interface 91 and a logic circuit 92.

The input interface 91 is configured to obtain K to-be-encoded bits, where K is a positive integer.

The logic circuit 92 is configured to: determine a first generator matrix, where the first generator matrix includes a first matrix block and a second matrix block, the first matrix block is located at the top-left corner of the first generator matrix, the second matrix block is located at the bottom-right corner of the first generator matrix, the first matrix block is the same as the second matrix block, and a distance between a first element in the first matrix block and a second element in the second matrix block is u in a diagonal direction of the first generator matrix, where u is an integer greater than or equal to 1; determine a second generator matrix based on an encoding length and the first generator matrix, where the second generator matrix includes T first generator matrices, the T first generator matrices are distributed along a diagonal of the second generator matrix, and a first matrix block of an $(a+1)^{th}$ first generator matrix in the T first generator matrices overlaps a second matrix block of an $a^{th}$ first generator matrix, where a is an integer greater than or equal to 1, and T is an integer greater than or equal to 2; and polar encode the K to-be-encoded bits based on the second generator matrix, to obtain encoded bits.

Optionally, the input interface 91 is configured to have functions of the obtaining module 31 in the embodiment in FIG. 23. The logic circuit 92 is configured to have functions of the determining module 32, the generation module 33, and the encoding module 34 in the embodiment in FIG. 23.

Optionally, the logic circuit 92 is configured to have functions of the processor 61 in the embodiment in FIG. 25. The logic circuit 92 further performs other steps in the encoding methods.

Optionally, the encoding apparatus 90 further includes an output interface. For example, the output interface outputs encoded bits.

The encoding apparatus 90 provided implements the technical solutions shown in the foregoing method embodiments. Implementation principles and beneficial effects thereof are similar to the method embodiments. Details are not described herein again.

Figure 30:
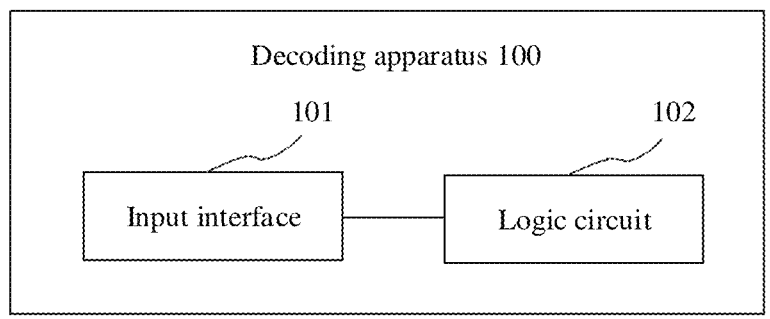
FIG. 30 is a schematic diagram of a structure of still yet another decoding apparatus in accordance with some embodiments.

FIG. 30 is a schematic diagram of a structure of still yet another decoding apparatus in accordance with some embodiments. Refer to FIG. 30. The decoding apparatus 100 includes an input interface 101 and a logic circuit 102.

The input interface 101 is configured to receive polar encoded bit information.

The logic circuit 102 is configured to polar decode the bit information based on a second generator matrix, to obtain polar decoded bits. The second generator matrix is generated based on a first generator matrix, the first generator matrix includes a first matrix block and a second matrix block, the first matrix block is located at the top-left corner of the first generator matrix, the second matrix block is located at the bottom-right corner of the first generator matrix, the first matrix block is the same as the second matrix block, and a distance between a first element in the first matrix block and a second element in the second matrix block is u in a diagonal direction of the first generator matrix, where u is an integer greater than or equal to 1. The second generator matrix includes T first generator matrices, the T first generator matrices are distributed along a diagonal of the second generator matrix, and a first matrix block of an $(a+1)^{th}$ first generator matrix in the T first generator matrices overlaps a second matrix block of an $a^{th}$ first generator matrix, where a is an integer greater than or equal to 1, and T is an integer greater than or equal to 2.

Optionally, the input interface 101 is configured to have functions of the receiving module 41 in the embodiment in FIG. 24. The logic circuit 102 is configured to have functions of the decoding module 42 in the embodiment in FIG. 24.

Optionally, the input interface 101 is configured to have functions of the receiver in the embodiment in FIG. 26. The logic circuit 102 is configured to have functions of the processor 61 in the embodiment in FIG. 26. The logic circuit 102 further performs other steps in the decoding methods.

Optionally, the decoding apparatus 100 further includes an output interface. For example, the output interface outputs a decoding result.

The decoding apparatus 100 provided implements the technical solutions shown in the foregoing method embodiments. Implementation principles and beneficial effects thereof are similar to the method embodiments. Details are not described herein again.

An embodiment of this application further provides a storage medium. The storage medium includes a computer program, and the computer program is used to perform the foregoing encoding methods.

An embodiment of this application further provides a storage medium. The storage medium includes a computer program, and the computer program is used to perform the foregoing decoding method.

An embodiment of this application further provides a chip or an integrated circuit, including a memory and a processor.

The memory is configured to store program instructions, and is further configured to store intermediate data.

The processor is configured to invoke the program instructions stored in the memory, to perform the foregoing encoding methods.

Optionally, the memory is independent, or is integrated with the processor. In some implementations, the memory alternatively is located outside the chip or the integrated circuit.

An embodiment of this application further provides a chip or an integrated circuit, including a memory and a processor.

The memory is configured to store program instructions, and is further configured to store intermediate data.

The processor is configured to invoke the program instruction stored in the memory, to perform the foregoing decoding methods.

Optionally, the memory is independent, or is integrated with the processor. In some implementations, the memory alternatively is located outside the chip or the integrated circuit.

An embodiment of this application further provides a program product. The program product includes a computer program, the computer program is stored in a storage medium, and the computer program is used to perform the foregoing encoding methods.

An embodiment of this application further provides a program product. The program product includes a computer program, the computer program is stored in a storage medium, and the computer program is used to perform the foregoing decoding methods.

Methods or algorithm steps described with reference to the content disclosed in some embodiments, is implemented by hardware, or is implemented by a processor by executing software instructions. The software instructions includes a corresponding software module. The software module is stored in a random access memory (Random Access Memory, RAM), a flash memory, a read-only memory (Read Only Memory, ROM), an erasable programmable read-only memory (Erasable Programmable ROM, EPROM), an electrically erasable programmable read-only memory (Electrically EPROM, EEPROM), a register, a hard disk, a removable hard disk, a compact disc read-only memory (CD-ROM), or a storage medium of any other form well-known in the art. For example, a storage medium is coupled to a processor, so that the processor reads information from the storage medium and writes information into the storage medium. Certainly, the storage medium is a component of the processor. The processor and the storage medium is located in an ASIC. In addition, the ASIC is located in a base station or a terminal. Certainly, the processor and the storage medium exists in a receive device as discrete components.

In some embodiments, the processor is a central processing unit (English: Central Processing Unit, CPU for short), or is another general purpose processor, a digital signal processor (English: Digital Signal Processor, DSP for short), an application-specific integrated circuit (English: Application Specific Integrated Circuit, ASIC for short), or the like. The general-purpose processor is a microprocessor, or the processor is any conventional processor or the like. Steps of the methods disclosed with reference to some embodiments are directly executed and accomplished by using a hardware processor, or is executed and accomplished by using a combination of hardware and software modules in a processor.

The memory includes a high-speed RAM memory; includes a non-volatile memory NVM, for example, at least one magnetic disk memory; or is a USB flash drive, a removable hard disk, a read-only memory, a magnetic disk, an optical disc, or the like.

The bus is an industry standard architecture (Industry Standard Architecture, ISA) bus, a peripheral component interconnect (Peripheral Component, PCI) bus, an extended industry standard architecture (Extended Industry Standard Architecture, EISA) bus, or the like. The bus is classified into an address bus, a data bus, a control bus, or the like. For ease of representation, the bus in the accompanying drawings of this application is not limited to one bus or one type of bus.

The storage medium is implemented by any type of volatile or non-volatile storage device or a combination thereof, for example, a static random access memory (SRAM), an electrically erasable programmable read-only memory (EEPROM), or an erasable programmable read-only memory (EPROM), a programmable read-only memory (PROM), a read-only memory (ROM), a magnetic memory, a flash memory, a disk, or an optical disk. The storage medium is any available medium accessible by a general-purpose or dedicated computer.

In this application, "at least one" means one or more, and "a plurality of" means two or more. The term "and/or" describes an association relationship for describing associated objects and represents that three relationships exists. For example, A and/or B represents the following cases: A exists, both A and B exist, and B exists, where A and B is singular or plural. In addition, the character "/" in the embodiments generally indicates an "or" relationship between the associated objects. At least one of the following items (pieces) or a similar expression thereof refers to any combination of these items, including any combination of singular items (pieces) or plural items (pieces). For example, at least one item (piece) of a, b, or c indicates: a, b, c, a-b, a-c, b-c, or a-b-c, where a, b, and c is singular or plural.

A person skilled in the art is aware that, in the foregoing one or more examples, the functions described in some embodiments, is implemented by using hardware, software, firmware, or any combination thereof. In response to the functions being implemented by using software, the functions are stored in a computer-readable medium or transmitted as one or more instructions or code on a computer-readable medium. The computer-readable medium includes a computer storage medium and a communication medium. The communication medium includes any medium that facilitates transmission of a computer program from one place to another. The storage medium is any available medium accessible by a general-purpose or dedicated computer.

In the several embodiments, the disclosed devices and methods are implemented in other manners. For example, the described device embodiments are examples. For example, division into the modules is logical function division, or is other division in implementation. For example, a plurality of modules are combined or integrated into another system, or some features are ignored or not performed. In addition, the displayed or discussed mutual couplings or direct couplings or communication connections are implemented through some interfaces. The indirect couplings or communication connections between the apparatuses or modules are implemented in electrical, mechanical, or other forms.

The modules described as separate parts are or are unable to be physically separate, and parts displayed as modules are or are unable to be physical units, and is located in one position, or is distributed on a plurality of network units. A part or all of the modules are selected according to a condition to achieve the objectives of the solutions of embodiments.

In addition, functional modules in some embodiments, are integrated into one processing unit, or each of the modules exists alone physically, or two or more modules are integrated into one module. The unit integrated by the modules are implemented in a form of hardware, or is implemented in a form of hardware plus a software function unit.

What is claimed is:

1. An encoding method, comprising:
   obtaining K to-be-encoded bits, wherein K is a positive integer;
   determining a first generator matrix, wherein:
      the first generator matrix includes at least two sub-blocks distributed diagonally with a preset overlapping position relationship between every two sub-blocks of a predetermined distance; and
      a sub-block includes a plurality of first generator matrix cores, wherein the plurality of the first generator matrix cores are distributed in the sub-block in a lower triangular form, and the plurality of the first generator matrix cores in the sub-block are in a lower triangular form;
   generating a second generator matrix based on the first generator matrix, wherein:
      the second generator matrix includes T sub-blocks, wherein each of the T sub-blocks include a plurality of the first generator matrix cores, and the plurality of the first generator matrix cores in the sub-block of the T sub-blocks are distributed in a lower triangular form;
      an overlapping position relationship between two adjacent sub-blocks of the T sub-blocks is same as the preset overlapping position relationship between every two sub-blocks of the first generator matrix; and
      T is a positive integer; and
   polar encoding the K to-be-encoded bits based on the second generator matrix, to obtain encoded bits;
   wherein a sub-matrix included in the sub-block is the first generator matrix core or a zero matrix;
   wherein the position relationship between the two adjacent sub-blocks of the T sub-blocks is the same as the preset position relationship, and a size of the second generator matrix is selected to be at least equal to a predetermined encoding length; and
   wherein T is a minimum integer that enables a first condition to be satisfied, and the first condition is that a size of the second generator matrix is greater than or equal to the encoding length.

2. The method according to claim 1, wherein an overlapping portion exists in the at least two sub-blocks.

3. The method according to claim 1, wherein:
   a first diagonal of the sub-block includes the plurality of first generator matrix cores.

4. The method according to claim 1, wherein:
   distribution of the plurality of first generator matrix cores in the sub-block is the same as distribution of first elements in a second generator matrix core; and
   a quantity of elements included in the second generator matrix core is the same as a quantity of sub-matrices comprised in the sub-block.

5. The method according to claim 4, wherein:
   the quantity of sub-matrices included in the sub-block is 2*2, and the sub-matrix included in the sub-block is the first generator matrix core or the zero matrix.

6. The method according to claim 5, wherein:
   the first generator matrix includes a first sub-block and a second sub-block, and a first sub-matrix in the first sub-block overlaps a second sub-matrix in the second sub-block; and
   coordinates of the first sub-matrix in the first sub-block are (2, 2), and coordinates of the second sub-matrix in the second sub-block are (1, 1).

7. The method according to claim 4, wherein:
   the quantity of sub-matrices included in the sub-block is 4*4, and the sub-matrix included in the sub-block is the first generator matrix core or the zero matrix.

8. The method according to claim 7, wherein:
   the first generator matrix includes a first sub-block and a second sub-block, and four first sub-matrices in the first sub-block overlap four second sub-matrices in the second sub-block, wherein:
      coordinates of the four first sub-matrices in the first sub-block are (3, 3), (3, 4), (4, 3), and (4, 4); and
      coordinates of the four second sub-matrices in the second sub-block are (1, 1), (1, 2), (2, 1), and (2, 2).

9. The method according to claim 1, wherein the polar encoding the K to-be-encoded bits based on the second generator matrix, to obtain encoded bits includes:
   polar encoding the K to-be-encoded bits to produce N' first log-likelihood ratio (LLR) sequences, and N' is a positive integer.

10. A decoding method, comprising:
    receiving polar encoded bit information; and
    polar decoding the polar encoded bit information based on a second generator matrix, to obtain polar decoded bits, wherein:
       the second generator matrix is generated based on a first generator matrix;

the first generator matrix includes at least two sub-blocks distributed diagonally with a preset overlapping position relationship between every two sub-blocks of a predetermined distance;

a sub-block includes a plurality of first generator matrix cores, wherein the plurality of the first generator matrix cores are distributed in the sub-block in a lower triangular form, and the plurality of the first generator matrix cores in the sub-block are in a lower triangular form;

the second generator matrix includes T sub-blocks, wherein each of the T sub-blocks include a plurality of the first generator matrix cores, and the plurality of the first generator matrix cores in the sub-block of the T sub-blocks are distributed in a lower triangular form;

an overlapping position relationship between two adjacent sub-blocks of the T sub-blocks is same as the preset overlapping position relationship between every two sub-blocks of the first generator matrix; and T is a positive integer;

wherein a sub-matrix included in the sub-block is the first generator matrix core or a zero matrix;

wherein the position relationship between the two adjacent sub-blocks of the T sub-blocks is the same as the preset position relationship, and a size of the second generator matrix is selected to be at least equal to a predetermined encoding length; and wherein T is a minimum integer that enables a first condition to be satisfied, and the first condition is that a size of the second generator matrix is greater than or equal to the encoding length.

11. The method according to claim 10, wherein:
the polar encoded bit information includes N' first log-likelihood ratio (LLR) sequences, and N' is a positive integer.

12. The method according to claim 11, wherein:
the N' first LLRs include T first LLR sequences, and the first LLR sequence includes at least two first LLRs; and
polar decoding comprises:
  determining T second LLR sequences corresponding to the T first LLR sequences, wherein one of the first LLR sequences corresponds to one or more groups of unencoded bits, and one of the second LLR sequences corresponds to one group of unencoded bits; and
  performing polar decoding based on the T second LLR sequences.

13. An encoding apparatus, comprising
at least one processor;
one or more memories coupled to the at least one processor and storing programming instructions for execution by the at least one processor, to:
  obtain K to-be-encoded bits, wherein K is a positive integer;
  determine a first generator matrix, wherein the first generator matrix includes at least two sub-blocks distributed diagonally with a preset overlapping position relationship between every two sub-blocks of a predetermined distance, and a sub-block includes a plurality of first generator matrix cores, wherein the plurality of the first generator matrix cores are distributed in a lower triangular form, and the plurality of the first generator matrix cores in the sub-block are in a lower triangular form;
  generate a second generator matrix based on the first generator matrix, wherein the second generator matrix includes T sub-blocks, and wherein each of the T sub-blocks include a plurality of the first generator matrix cores, and the plurality of the first generator matrix cores in the sub-block of the T sub-blocks are distributed in a lower triangular form, and an overlapping position relationship between two adjacent sub-blocks of the T sub-blocks is same as on the preset overlapping position relationship between every two sub-blocks of the first generator matrix, and T is a positive integer; and
  polar encode the K to-be-encoded bits based on the second generator matrix, to obtain encoded bits;
  wherein a sub-matrix included in the sub-block is a first generator matrix core or a zero matrix;
  wherein the position relationship between the two adjacent sub-blocks of the T sub-blocks is the same as the preset position relationship, and a size of the second generator matrix is selected to be at least equal to a predetermined encoding length; and
wherein T is a minimum integer that enables a first condition to be satisfied, and the first condition is that a size of the second generator matrix is greater than or equal to the encoding length.

14. The encoding apparatus according to claim 13, wherein the encoded bits includes N' first log-likelihood ratio (LLR) sequences, and N' is a positive integer.

15. The encoding apparatus according to claim 13, wherein an overlapping portion exists in the at least two sub-blocks.

16. The encoding apparatus according to claim 13, wherein:
a first diagonal of the sub-block includes the plurality of first generator matrix cores.

17. The encoding apparatus according to claim 13, wherein:
distribution of the plurality of first generator matrix cores in the sub-block is the same as distribution of first elements in a second generator matrix core; and
a quantity of elements included in the second generator matrix core is the same as a quantity of sub-matrices included in the sub-block.

* * * * *

UNITED STATES PATENT AND TRADEMARK OFFICE
CERTIFICATE OF CORRECTION

PATENT NO. : 12,136,932 B2  
APPLICATION NO. : 17/969736  
DATED : November 5, 2024  
INVENTOR(S) : Huazi Zhang et al.

Page 1 of 1

It is certified that error appears in the above-identified patent and that said Letters Patent is hereby corrected as shown below:

In the Specification

Column 28, Lines 19-27, which should be replaced with the following:

Then, $\bar{m}_i$ is calculated based on the foregoing calculated parameters, where $\bar{m}_1 = \acute{m}_3 + m''_1$, $\bar{m}_2 = \acute{m}_4 + m''_2$, $\bar{m}_3 = \acute{m}_5 + m''_3$, $\bar{m}_4 = \acute{m}_6 + m''_4$, $\bar{m}_5 = \acute{m}_7 + m''_5$, $\bar{m}_6 = \acute{m}_8 + m''_6$, $\bar{m}_7 = m_7$, and $\bar{m}_8 = m_8$.

Then, final reliability $m_i$ of the sub-channels is calculated based on the foregoing calculated parameters, where $m_1 = \bar{m}_2 + \bar{m}_1$, $m_2 = f(\bar{m}_2, \bar{m}_1)$, $m_3 = \bar{m}_4 + \bar{m}_3$, $m_4 = f(\bar{m}_4, \bar{m}_3)$, $m_5 = \bar{m}_6 + \bar{m}_5$, $m_6 = f(\bar{m}_6, \bar{m}_5)$, $m_7 = \bar{m}_8 + \bar{m}_7$, and $m_8 = m_8$.

Signed and Sealed this  
Twenty-first Day of January, 2025

Coke Morgan Stewart  
*Acting Director of the United States Patent and Trademark Office*